(12) United States Patent
Aldana et al.

(10) Patent No.: US 12,273,126 B2
(45) Date of Patent: Apr. 8, 2025

(54) METHODS AND SYSTEMS OF PERFORMING LOW-DENSITY PARITY-CHECK (LDPC) CODING

(71) Applicant: Meta Platforms Technologies, LLC, Menlo Park, CA (US)

(72) Inventors: Carlos Horacio Aldana, Mountain View, CA (US); Qiyue Zou, Elk Grove, CA (US)

(73) Assignee: Meta Platforms Technologies, LLC

( * ) Notice: Subject to any disclaimer, the term of this patent is extended or adjusted under 35 U.S.C. 154(b) by 0 days.

(21) Appl. No.: 18/212,569

(22) Filed: Jun. 21, 2023

(65) Prior Publication Data

US 2023/0421179 A1 Dec. 28, 2023

Related U.S. Application Data

(60) Provisional application No. 63/355,901, filed on Jun. 27, 2022.

(51) Int. Cl.
*H03M 13/25* (2006.01)
*H03M 13/00* (2006.01)

(52) U.S. Cl.
CPC ..... *H03M 13/255* (2013.01); *H03M 13/6527* (2013.01)

(58) Field of Classification Search
CPC ................ H03M 13/255; H03M 13/6527
See application file for complete search history.

(56) References Cited

U.S. PATENT DOCUMENTS

| 2024/0146355 A1* | 5/2024 | Pakrooh | H03M 13/255 |
| 2024/0232308 A1* | 7/2024 | Beaver | G10L 17/04 |

FOREIGN PATENT DOCUMENTS

EP 2963829 A1 * 1/2016 ............ H03M 13/25

* cited by examiner

*Primary Examiner* — Mark D Featherstone
*Assistant Examiner* — Jeffrey Andrew Yang
(74) *Attorney, Agent, or Firm* — FOLEY & LARDNER LLP

(57) ABSTRACT

Systems and methods for performing low-density parity-check (LDPC) coding may include a wireless communication device that determines a count of a plurality of information bits. The wireless communication device may select a codeword length according to the count. A LDPC encoder of the wireless communication device may generate a codeword for the plurality of information bits, the codeword having the codeword length. The wireless communication device may transmit the codeword to an LDPC decoder of another wireless communication device.

18 Claims, 54 Drawing Sheets

| Octets: 2 | 1 | 4/10 | variable | 2 | variable | variable | variable | 2/4 |
|---|---|---|---|---|---|---|---|---|
| Frame Control | Sequence number | Addressing fields | Auxiliary Security Header | Superframe Specification | GTS info | Pending address | Beacon payload | FCS |
| MHR | | | | MAC Payload | | | | MFR |

FIG. 5

| Codeword Block Length | Rate | Info. Bits |
|---|---|---|
| 1944 | 1/2 | 972 |
| 1296 | 1/2 | 648 |
| 648 | 1/2 | 324 |

LDPC Encoder

FIG. 12

| Slot Index | Mnemonic | STS Packet/Format | Sender |
|---|---|---|---|
| 0 | Pre-POLL | SP0 : Data Packet | Initiator |
| 1 | POLL | SP3 : RFRAME | Initiator |
| 1+1 | Response_0 | SP3 : RFRAME | Responder |
| 1+2 | Response_1 | SP3 : RFRAME | Responder |
| ... | ... | SP3 : RFRAME | Responder |
| $1+N^k_{Responder}-1$ | Response_$N^k_{Responder}-1$ | SP3 : RFRAME | Responder |
| $1+N^k_{Responder}+1$ | Final | SP3 : RFRAME | Initiator |
| $1+N^k_{Responder}+2=N^k_{Packets}$ | Final_Data | SP0 : Data Packet | Initiator |
| $1+N^k_{Responder}+3$ | Slot not used | N/A | N/A |
| . | Slot not used | N/A | N/A |
| $N^k_{Slot\_per\_Round}-1$ | Slot not used | N/A | N/A |

FIG. 16

| 16 bits | 8 bits | 32 or 80 bits | 8 bits | 8 bits | 4 bits | 4 bits | 8 bits | 16 or 32 bits |
|---|---|---|---|---|---|---|---|---|
| Frame Control | Sequence Number | Addressing fields | Min Block Duration (T_block_min_2ms) | Block Duration (T_block_min_Multiplier) | Chap per slot | Slot per Round | Number of Idle Rounds | FCS |

FIG. 19

| | Example 1 |
|---|---|
| Tblock_min_2m | 24 |
| Chap per slot | 3 |
| Slots per round | 8 |
| Tblock_min_Multiplier | 2 |
| Number of idle rounds | Any number between 0 and 12 |

FIG. 20

| 16 bits | 8 bits | 32 or 80 bits | 8 bits | 4 bits | 4 bits | 8 bits | 16 or 32 bits |
|---|---|---|---|---|---|---|---|
| Frame Control | Sequence Number | Addressing fields | Block Duration (T_block_min_Multiplier) | Chap per slot | Slot per Round | Number of Idle Rounds | FCS |

FIG. 21

|  | Example 2 |
|---|---|
| Chap per slot | 3 |
| Slots per round | 8 |
| Tblock_min_Multiplier | 2 |
| Number of idle rounds | Any number between 0 and 24 |

FIG. 22

BPSK 217.9/249.6 Mb/s

- Data rate 217.9/249.6 Mb/s: 2 pulses (2 chips), no guard chips

| | PSDU bit rate (Mb/s) |
|---|---|
| CL3 | 217.9 |
| CL7 | 249.6 |

2 pulses, $T_{dsym} = 2$ chips $= 4.01$ ns, $T_{chip}$

| $g_0^{(n)}$ | $g_1^{(n)}$ | First Pulse | Second Pulse |
|---|---|---|---|
| 0 | 0 | 0 | 0 |
| 1 | 0 | 1 | 0 |
| 0 | 1 | 1 | 1 |
| 1 | 1 | 0 | 1 |

CL3, 217.9 Mb/s

| $g_0^{(n)}$ | $g_1^{(n)}$ | First Pulse | Second Pulse |
|---|---|---|---|
| 0 | 0 | 0 | 0 |
| 1 | 0 | 1 | 0 |
| 0 | 1 | 0 | 1 |
| 1 | 1 | 1 | 1 |

CL7, 249.6 Mb/s

QPSK 435.8/499.2 Mb/s

- Data rate 435.8/499.2 Mb/s: 1 pulse (1 chip), no guard

| | PSDU bit rate (Mb/s) |
|---|---|
| CL3 | 435.8 |
| CL7 | 499.2 |

| $g_0^{(n)}$ | $g_1^{(n)}$ | Pulse I | Pulse Q |
|---|---|---|---|
| 0 | 0 | 0 | 0 |
| 1 | 0 | 1 | 0 |
| 0 | 1 | 0 | 1 |
| 1 | 1 | 1 | 1 |

CL3, 435.8 Mb/s

| $g_0^{(n)}$ | $g_1^{(n)}$ | Pulse I | Pulse Q |
|---|---|---|---|
| 0 | 0 | 0 | 0 |
| 1 | 0 | 1 | 0 |
| 0 | 1 | 0 | 1 |
| 1 | 1 | 1 | 1 |

CL7, 499.2 Mb/s

QPSK 217.9/249.6 Mb/s

- Data rate 217.9/249.6 Mb/s: 1 pulse (1 chip), 1 guard chip

| | PSDU bit rate (Mb/s) |
|---|---|
| CL3 | 217.9 |
| CL7 | 249.6 |

1 pulses $T_{dsym} = 2$ chips $= 4.01$ ns
$T_{chip}$

| $g_0^{(n)}$ | $g_1^{(n)}$ | Pulse I | Pulse Q |
|---|---|---|---|
| 0 | 0 | 0 | 0 |
| 1 | 0 | 1 | 0 |
| 0 | 1 | 0 | 1 |
| 1 | 1 | 1 | 1 |

CL3, 217.9 Mb/s

| $g_0^{(n)}$ | $g_1^{(n)}$ | Pulse I | Pulse Q |
|---|---|---|---|
| 0 | 0 | 0 | 0 |
| 1 | 0 | 1 | 0 |
| 0 | 1 | 0 | 1 |
| 1 | 1 | 1 | 1 |

CL7, 249.6 Mb/s

| K (bits) | J (Num codewords) | 1st codeword | 2nd codeword | 3rd codeword | 4th codeword | 5th codeword | 6th codeword |
|---|---|---|---|---|---|---|---|
| 973 | 2 | 486 | 487 | | | | |
| 1944 | 2 | 972 | 972 | | | | |
| 1945 | 3 | 648 | 648 | 649 | | | |
| 1946 | 3 | 648 | 649 | 649 | | | |
| 1947 | 3 | 649 | 649 | 649 | | | |
| 3888 | 4 | 972 | 972 | 972 | 972 | | |
| 3889 | 5 | 777 | 778 | 778 | 778 | 778 | |
| 3890 | 5 | 778 | 778 | 778 | 778 | 778 | |
| 5832 | 6 | 972 | 972 | 972 | 972 | 972 | 972 |
| 5833 | 7 | 833 | 833 | 833 | 833 | 834 | 834 |

FIG. 34

| K (bits) | J (Num codewords) | 1st codeword | 2nd codeword | 3rd codeword | 4th codeword | 5th codeword | 6th codeword |
|---|---|---|---|---|---|---|---|
| 973 | 2 | 487 | 486 | | | | |
| 1944 | 2 | 972 | 972 | | | | |
| 1945 | 3 | 649 | 648 | 648 | | | |
| 1946 | 3 | 649 | 649 | 648 | | | |
| 1947 | 3 | 649 | 649 | 649 | | | |
| 3888 | 4 | 972 | 972 | 972 | 972 | | |
| 3889 | 5 | 778 | 778 | 778 | 778 | 777 | |
| 3890 | 5 | 778 | 778 | 778 | 778 | 778 | |
| 5832 | 6 | 972 | 972 | 972 | 972 | 972 | 972 |
| 5833 | 7 | 834 | 834 | 833 | 833 | 833 | 833 |

FIG. 35

METHODS AND SYSTEMS OF PERFORMING LOW-DENSITY PARITY-CHECK (LDPC) CODING

CROSS-REFERENCE TO RELATED APPLICATIONS

This application claims the benefit of and priority to U.S. Provisional Application No. 63/355,901, filed Jun. 27, 2022, the contents of which are incorporated herein by reference in their entireties.

BACKGROUND

In systems and methods which implement or otherwise provide data transmission between devices which are located in a shared environment, such systems utilize Wi-Fi™ Bluetooth™, or other wireless links to transmit/receive data. However, various ones of these systems may not be suitable for certain applications, while other wireless protocols may not be configured to support suitable data communication capabilities.

SUMMARY

In various aspects, this disclosure is directed to systems, methods, and computer-storage media for low-density parity-check coding. A wireless communication device may determine a count of a plurality of information bits (e.g., to be transmitted to a destination). The wireless communication device may select a codeword length according to the count. A low-density parity-check (LDPC) encoder of the wireless communication device may generate a codeword for the plurality of information bits. The codeword may have the codeword length. The wireless communication device may transmit the codeword to an LDPC decoder of another wireless communication device.

In some embodiments, selecting the codeword length may include selecting a first codeword length responsive to the count being less than a first threshold. Selecting the codeword length may include selecting a second codeword length responsive to the count being greater than a second threshold. Selecting the codeword length may include selecting a third codeword length responsive to the count being between the first threshold and the second threshold. In some embodiments, the first codeword length is 648 bits, the second codeword length is 1944 bits, and the third codeword length is 1296 bits. In some embodiments, the first threshold is 21 bytes, and the second threshold is 44 bytes.

In some embodiments, the wireless communication device may determine a number of codewords to generate according to the count. In some embodiments, generating the codeword may include generating, by the LDPC encoder, a first codeword having a first portion of the plurality of information bits. Generating the codeword may include generating, by the LDPC encoder, a second codeword having a second portion of the plurality of information bits. In some embodiments, the first portion of the plurality of information bits has a greater number of information bits than the second portion of the plurality of information bits.

In some embodiments, the wireless communication device may set, for the codeword, a number of parity bits according to the codeword length. In some embodiments, the wireless communication device may select a number of codewords as a function of the count. The wireless communication device may assign the plurality of information bits to each codeword of the number of codewords. The plurality of information bits may be divided into substantially equal portions across the number of codewords. The wireless communication device may generate each of the codewords using the assigned portions of the plurality of information bits.

BRIEF DESCRIPTION OF THE DRAWINGS

The accompanying drawings are not intended to be drawn to scale. Like reference numbers and designations in the various drawings indicate like elements. For purposes of clarity, not every component can be labeled in every drawing.

FIG. 5 is a representation of a format of a beacon frame, according to an example implementation of the present disclosure.

FIG. 12 is a diagram of low-density parity-check (LDPC) codes which may be used in the system of FIG. 11, according to an example implementation of the present disclosure.

FIG. 16 is another diagram showing data communication incorporated into a ranging round, according to an example implementation of the present disclosure.

FIG. 19 is a diagram of a beacon frame/signal structure, according to an example implementation of the present disclosure.

FIG. 20 is a diagram of an example beacon frame/signal using the beacon signal structure of FIG. 19, according to an example implementation of the present disclosure.

FIG. 21 is another diagram of a beacon frame/signal structure, according to an example implementation of the present disclosure.

FIG. 22 is a diagram of an example beacon frame/signal using the beacon frame/signal structure of FIG. 21, according to an example implementation of the present disclosure.

FIG. 34 is a table showing an example allocation of information bits to codewords, according to an example implementation of the present disclosure.

FIG. 35 is a table showing another example allocation of information bits to codewords, according to an example implementation of the present disclosure.

DETAILED DESCRIPTION

Before turning to the figures, which illustrate certain embodiments in detail, it should be understood that the present disclosure is not limited to the details or methodology set forth in the description or illustrated in the figures. It should also be understood that the terminology used herein is for the purpose of description only and should not be regarded as limiting. The contents of U.S. Non-Provisional application Ser. No. 17/581,343, filed Jan. 21, 2022, are incorporated herein by reference in their entireties.

Disclosed herein are embodiments related to low-density parity-check (LDPC) encoding and decoding. LDPC encoding and decoding is a data encoding method by which information bits are encoded into a codeword. In various embodiments, as the number of information bits increases, different codeword lengths may be used to encode such information bits. For example, if a fixed codeword length were used, it may result in a greater number of codewords generated (which could be more prone to error). On the other hand, where a fewer number of codewords were used having a greater codeword length, the codewords may have a greater coding rate (e.g., closer to ½ coding rate) thereby resulting in a weaker codeword. According to the systems and methods described herein, a wireless communication device may apply various thresholds to the number of information bits to encode, for selecting codeword lengths and/or determining a number of codewords for an LDPC encoder to generate. Such implementations may strike a balance between coding rate (and corresponding codeword strength) and error reduction. Additionally, such implementations may provide for more data transmission by assigning information bits to various groups or portions, thereby permitting more data throughput while still ensuring that the balance between coding rate and error reduction is achieved. Additional improvements to LDPC encoding and decoding, as well as further details related thereto, are described in greater detail below.

Figure 1:
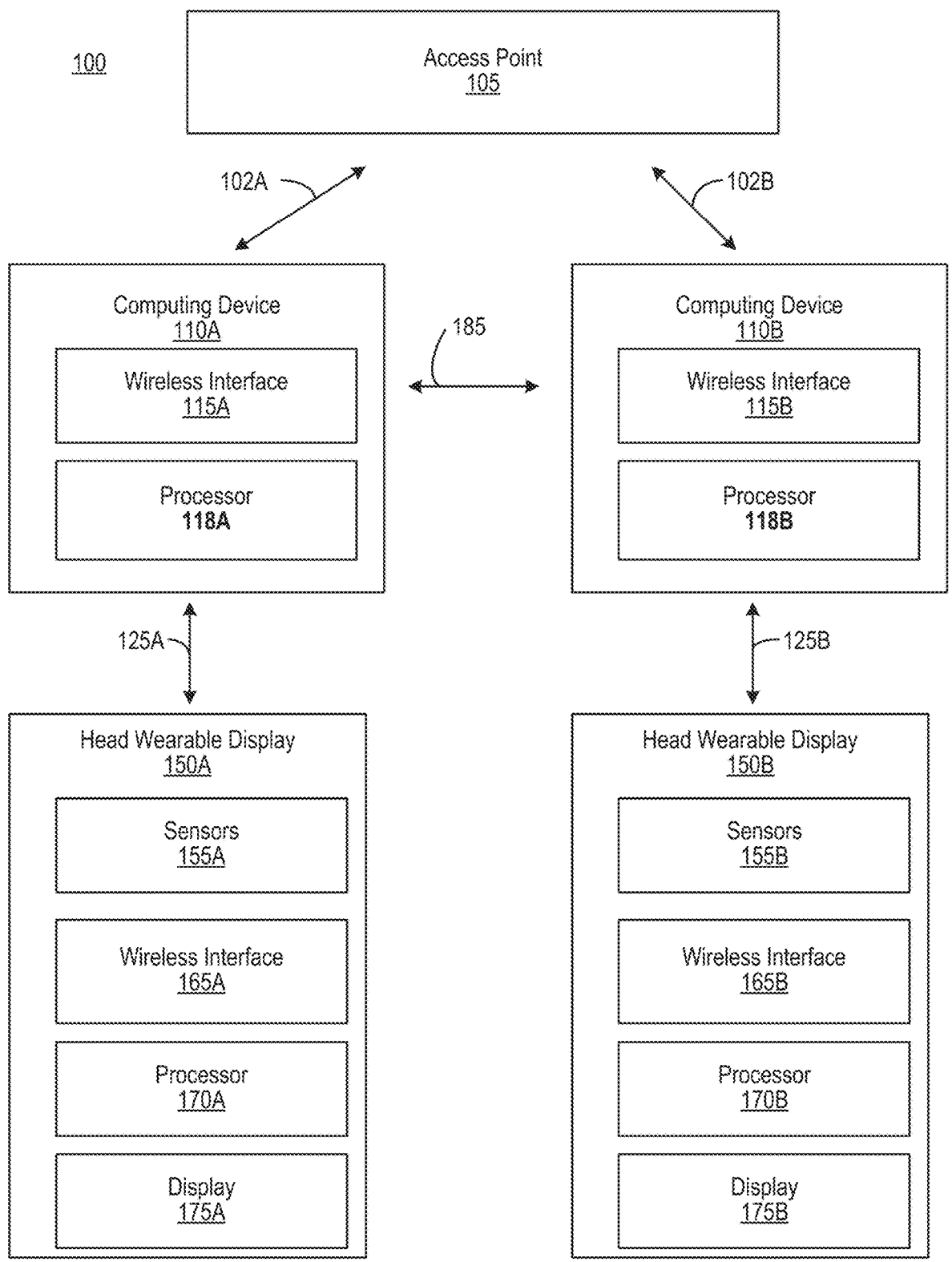
FIG. 1 is a diagram of a system environment including an artificial reality system, according to an example implementation of the present disclosure.
Figure 2:
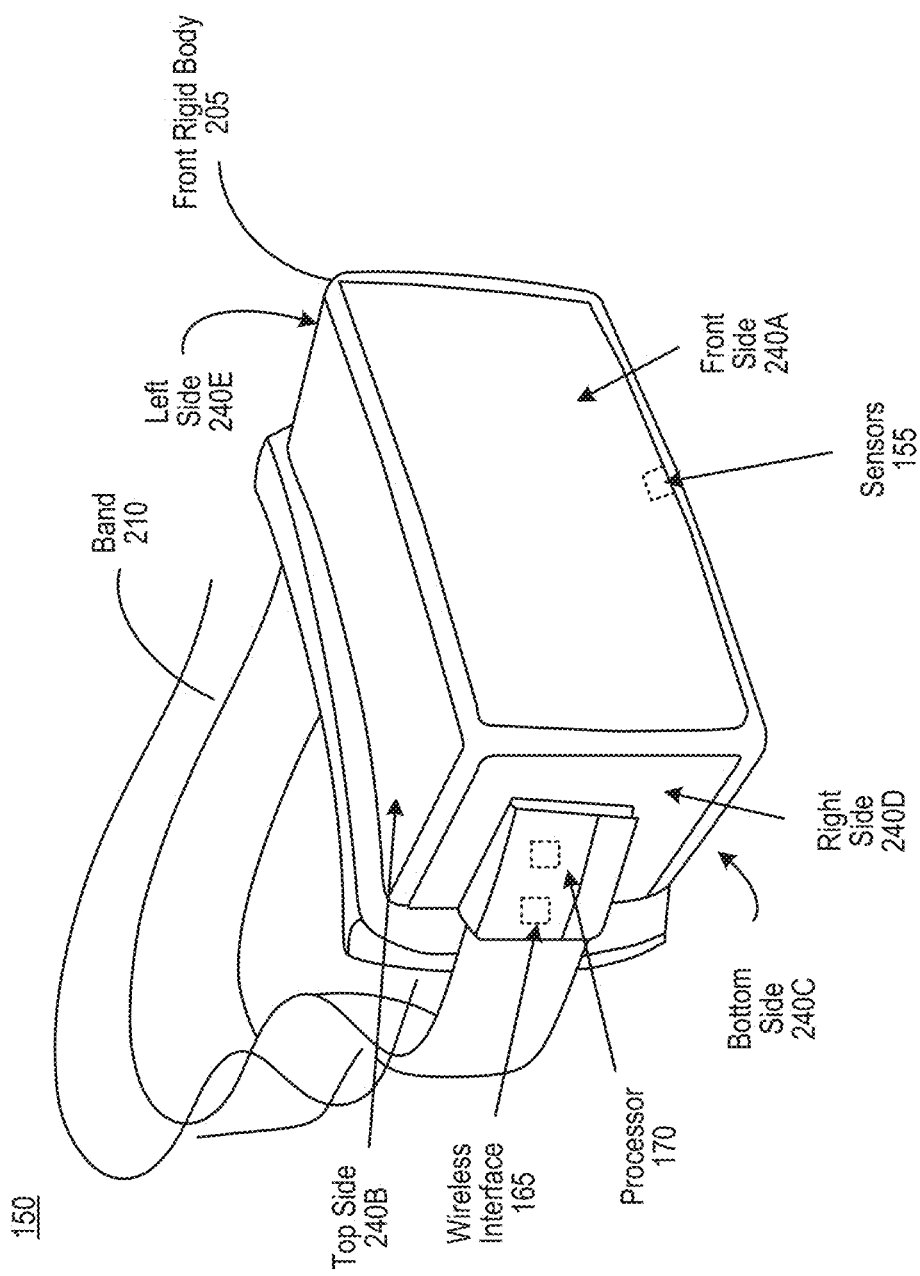
FIG. 2 is a diagram of a head wearable display, according to an example implementation of the present disclosure.

FIG. 1 is a block diagram of an example artificial reality system environment 100. In some embodiments, the artificial reality system environment 100 includes an access point (AP) 105, one or more HWDs 150 (e.g., HWD 150A, 150B), and one or more computing devices 110 (computing devices 110A, 110B; sometimes referred to as consoles) providing data for artificial reality to the one or more HWDs 150. The access point 105 may be a router or any network device allowing one or more computing devices 110 and/or one or more HWDs 150 to access a network (e.g., the Internet). The access point 105 may be replaced by any communication device (cell site). A computing device 110 may be a custom device or a mobile device that can retrieve content from the access point 105, and provide image data of artificial reality to a corresponding HWD 150. Each HWD 150 may present the image of the artificial reality to a user according to the image data. In some embodiments, the artificial reality system environment 100 includes more, fewer, or different components than shown in FIG. 1. In some embodiments, the computing devices 110A, 110B communicate with the access point 105 through wireless links 102A, 102B (e.g., interlinks), respectively. In some embodiments, the computing device 110A communicates with the HWD 150A through a wireless link 125A (e.g., intralink), and the computing device 110B communicates with the HWD 150B through a wireless link 125B (e.g., intralink). In some embodiments, functionality of one or more components of the artificial reality system environment 100 can be distributed among the components in a different manner than is described here. For example, some of the functionality of the computing device 110 may be performed by the HWD 150. For example, some of the functionality of the HWD 150 may be performed by the computing device 110.

In some embodiments, the HWD 150 is an electronic component that can be worn by a user and can present or provide an artificial reality experience to the user. The HWD 150 may be referred to as, include, or be part of a head mounted display (HMD), head mounted device (HMD), head wearable device (HWD), head worn display (HWD) or head worn device (HWD). The HWD 150 may render one or more images, video, audio, or some combination thereof to provide the artificial reality experience to the user. In some embodiments, audio is presented via an external device (e.g., speakers and/or headphones) that receives audio information from the HWD 150, the computing device 110, or both, and presents audio based on the audio information. In some embodiments, the HWD 150 includes sensors 155, a wireless interface 165, a processor 170, and a display 175. These components may operate together to detect a location of the HWD 150 and a gaze direction of the user wearing the HWD 150, and render an image of a view within the artificial reality corresponding to the detected location and/or orientation of the HWD 150. In other embodiments, the HWD 150 includes more, fewer, or different components than shown in FIG. 1.

In some embodiments, the sensors 155 include electronic components or a combination of electronic components and software components that detects a location and an orientation of the HWD 150. Examples of the sensors 155 can include: one or more imaging sensors, one or more accelerometers, one or more gyroscopes, one or more magnetometers, or another suitable type of sensor that detects motion and/or location. For example, one or more accelerometers can measure translational movement (e.g., forward/back, up/down, left/right) and one or more gyroscopes can measure rotational movement (e.g., pitch, yaw, roll). In some embodiments, the sensors 155 detect the translational movement and the rotational movement, and determine an orientation and location of the HWD 150. In one aspect, the sensors 155 can detect the translational movement and the rotational movement with respect to a previous orientation and location of the HWD 150, and determine a new orientation and/or location of the HWD 150 by accumulating or integrating the detected translational movement and/or the rotational movement. Assuming for an example that the HWD 150 is oriented in a direction 25 degrees from a reference direction, in response to detecting that the HWD 150 has rotated 20 degrees, the sensors 155 may determine that the HWD 150 now faces or is oriented in a direction 45 degrees from the reference direction. Assuming for another example that the HWD 150 was located two feet away from a reference point in a first direction, in response to detecting that the HWD 150 has moved three feet in a second direction, the sensors 155 may determine that the HWD 150 is now located at a vector multiplication of the two feet in the first direction and the three feet in the second direction.

In some embodiments, the wireless interface 165 includes an electronic component or a combination of an electronic component and a software component that communicates with the computing device 110. In some embodiments, the wireless interface 165 includes or is embodied as a transceiver for transmitting and receiving data through a wireless medium. The wireless interface 165 may communicate with a wireless interface 115 of a corresponding computing device 110 through a wireless link 125 (e.g., intralink). The wireless interface 165 may also communicate with the access point 105 through a wireless link (e.g., interlink). Examples of the wireless link 125 include a near field communication link, Wi-Fi direct, Bluetooth, or any wireless communication link. In some embodiments, the wireless link 125 may include one or more ultra-wideband communication links, as described in greater detail below. Through the wireless link 125, the wireless interface 165 may transmit to the computing device 110 data indicating the determined location and/or orientation of the HWD 150, the determined gaze direction of the user, and/or hand tracking measurement. Moreover, through the wireless link 125, the wireless interface 165 may receive from the computing device 110 image data indicating or corresponding to an image to be rendered.

In some embodiments, the processor 170 includes an electronic component or a combination of an electronic component and a software component that generates one or more images for display, for example, according to a change in view of the space of the artificial reality. In some embodiments, the processor 170 is implemented as one or more graphical processing units (GPUs), one or more central processing unit (CPUs), or a combination of them that can execute instructions to perform various functions described herein. The processor 170 may receive, through the wireless interface 165, image data describing an image of artificial reality to be rendered, and render the image through the display 175. In some embodiments, the image data from the computing device 110 may be encoded, and the processor 170 may decode the image data to render the image. In some embodiments, the processor 170 receives, from the computing device 110 through the wireless interface 165, object information indicating virtual objects in the artificial reality space and depth information indicating depth (or distances from the HWD 150) of the virtual objects. In one aspect, according to the image of the artificial reality, object information, depth information from the computing device 110, and/or updated sensor measurements from the sensors 155, the processor 170 may perform shading, reprojection, and/or blending to update the image of the artificial reality to correspond to the updated location and/or orientation of the HWD 150.

In some embodiments, the display 175 is an electronic component that displays an image. The display 175 may, for example, be a liquid crystal display or an organic light emitting diode display. The display 175 may be a transparent display that allows the user to see through. In some embodiments, when the HWD 150 is worn by a user, the display 175 is located proximate (e.g., less than 3 inches) to the user's eyes. In one aspect, the display 175 emits or projects light towards the user's eyes according to image generated by the processor 170. The HWD 150 may include a lens that allows the user to see the display 175 in a close proximity.

In some embodiments, the processor 170 performs compensation to compensate for any distortions or aberrations. In one aspect, the lens introduces optical aberrations such as a chromatic aberration, a pin-cushion distortion, barrel distortion, etc. The processor 170 may determine a compensation (e.g., predistortion) to apply to the image to be rendered to compensate for the distortions caused by the lens, and apply the determined compensation to the image from the processor 170. The processor 170 may provide the predistorted image to the display 175.

In some embodiments, the computing device 110 is an electronic component or a combination of an electronic component and a software component that provides content to be rendered to the HWD 150. The computing device 110 may be embodied as a mobile device (e.g., smart phone, tablet PC, laptop, etc.). The computing device 110 may operate as a soft access point. In one aspect, the computing device 110 includes a wireless interface 115 and a processor 118. These components may operate together to determine a view (e.g., a FOV of the user) of the artificial reality corresponding to the location of the HWD 150 and the gaze direction of the user of the HWD 150, and can generate image data indicating an image of the artificial reality corresponding to the determined view. The computing device 110 may also communicate with the access point 105, and may obtain AR/VR content from the access point 105, for example, through the wireless link 102 (e.g., interlink). The computing device 110 may receive sensor measurement indicating location and the gaze direction of the user of the HWD 150 and provide the image data to the HWD 150 for presentation of the artificial reality, for example, through the wireless link 125 (e.g., intralink). In other embodiments, the computing device 110 includes more, fewer, or different components than shown in FIG. 1.

In some embodiments, the wireless interface 115 is an electronic component or a combination of an electronic component and a software component that communicates with the HWD 150, the access point 105, other computing device 110, or any combination of them. In some embodiments, the wireless interface 115 includes or is embodied as a transceiver for transmitting and receiving data through a wireless medium. The wireless interface 115 may be a counterpart component to the wireless interface 165 to communicate with the HWD 150 through a wireless link 125 (e.g., intralink). The wireless interface 115 may also include a component to communicate with the access point 105 through a wireless link 102 (e.g., interlink). Examples of wireless link 102 include a cellular communication link, a near field communication link, Wi-Fi, Bluetooth, 60 GHz wireless link, ultra-wideband link, or any wireless communication link. The wireless interface 115 may also include a component to communicate with a different computing device 110 through a wireless link 185. Examples of the wireless link 185 include a near field communication link, Wi-Fi direct, Bluetooth, ultra-wideband link, or any wireless communication link. Through the wireless link 102 (e.g., interlink), the wireless interface 115 may obtain AR/VR content, or other content from the access point 105. Through the wireless link 125 (e.g., intralink), the wireless interface 115 may receive from the HWD 150 data indicating the determined location and/or orientation of the HWD 150, the determined gaze direction of the user, and/or the hand tracking measurement. Moreover, through the wireless link 125 (e.g., intralink), the wireless interface 115 may transmit to the HWD 150 image data describing an image to be rendered. Through the wireless link 185, the wireless interface 115 may receive or transmit information indicating the wireless link 125 (e.g., channel, timing) between the computing device 110 and the HWD 150. According to the information indicating the wireless link 125, computing devices 110 may coordinate or schedule operations to avoid interference or collisions.

The processor 118 can include or correspond to a component that generates content to be rendered according to the location and/or orientation of the HWD 150. In some embodiments, the processor 118 includes or is embodied as one or more central processing units, graphics processing units, image processors, or any processors for generating images of the artificial reality. In some embodiments, the processor 118 may incorporate the gaze direction of the user of the HWD 150 and a user interaction in the artificial reality to generate the content to be rendered. In one aspect, the processor 118 determines a view of the artificial reality according to the location and/or orientation of the HWD 150. For example, the processor 118 maps the location of the HWD 150 in a physical space to a location within an artificial reality space, and determines a view of the artificial reality space along a direction corresponding to the mapped orientation from the mapped location in the artificial reality space. The processor 118 may generate image data describing an image of the determined view of the artificial reality space, and transmit the image data to the HWD 150 through the wireless interface 115. The processor 118 may encode the image data describing the image, and can transmit the encoded data to the HWD 150. In some embodiments, the processor 118 generates and provides the image data to the HWD 150 periodically (e.g., every 11 ms or 16 ms).

In some embodiments, the processors 118, 170 may configure or cause the wireless interfaces 115, 165 to toggle, transition, cycle or switch between a sleep mode and a wake up mode. In the wake up mode, the processor 118 may enable the wireless interface 115 and the processor 170 may enable the wireless interface 165, such that the wireless interfaces 115, 165 may exchange data. In the sleep mode, the processor 118 may disable (e.g., implement low power operation in) the wireless interface 115 and the processor 170 may disable the wireless interface 165, such that the wireless interfaces 115, 165 may not consume power or may reduce power consumption. The processors 118, 170 may schedule the wireless interfaces 115, 165 to switch between the sleep mode and the wake up mode periodically every frame time (e.g., 11 ms or 16 ms). For example, the wireless interfaces 115, 165 may operate in the wake up mode for 2 ms of the frame time, and the wireless interfaces 115, 165 may operate in the sleep mode for the remainder (e.g., 9 ms) of the frame time. By disabling the wireless interfaces 115, 165 in the sleep mode, power consumption of the computing device 110 and the HWD 150 can be reduced.

In various embodiments, the devices in the environments described above may operate or otherwise use components which leverage communications in the ultra-wideband (UWB) spectrum. Disclosed herein are embodiments related to devices, systems, and methods operating in the ultra-wideband (UWB) spectrum. In various embodiments, UWB devices operate in the 3-GHz unlicensed spectrum using 500+ MHz channels which may require low power for transmission. Using simple modulation and spread spectrum, UWB devices may achieve reasonable resistance to Wi-Fi and Bluetooth interference (as well as resistance to interference with other UWB devices located in the environment) for very low data rates (e.g., 10 s to 100 s Kbps) and may have large processing gains. However, for higher data rates (e.g., several Mbps), the processing gains may not be sufficient to overcome co-channel interference from Wi-Fi or Bluetooth. According to the embodiments described herein, the systems and methods described herein may operate in frequency bands that do not overlap with Wi-Fi and Bluetooth, but may have good global availability based on regulatory requirements. Since regulatory requirements make the 7-8 GHz spectrum the most widely available globally (and Wi-Fi is not present in this spectrum), the 7-8 GHz spectrum may operate satisfactory both based on co-channel interference and processing gains.

Some implementations of UWB may focus on precision ranging and security. As UWB employs relatively simple modulation, it may be implemented at low cost and low power consumption. In AR/VR applications (or in other applications and use cases), link budget calculations for an AR/VR controller link indicate that the systems and methods described herein may be configured for effective data throughput ranging from ~2 to 31 Mbps (e.g., with 31 Mbps being the maximum possible rate in the latest 802.15.4z standard), which may depend on body loss assumptions.

The systems and methods described herein may be used or leveraged in various AR/VR use cases and applications, as well as in other use cases and applications (such as communications between mobile devices and vehicles, a remote control device and a video recording device, and so forth). Various applications, use cases, and further implementations of the systems and methods described herein are described in greater detail below.

Figure 3:
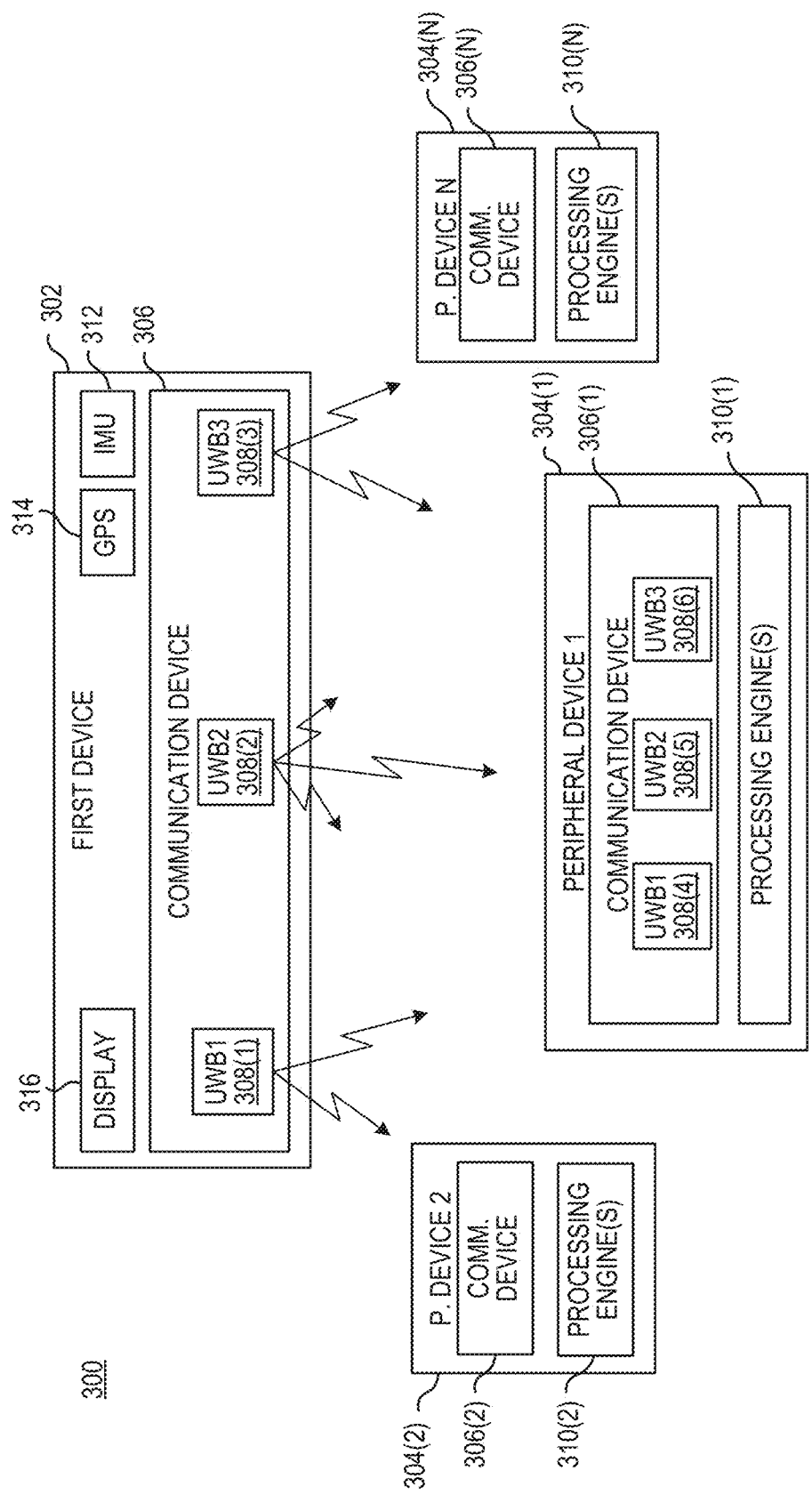
FIG. 3 is a block diagram of an artificial reality environment, according to an example implementation of the present disclosure.

Referring now to FIG. 3, depicted is a block diagram of an artificial reality environment 300. The artificial reality environment 300 is shown to include a first device 302 and one or more peripheral devices 304(1)-304(N) (also referred to as "peripheral device 304" or "device 304"). The first device 302 and peripheral device(s) 304 may each include a communication device 306 including a plurality of UWB devices 308. A set of UWB devices 308 may be spatially positioned/located (e.g., spaced out) relative to each other on different locations on/in the first device 302 or the peripheral device 304, so as to maximize UWB coverage and/or to enhance/enable specific functionalities. The UWB devices 308 may be or include antennas, sensors, or other devices and components designed or implemented to transmit and receive data or signals in the UWB spectrum (e.g., between 3.1 GHz and 10.6 GHz) and/or using UWB communication protocol. In some embodiments, one or more of the devices 302, 304 may include various processing engines 310. The processing engines 310 may be or include any device, component, machine, or other combination of hardware and software designed or implemented to control the devices 302, 304 based on UWB signals transmitted and/or received by the respective UWB devices 308.

As noted above, the environment 300 may include a first device 302. The first device 302 may be or include a wearable device, such as the HWD 150 described above, a smart watch, AR glasses, or the like. In some embodiments, the first device 302 may include a mobile device (e.g., a smart phone, tablet, console device, or other computing device), a remote control device, a smart key, etc. The first device 302 may be communicably coupled with various other devices 304 located in the environment 300. For example, the first device 302 may be communicably coupled to one or more of the peripheral devices 304 located in the environment 300. The peripheral devices 304 may be or include the computing device 110 described above, a device similar to the first device 302 (e.g., a HWD 150, a smart watch, mobile device, remote control device, a smart key, etc.), an automobile or other vehicle, a beacon transmitting device located in the environment 300, a smart home device (e.g., a smart television, a digital assistant device, a smart speaker, a video conferencing device, etc.), a smart tag configured for positioning on various devices, etc. In some embodiments, the first device 302 may be associated with a first entity or user and the peripheral devices 304 may be associated with a second entity or user (e.g., a separate member of a household, or a person/entity unrelated to the first entity).

In some embodiments, the first device 302 may be communicably coupled with the peripheral device(s) 304 following a pairing or handshaking process. For example, the first device 302 may be configured to exchange handshake packet(s) with the peripheral device(s) 304, to pair (e.g., establish a specific or dedicated connection or link between) the first device 302 and the peripheral device 304. The handshake packet(s) may be exchanged via the UWB devices 308, or via another wireless link 125 (such as one or more of the wireless links 125 described above). Following pairing, the first device 302 and peripheral device(s) 304 may be configured to transmit, receive, or otherwise exchange UWB data or UWB signals using the respective UWB devices 308 on the first device 302 and/or peripheral device 304. In some embodiments, the first device 302 may be configured to establish a communications link with a peripheral device 304 (e.g., without any device pairing). For example, the first device 302 may be configured to detect, monitor, and/or identify peripheral devices 304 located in the environment using UWB signals received from the peripheral devices 304 within a certain distance of the first device 302, by identifying peripheral devices 304 which are connected to a shared Wi-Fi network (e.g., the same Wi-Fi network to which the first device 302 is connected), etc. In these and other embodiments, the first device 302 may be configured to transmit, send, receive, or otherwise exchange UWB data or signals with the peripheral device 304.

The first device 302 and/or the peripheral device 304 may be configured to determine a range (e.g., a spatial distance, separation) between the devices 302, 304. The first device 302 may be configured to send, broadcast, or otherwise transmit a UWB signal (e.g., a challenge signal). The first device 302 may transmit the UWB signal using one of the UWB devices 308 of the communication device 306 on the first device 302. The UWB device 308 may transmit the UWB signal in the UWB spectrum. The UWB signal may have a high bandwidth (e.g., 500 MHz). As such, the UWB device 308 may be configured to transmit the UWB signal in the UWB spectrum (e.g., between 3.1 GHz and 10.6 GHz) and having a high bandwidth (e.g., 500 MHz). The UWB signal from the first device 302 may be detectable by other devices within a certain range of the first device 302 (e.g., devices having a line of sight (LOS) within 200 m of the first device 302). As such, the UWB signal may be more accurate for detecting range between devices than other types of signals or ranging technology.

The peripheral device 304 may be configured to receive or otherwise detect the UWB signal from the first device 302. The peripheral device 304 may be configured to receive the UWB signal from the first device 302 via one of the UWB devices 308 on the peripheral device 304. The peripheral device 304 may be configured to broadcast, send, or otherwise transmit a UWB response signal responsive to detecting the UWB signal from the first device 302. The peripheral device 304 may be configured to transmit the UWB response signal using one of the UWB devices 308 of the communication device 306 on the peripheral device 304. The UWB response signal may be similar to the UWB signal sent from the first device 302.

The first device 302 may be configured to detect, compute, calculate, or otherwise determine a time of flight (TOF) based on the UWB signal and the UWB response signal. The TOF may be a time or duration between a time in which a signal (e.g., the UWB signal) is transmitted by the first device 302 and a time in which the signal is received by the peripheral device 304. The first device 302 may be configured to determine or calculate the TOF between the first device 302 and the peripheral device 304 based on a difference between the first time and the second time (e.g., divided by two).

In some embodiments, the first device 302 may be configured to determine the range (or distance) between the first device 302 and the peripheral device 304 based on the TOF. For example, the first device 302 may be configured to compute the range or distance between the first device 302 and the peripheral device 304 by multiplying the TOF and the speed of light (e.g., TOF×c). In some embodiments, the peripheral device 304 (or another device in the environment 400) may be configured to compute the range or distance between the first device 302 and peripheral device 304. For example, the first device 302 may be configured to transmit, send, or otherwise provide the TOF to the peripheral device 304 (or other device), and the peripheral device 304 (or other device) may be configured to compute the range between the first device 302 and peripheral device 304 based on the TOF, as described above. Additional details regarding range determination is described in greater detail below.

In one aspect, the systems and methods described herein may incorporate data transmission within an ultra-wideband (UWB) ranging protocol. The systems and methods described herein may incorporate or integrate data transmission packets within/between ranging packets (e.g., frames, transmissions). The systems and methods described herein may provide data transmission packets within same and/or separate slots of a ranging protocol/process. In some embodiments, the systems and methods described herein may facilitate data communications between devices in an AR/VR environment. For example, the systems and methods described herein may facilitate data communications between a mobile device and a video conferencing device (e.g., for controlling the video conferencing device using the mobile device). As another example, the systems and methods described herein may facilitate data communications between a VR device and a console (e.g., for transmitting motion data from the VR device to the console, and mapping data from the console to the VR device). As yet another example, the systems and methods described herein may facilitate data communications between a mobile device or smart key and a vehicle (e.g., to automatically unlock the vehicle, remotely start the vehicle, etc.). Various implementations and embodiments are described in greater detail below.

Figure 4:
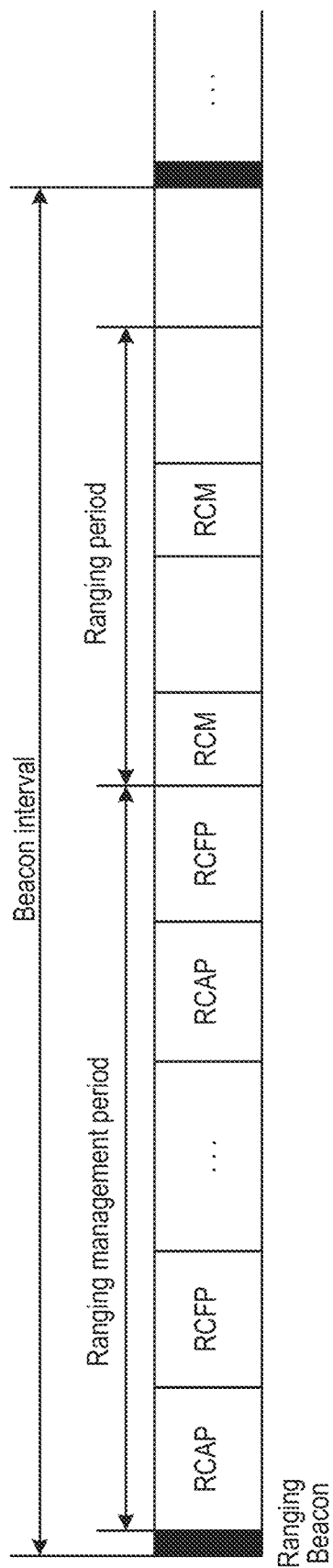
FIG. 4 is a diagram showing enabling/disabling beacon intervals based on a use case, according to an example implementation of the present disclosure.

Referring now to FIG. 4, depicted is a diagram showing approach(es) for enabling/disabling beacon intervals, according to an example implementation of the present disclosure. As shown in FIG. 4, the systems and methods described herein may (e.g., use specific types of beacons to) enable or disable one or more beacon intervals that can support data communication, based on a particular use case for instance. For example, a beacon interval may include a ranging management period, which can include slots for ranging contention access periods (RCAPs) and slots for ranging contention free periods (RCFPs). The beacon interval may include a ranging period including slots for ranging and communication (RCM). The beacon interval may be defined consistent with, or as set forth in IEEE 802.15.4z (clause 6.2.11). The ranging schedule time unit (RSTU) for the beacon interval may be equal to 416 chips (or approximately 833 ns for high rate pulse repetition frequency (HRP)). The ranging schedule time unit can be reduced even further to allow for fragments of packets to be transmitted.

Referring now to FIG. 5, depicted is a diagram/representation of a beacon frame format (e.g., a format of a beacon frame), according to an example implementation of the present disclosure. As shown in FIG. 5, a beacon frame format may serve to synchronize devices (e.g., devices 302, 304) without Bluetooth low energy (BLE) mechanism for instance. The beacon frame format may identify devices on a personal area network (PAN) and can describe structures of superframes (or blocks). The beacon frame format may include a MAC header (MHR), a MAC payload, and MAC footer (MFR). The MHR may include a frame control section, a sequence number section, an addressing fields section, and/or an auxiliary security header. The MAC payload may include a superframe specification, guaranteed timeslot (GTS) information, a pending address, and/or a beacon payload. In some embodiments, the superframe specification, GTS information, and/or pending address may be mandatory fields within the beacon frame format. The MFR may include a frame check sequence (FCS).

Figure 6:
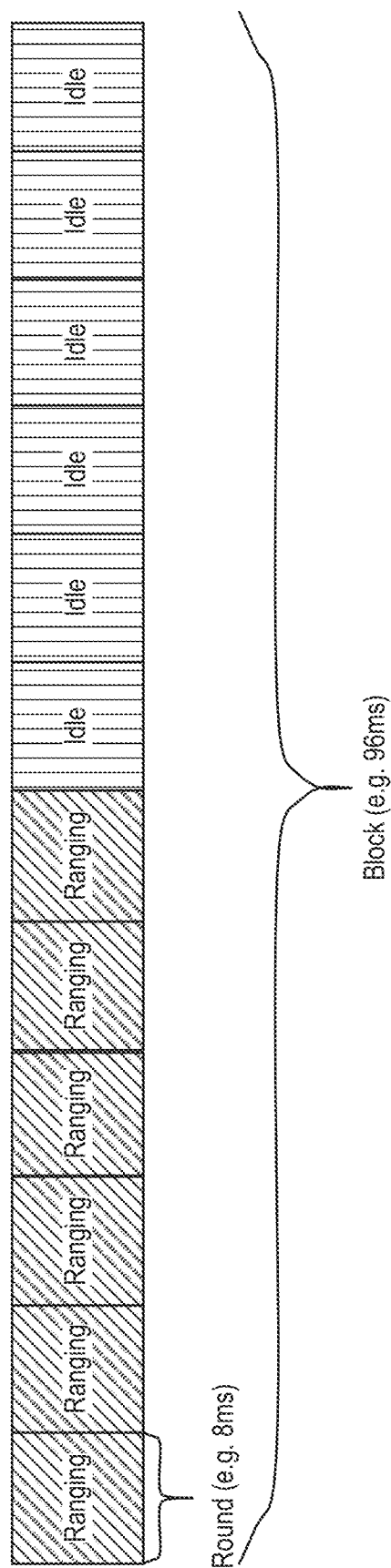
FIG. 6 is a representation of a UWB block and/or a plurality of UWB rounds, according to an example implementation of the present disclosure.

Referring now to FIG. 6, depicted is a diagram of representation of a UWB-based block and/or a plurality of UWB rounds, according to an example implementation of the present disclosure. For example, this can be implemented/adopted for certain applications, for instance as a car connectivity consortium (CCC) specification. As shown in FIG. 6, a ranging block may include a number of ranging rounds and a number of idle rounds. Each round may be between 6 ms and 96 ms, and the block may be at least 96 ms (with other possibilities of 192 ms, 288 ms, and so forth). The ranging block may be subdivided into any number of ranging rounds and/or idle rounds, which may have a constant or variable duration. The ranging rounds in relation to the idle rounds may define a duty cycle for the block. For example, if ranging were performed in each of the ranging rounds in FIG. 6, the block may have a duty cycle of 50%. Data communication can be introduced in the block and/or in certain round(s), for example in at least some of the idle rounds and/or ranging rounds.

Figure 7:
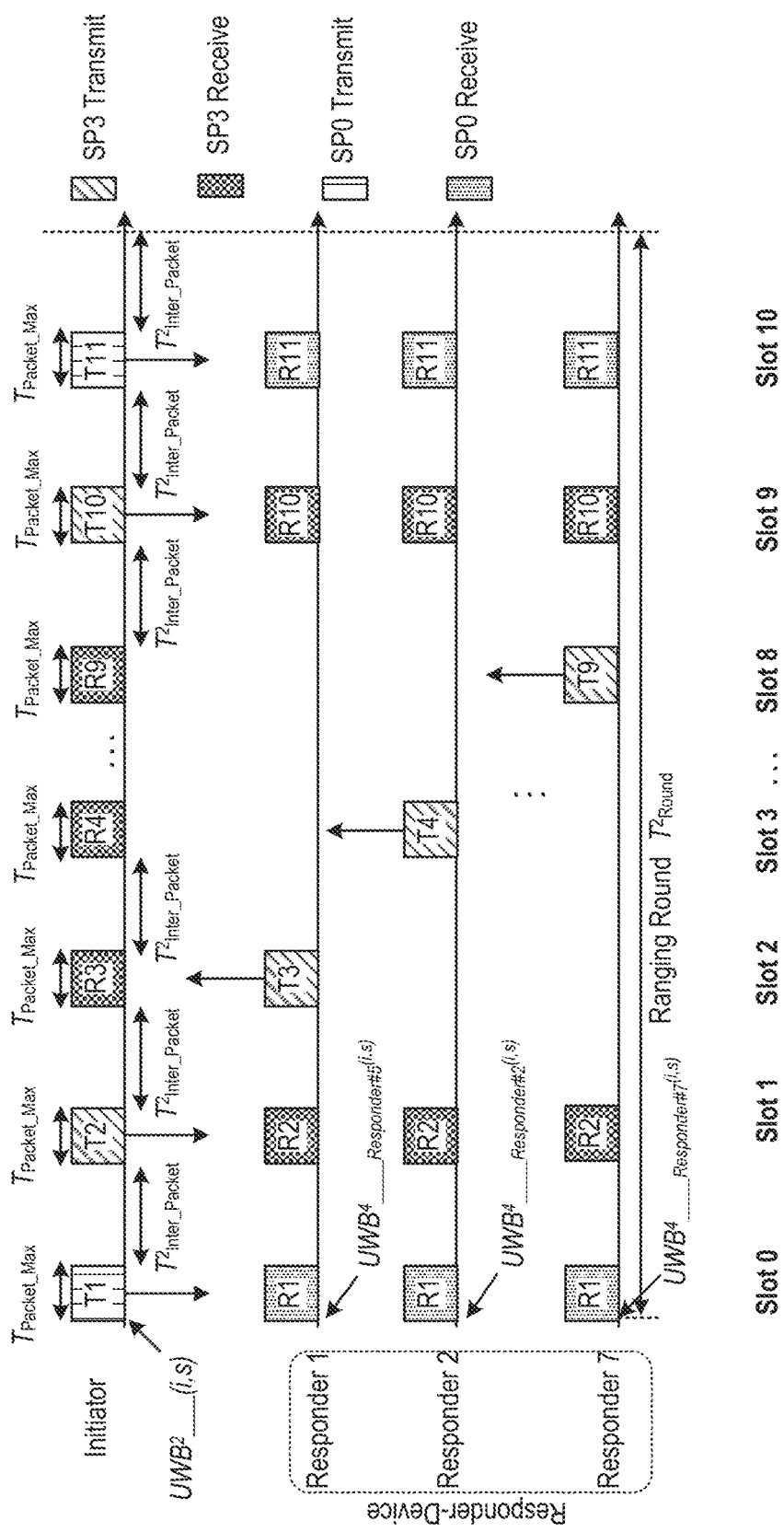
FIG. 7 is a diagram of a ranging round, according to an example implementation of the present disclosure.

Referring now to FIG. 7, depicted is a diagram/representation of a ranging round. The diagram shown in FIG. 7 may illustrate/depict a ranging round performed in one of the ranging rounds shown in FIG. 6. The ranging round may include a number of slots (e.g., slot 0-slot 10) in which packets/frames are sent between an initiator and a responder. In the diagram shown in FIG. 7, at the first slot (slot 0), an initiator (e.g., a first device 302, which may be a mobile device) may send an initial packet (T1) to any number of responder devices (or UWB devices 308 of the responder device). The initial packet T1 may be an SP0 frame, or a pre-poll message, which indicates that another ranging packet is to be transmitted by the initiator to the responder devices. Following the initial packet (T1), the initiator may send a second packet (T2) to the responder devices (at slot 1). The second packet T2 may be an SP3 packet, or a ranging packet which does not include any data. Each of the responder devices may transmit a response ranging packet (e.g., T3, T4, ... T9) back to the initiator (e.g., at slots 3-8), which may similarly be SP3 packets, and may not include any data. Once the initiator receives the response ranging packet (T3, T4, T9) from the responder devices, the initiator may transmit a ranging packet (T10) (e.g., at slot 9). The T10 packet may specify that the initiator received the response ranging packet (T3, T4, T9) from the responder devices, and/or indicates that the initiator is to transmit a final ranging packet (T11). Additionally, the responder device may use the packet T10 received from the initiator to validate the data from the final ranging packet (T11). The initiator may transmit a final ranging packet (T11) (e.g., at slot 10). The ranging packet T11 specifies a difference between a timestamp in which the initiator transmitted the second packet T2 and a timestamp in which the initiator receives a respective response ranging packet (T3, T4, ... , T9).

Figure 8:
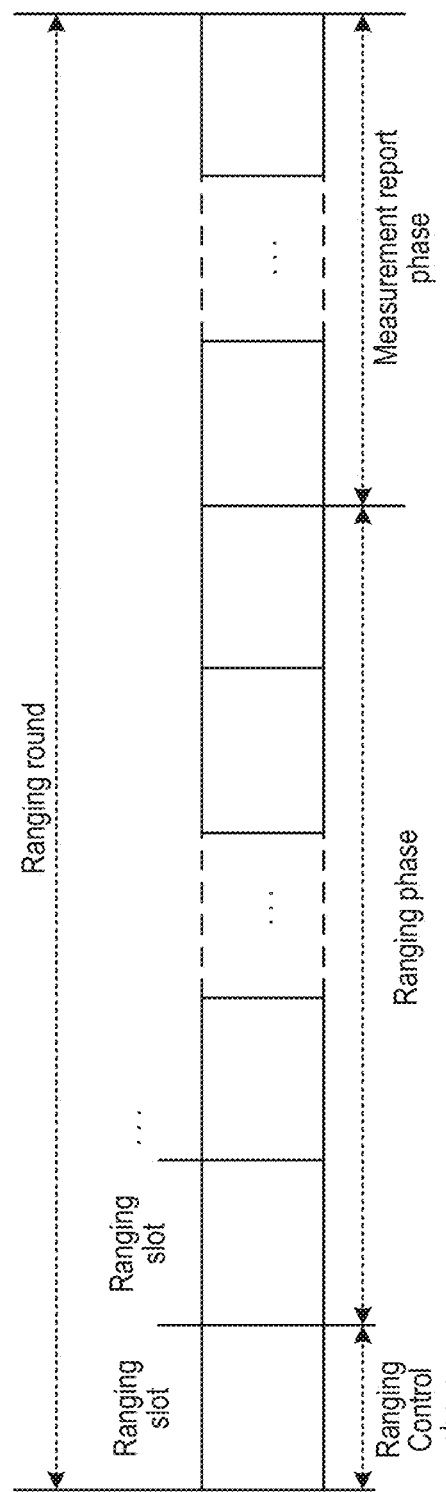
FIG. 8 is another diagram of a ranging round, according to an example implementation of the present disclosure.

Referring now to FIG. 8, depicted is another diagram/representation of a ranging round, according to an example implementation of the present disclosure. The ranging round shown in FIG. 8 is similar in some respects to the ranging round shown in FIG. 7. Specifically, the ranging round shown in FIG. 8 shows a ranging control phase (similar to slot 0), a ranging phase (similar to slots 2-9), and a measurement report phase (similar to slot 10). The slot duration and number of slots may be modified or changed between ranging rounds (e.g., by the initiator sending an RCM frame with a modified ranging round configuration).

Figure 9:
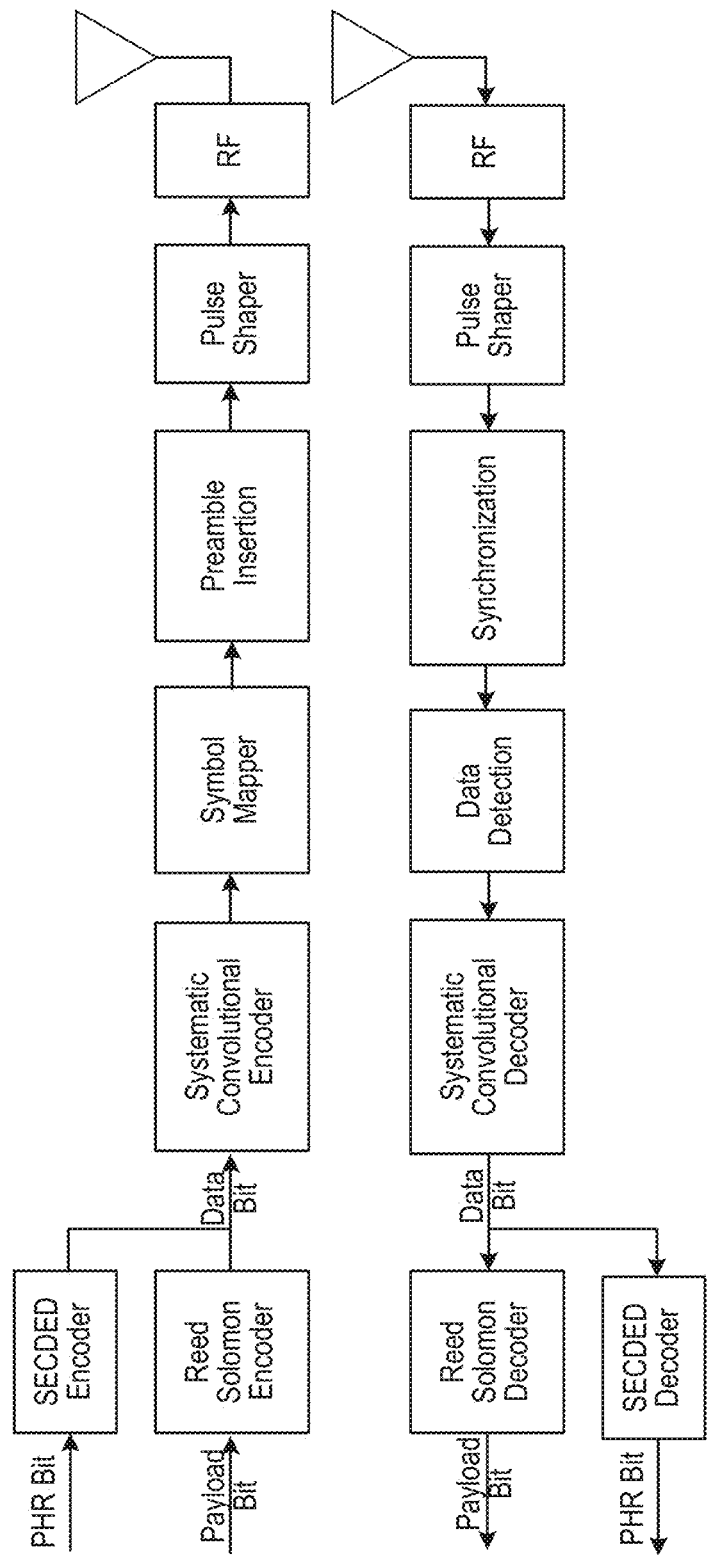
FIG. 9 is a block diagram of a data processing and communication system, according to an example implementation of the present disclosure.
Figure 10A:
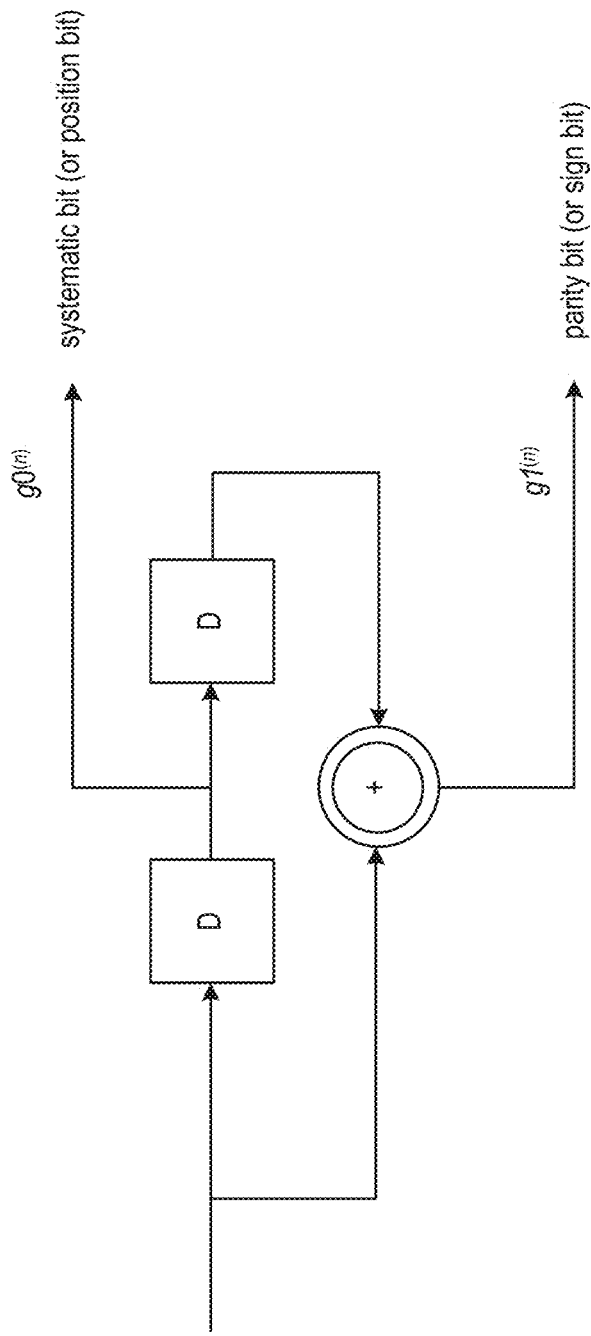
FIG. 10A and FIG. 10B are diagrams of encoders (e.g., C3 and C7 convolutional encoders) that can be used in the system of FIG. 9, according to an example implementation of the present disclosure.
Figure 10B:
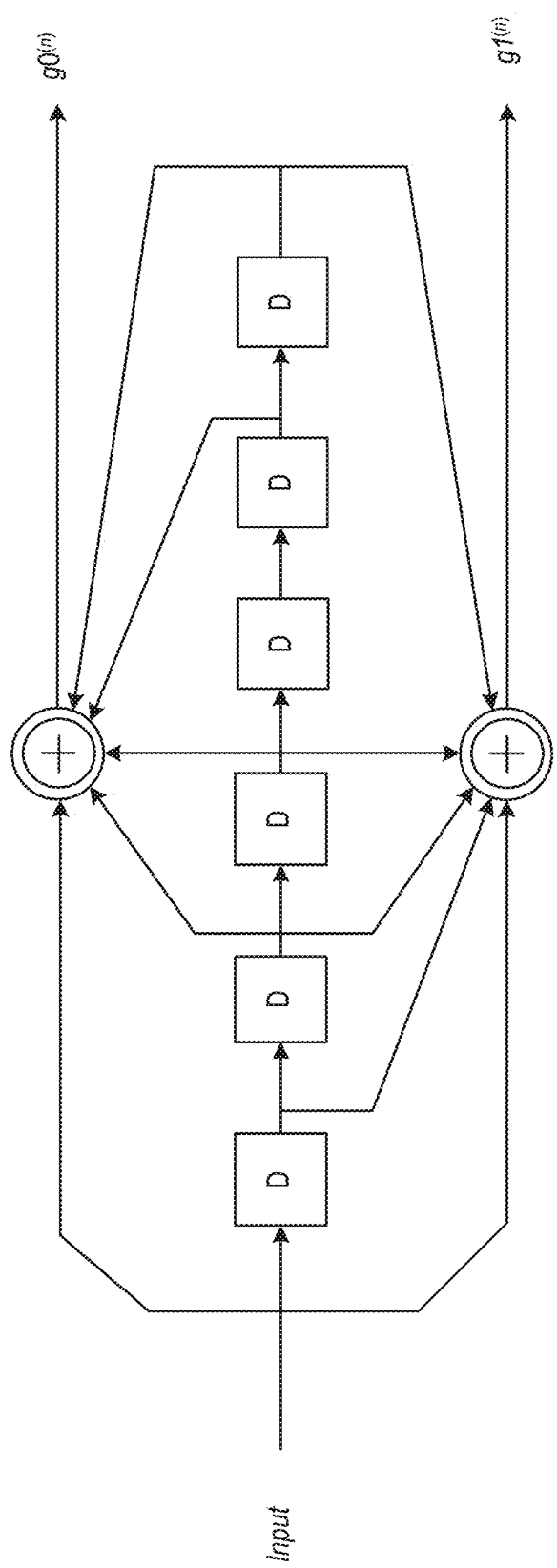

Referring now to FIG. 9 and FIG. 10, depicted is a block diagram of a data processing and communication system, and a diagram of encoders using convolutional codes which can be used in the system of FIG. 9, respectively, according to example implementations of the present disclosure. In the system shown in FIG. 9, data may be encoded by an initiator and can be decoded at the responder (and vice versa). At the initiator, bits or data may be sent to a Reed Solomon encoder for encoding and an SECDED encoder for the Physical Layer Header (PHR) bit. The encoded data may then be transmitted, sent, or otherwise provided to a systematic convolutional encoder (such as one of the encoders shown in FIG. 10). The convolutional encoder may provide a further encoded data stream to a symbol mapper, which can then perform a symbol mapping process to the further encoded data stream. The symbol mapper may provide data to a preamble insertion component which inserts any preamble data into the data stream. The data stream can then be provided to a pulse shaper, and then output by the UWB device 308 of the initiator. When the signal is received at a responder, the responder may perform an inverse of the above-mentioned process (e.g., pulse shaping, synchronization, data detection, followed by a systematic convolutional decoding, and a Reed Solomon decoding and SECDED decoding. As shown in FIG. 10, the convolutional codes may include a K=3 encoder, or a K=7 encoder.

Figure 11:
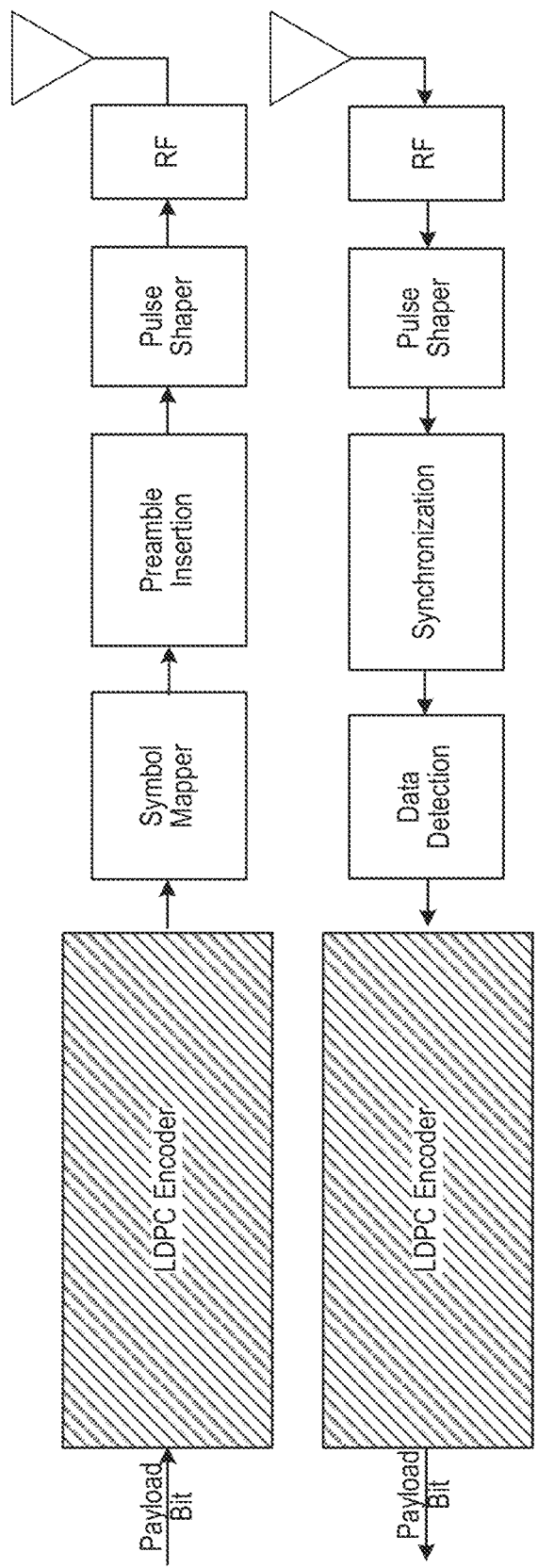
FIG. 11 is a block diagram of a data processing and communication system, according to an example implementation of the present disclosure.

Referring now to FIG. 11 and FIG. 12, depicted is a block diagram of a data processing and communication system, and example codes which could be used in the system of FIG. 11, respectively, according to example implementations of the present disclosure. In the embodiments described herein, the systems and methods described herein may apply a low-density parity-check (LDPC) encoder and decoder in the time domain. The LDPC encoder and decoder may be more robust than Reed Solomon based processing. The LDPC encoder and decoder may replace the Reed Solomon/SECDED encoders/decoders, along with the systematic convolution encoder/decoder shown in FIG. 9 and FIG. 10. The embodiments described herein may improve performance in data transmission between the UWB devices 308 at the initiator and responder. In some embodiments, the LDPC encoder (and decoder) may switch between LDPC codeword block lengths shown in FIG. 12. For example, the LDPC encoder and decoder may select an LDPC codeword block length based on a packet size/length (e.g., where the LDPC encoder may use the 1944 codeword block length for long packets, and the 1296 or 648 code word block lengths for shorter packets). In this regard, the LDPC encoder may dynamically select a codeword block length based on packet size or length (e.g., select a longest codeword block length applicable to packet traffic). The LDPC encoder may default to select the long codeword block length for increased security and robustness of the packets. It is noted that, while described as using the LDPC encoder and LDPC decoder, in some embodiments, the systems and methods described herein may incorporate, use, or otherwise include alternative encoders and decoders, such as a polar encoder and polar decoder, a turbo encoder and turbo decoder, etc. Such implementations and embodiments may increase the reliability of packets which include data (e.g., to a sensitivity of approximately −90 dBm).

Figure 13:
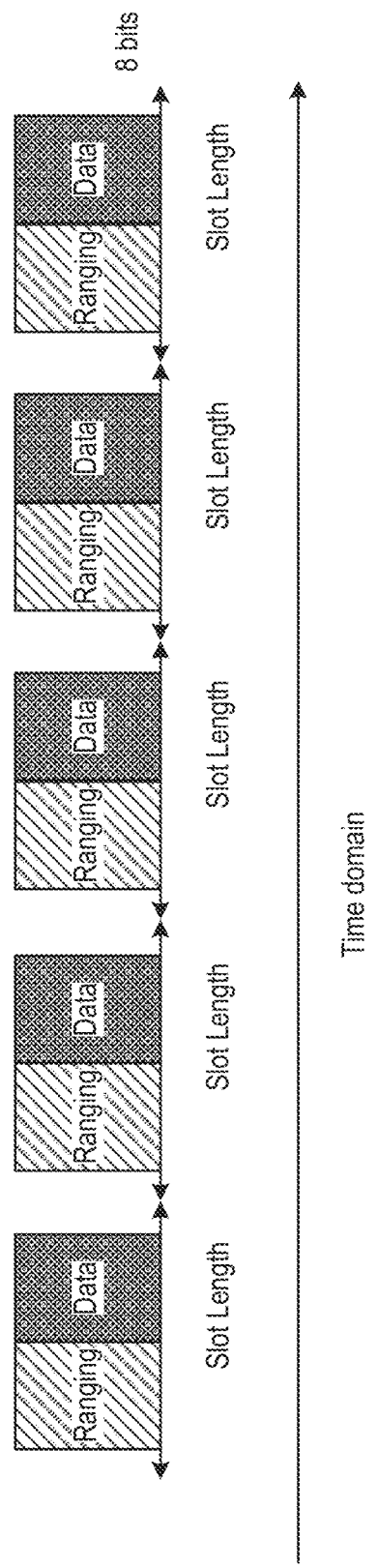
FIG. 13 is a diagram showing data communication incorporated into a ranging round, according to an example implementation of the present disclosure.

Referring now to FIG. 13, and with reference to FIG. 7, depicted is a diagram showing data communication incorporated into a ranging round, according to an example implementation of the present disclosure. With reference to FIG. 7, each of the slots (slots 0-10) may have a slot length of between 1-2 ms. However, the ranging packets transmitted between the initiator and responders may have a length in the range of 200-400 µs. In the embodiments described herein, the initiator and/or responder may include or incorporate data packets in a portion of the slot outside of the ranging packet (e.g., in the 600-800 µs separate from the ranging packet). In some embodiments, the initiator and/or responder may communicate, include or incorporate data packets in slot 0 or slot 10 (e.g., within a slot in which an SP0 packet is sent by the initiator to the responder devices), in a slot corresponding to an SP1 or SP2 packet (e.g., before or after a secure timestamp (STS) payload), in or following a responder ranging packet (e.g., T3, T4, . . . T9), etc.

Figure 14:
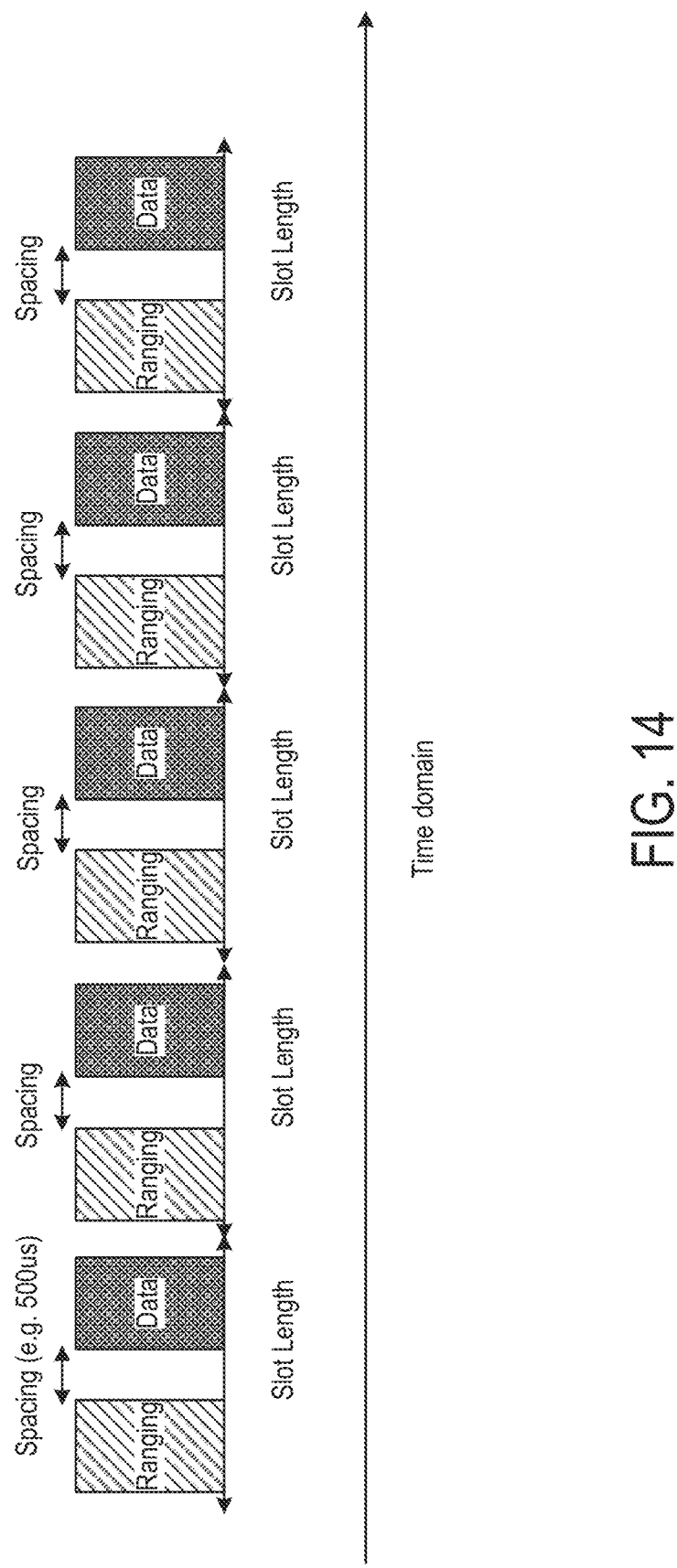
FIG. 14 is another diagram showing data communication incorporated into a ranging round, according to an example implementation of the present disclosure.

Referring now to FIG. 14, depicted is another diagram showing data communication incorporated into a ranging round, according to an example implementation of the present disclosure. The diagram shown in FIG. 14 is similar in some respects to the diagram shown in FIG. 13. In this embodiment, the initiator and/or responder may incorporate spacing between the ranging and data packets within a particular slot. For example, where slots each has a slot length of 2 ms, the initiator and/or responder may provide/support/enable/schedule a 500 µs spacing between the ranging packet (of, for instance, 500 µs), followed by a 1 ms long data packet. Note that the ranging packet could contain acknowledgment information to a preceding data frame.

Figure 15:
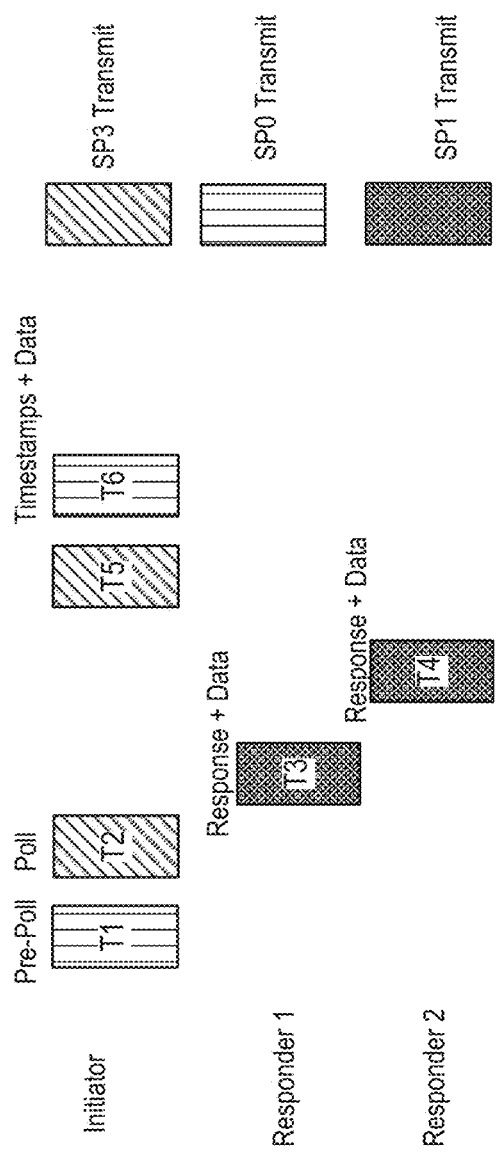
FIG. 15 is another diagram showing data communication incorporated into a ranging round, according to an example implementation of the present disclosure.

Referring now to FIG. 15, depicted is another diagram showing data communication incorporated into a ranging round, according to an example implementation of the present disclosure. In this embodiment, the initiator and/or responder may be configured to incorporate data into the ranging packets, for transmission. In this example, rather than the responders transmitting an SP3 packet (at slots 2-8 in FIG. 7), which may not include any data, the responders may instead transmit SP1 packets which include data incorporated into the SP1 packet or frame. As such, the responders may transmit data along with timestamps back to the initiator, thereby facilitating (e.g., enabling or supporting) data transmission from the responder to the initiator. Similarly, the initiator may incorporate data along with the timestamp information into the T11 packet sent at slot 10. As such, the initiator may transmit data, thereby facilitating data transmission from the initiator to the responder(s).

Referring now to FIG. 16, depicted is another diagram showing data communication incorporated into a ranging round, according to an example implementation of the present disclosure. The diagram shown in FIG. 16 includes the ranging round shown in FIG. 7, in some embodiments. In certain embodiments, the ranging round may include slots (e.g., following slot in FIG. 7) which are not used, based on parameters of the ranging round configuration. In the embodiment shown in FIG. 16, the initiator and/or responder may incorporate, embed, carry or otherwise transmit data in slots which are not being used (e.g., those slots bound by a box in the table shown in FIG. 16, such as slots following the SP0 data packet sent by the initiator at slot 10). For example, the ranging round may be 20 ms, but ranging may be performed in a portion of the ranging round (e.g., for 8 ms), and data transmission may be performed in the remaining portion of the ranging round (e.g., in the remaining 12 ms).

Figure 17:
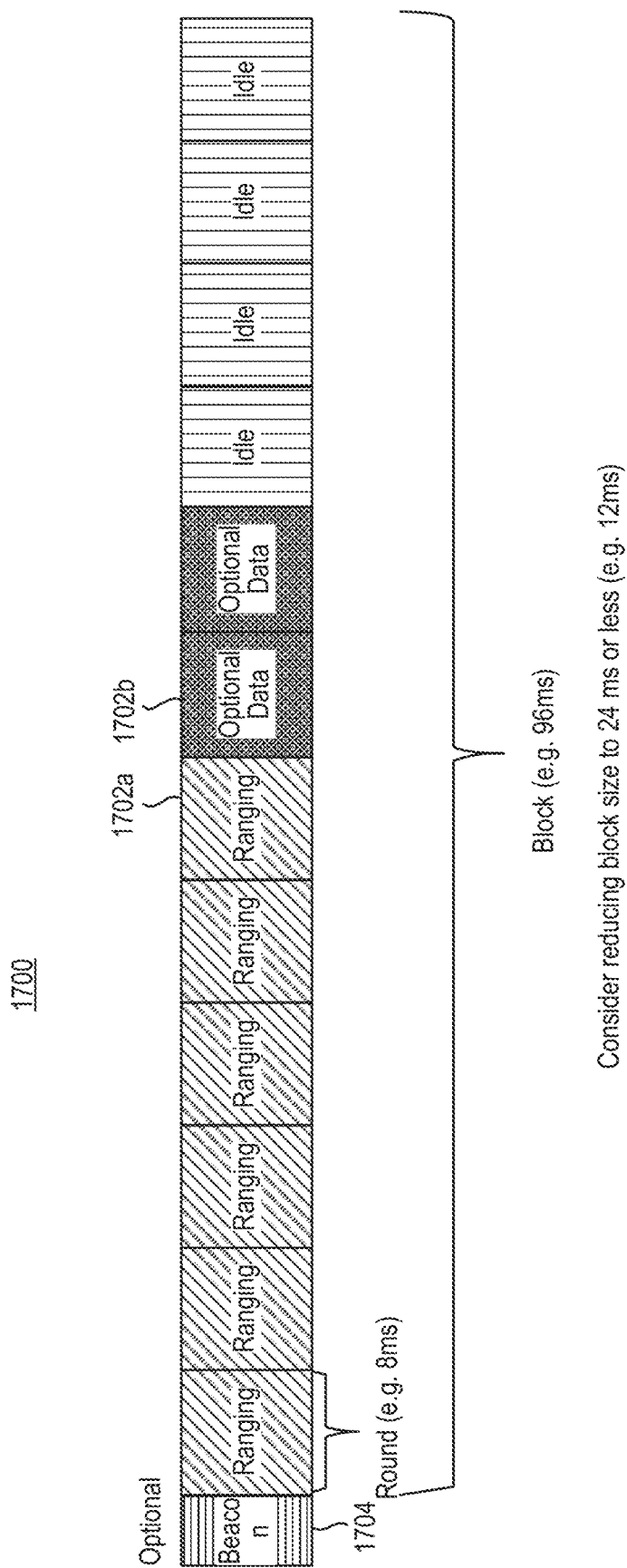
FIG. 17 is a diagram showing data communication incorporated into a UWB block, according to an example implementation of the present disclosure.

Referring now to FIG. 17, depicted is a diagram showing a transmission block 1700 including rounds 1702, according to an example implementation of the present disclosure. In the embodiment shown in FIG. 17, the transmission block 1700 may include both ranging rounds 1702a and data rounds 1702b. While shown as including rounds 1702 which are specifically defined for ranging and data, it is noted that, in some embodiments, the rounds 1702 may include general purpose rounds 1702 (or idle rounds) which can be used/configured/repurposed for ranging and/or data communications. In some embodiments, the transmission block 1700 may be configured for a plurality of devices in an environment (such as the environment shown in FIG. 3). In some embodiments, the transmission block 1700 may define or otherwise configure contention-free periods (CFPs), while also eliminating contention-access periods (CAPs). The beacon signal may be used/sent to negotiate, configure, or otherwise provide/define different rounds 1702 for which the devices are to perform wireless communications. Such rounds may include a ranging period, a data period, and/or an idle period. In the idle period, neighboring devices may transmit with other responders (e.g., to avoid collisions and interference between devices).

In some embodiments, the devices may coordinate or otherwise exchange communications (e.g., a configuration message or a beacon signal) to negotiate/specify the transmission block 1700 (and its rounds), or may receive a broadcast (e.g., a configuration message or a beacon signal) to specify/define/configure the transmission block 1700. For example, and in some embodiments, a beacon signal 1704 (referred to in greater detail below with reference to FIG. 19-FIG. 22) may define or assign rounds 1702 to devices within the environment. In some embodiments, a device within the environment (e.g., a master device) may transmit, send, or otherwise provide the beacon signal 1704 to other devices within the environment. In some embodiments, the beacon signal 1704 may be used/sent to assign to each of the devices at least a respective ranging round 1702*a* and/or at least a respective data round 1702*b*. For example, a device may be assigned (e.g., as configured or defined by the beacon signal or otherwise defined for the transmission block 1700) two or more rounds 1702, which may include a ranging round 1702*a* and a data round 1702*b*. The devices may be configured to perform wireless communications to perform ranging within the ranging round 1702*a*, and perform wireless communications to communicate data within the data round 1702*b*. In some embodiments, the transmission block 1700 may be sent by a device (and received by at least another device within the environment) within the UWB spectrum. In other words, a device may be configured to transmit/convey a configuration/specification of the transmission block (e.g., in a packet or frame) using the UWB protocol and using UWB antennas/devices. In some embodiments, the configuration/specification of the transmission block 1700 may be sent/transmitted in a frequency range outside of (or at least partially outside of) the UWB spectrum. For example, a device may be configured to transmit the transmission block (e.g., in a packet or frame) using a protocol (and/or a frequency range) which is different from the UWB protocol. For instance, the device may be configured to transmit the transmission block using a WiFi protocol, a Bluetooth protocol, an NFC protocol, or some other protocol. Such protocols may operate in frequencies which are outside of (or at least partially outside of) the UWB spectrum.

Figure 18:
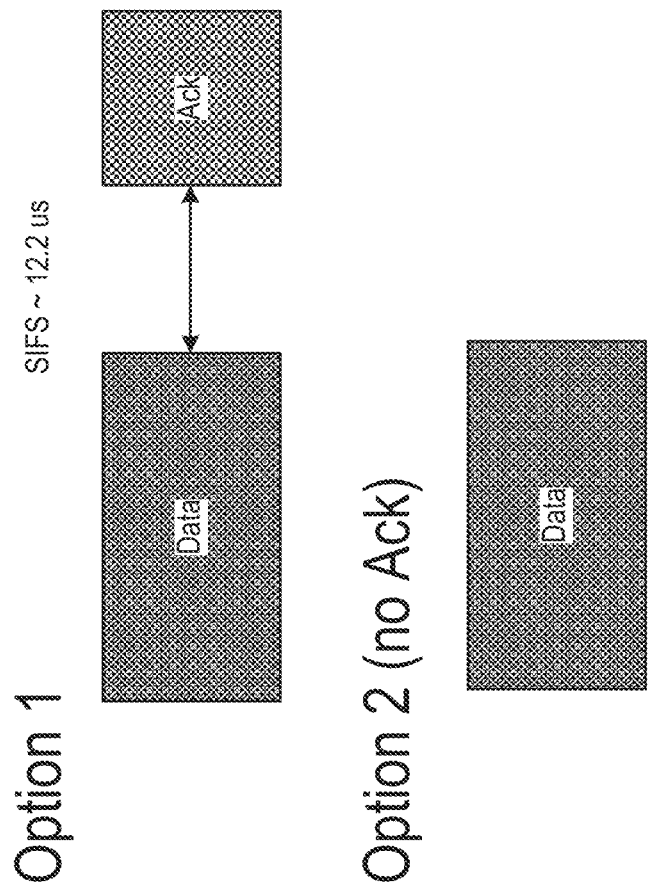
FIG. 18 is a diagram showing data communication with and without acknowledgements, according to an example implementation of the present disclosure.

Referring now to FIG. 18, depicted is a diagram of data rounds with or without acknowledgements (e.g., messages to acknowledge/confirm/report receipt of corresponding data transmissions), according to an example implementation of the present disclosure. In some implementations, within the data rounds shown in FIG. 17, the data packets/frames may be followed by acknowledgement(s). For example, and as shown as option 1 in FIG. 18, an initiator may transmit a data packet to a responder during a data round, and the responder may send a message to acknowledge the data packet during the data round. In some implementations, and as shown in option 2 in FIG. 18, an initiator may transmit a data packet during a data round, and the responder may forego, omit, or otherwise not provide/send an acknowledgement to the initiator. In some implementations, and as shown in option 3 in FIG. 18, an initiator may transmit multiple data packets to a responder (e.g., over one or multiple data rounds), and the responder may provide a block (or combined/batch) acknowledgement which acknowledges receipt of multiple data packets by the responder from the initiator. Similarly, the responder may transmit, send, or otherwise provide data packets to an initiator, and the initiator may acknowledge using one of the options described above.

Referring now to FIG. 19, depicted is a diagram/representation of a beacon signal/frame structure (e.g., structure/format of a beacon signal/frame), according to an example implementation of the present disclosure. The beacon signal/frame structure shown in FIG. 19 may be used by or incorporated in the beacon as shown in FIG. 17 for instance, for defining a particular transmission block configuration, structure, or schedule. The beacon signal structure may specify the structure and/or characteristics (e.g., timing windows, functional portions) of the transmission block (e.g., the block shown in FIG. 19). For example, the beacon signal structure may include portions or sequences for a series of bits which define various information relating to the block configuration for at least device to use/apply in sending ranging and/or data transmissions. The beacon signal structure may include a frame control portion (e.g., including 16 bits for configuring the frame control), a sequencing number portion (e.g., including 8 bits for configuring the sequencing number), an addressing fields portion (which may include 32 or 80 bits for configuring the addressing fields. In some embodiments, the beacon signal structure may include 8 bit portions for defining the minimum block duration and the actual block duration, respectively. The minimum block duration may be configurable in multiples of 2 ms (e.g., such that the beacon may set or configure the minimum block duration).

The actual block duration may be defined as an integer multiple of the minimum block duration (e.g., as an absolute value or a factor that represents a multiple of the minimum block duration). For example, if the minimum block duration is 96 ms, and the actual block duration is to be set as 288 ms, then the actual block duration specified in the block duration portion may be 3 (e.g., 3×96 ms=288 ms). The beacon signal structure may include a chap per slot portion (e.g., including 4 bits for configuring the number of chap per slots), and a slot per round portion (e.g., including 4 bits for configuring the number of slots per round). The beacon signal/frame structure may include an idle round portion (e.g., including 8 bits for configuring the number of idle rounds). The beacon signal structure may include an FCS portion (e.g., including 16 or 32 bits for configuring the frame check sequence). The beacon may use the beacon signal structure for configuring the block (and rounds of the block). For example, the block or round duration may be specified based on the chap per slot and/or slots per round (e.g., 1 chap=0.3333 ms). The chap per slot value may be selected from a value of 3, 4, 6, 8, 9, 12, 24, or other values. Similarly, the slots per round may be selected from a value of 6, 8, 9, 12, 24, 32, 36, 48, 72, 96, or other values. Together, some or all of these values may define the block and/or round duration.

Referring now to FIG. 20, depicted is a diagram/representation/description of an example beacon signal using the beacon signal structure of FIG. 19, according to an example implementation of the present disclosure. In this example, a UWB-based device (e.g., an initiator device) may broadcast, send, or otherwise provide a beacon signal (sometimes referred to as a configuration message) for configuring the block in which ranging and data transmission is performed between an initiator and responder(s). In some embodiments, the device may transmit the beacon signal to initiator and/or responder devices at a certain interval, and/or prior to one or more blocks. In some embodiments, the device may transmit the beacon signal to initiator and/or responder devices responsive to the beacon modifying the beacon signal/frame (e.g., based on a delta in the configuration).

In the example shown in FIG. 20, the minimum block duration may be 24 ms, and the actual block duration set as 96 ms by the beacon. The device may generate the beacon signal including bits which can set the minimum block duration as 48 ms (e.g., 24×2 ms minimum block duration), and can set the block multiplier as 2 (e.g., to provide an actual block duration of 96 ms). The device may generate the beacon signal to specify 3 chaps per slot, 8 slots per round, and a number of idle rounds as any number between 0 and 12. As stated above, the duration of a chap may be 0.3333 ms. In this example, with three chaps per slot, the slots may have a duration of 1 ms (e.g., 3×0.3333 ms=1 ms). Additionally, the round may have a duration of the 8 ms (e.g., 8 slots×1 ms slot duration). The total number of rounds may be 12 (e.g., actual block duration of 96 ms/8 ms round duration=12).

Referring now to FIG. 21 and FIG. 22, depicted is another diagram of a beacon signal/frame structure and a diagram of an example beacon signal using the beacon signal structure of FIG. 21, respectively, according to example implementations of the present disclosure. The beacon signal structure shown in FIG. 21 may be similar in some aspects to the beacon signal structure shown in FIG. 19. In the beacon signal structure shown in FIG. 21, the minimum block duration may be a default or known value (for example, may be a default value of 96 ms). In this example, a beacon frame may omit, forego, or otherwise not provide/include/carry any data which specifies the minimum block duration (as the minimum block duration is a default or known value). Rather, for configuring the actual block duration, the beacon signal structure may include a portion for a block duration multiplier. For example, where the minimum block duration is fixed at 96 ms, to provide an actual block duration of 288 ms, a beacon frame may specify/provide a block duration multiplier of 3 (e.g., 3×96 ms=288 ms). In this implementation, the beacon signal structure may be more consolidated (e.g., include fewer bits, a shorter string, etc.) as compared to the beacon signal structure shown in FIG. 19.

Continuing the example shown in FIG. 22, the beacon frame shown in FIG. 17 may configure at least one block in which ranging and data transmission is performed between an initiator and responder(s) (which may be provided prior to a certain block or when a block configuration is to be changed, as described above). In this example, the default (or fixed, predetermined, preconfigured, set) minimum block duration may be 96 ms, and the actual block duration may be set as 192 ms by the beacon. The device may generate the beacon signal including bits which set the block multiplier as 2 (e.g., to provide an actual block duration of 192 ms, or 2×96 ms=192 ms). The device may generate the beacon signal to specify 3 chaps per slot, 8 slots per round, and a number of idle rounds which may be any number between 0 and 24. As stated above, the duration of a chap may be 0.3333 ms. Similar to the example shown in FIG. with three chaps per slot, the slots may have a duration of 1 ms (e.g., 3×0.3333 ms=1 ms). Additionally, the round may have a duration of 8 ms (e.g., 8 slots×1 ms slot duration). The total number of rounds may be 24 (e.g., actual block duration of 192 ms/8 ms round duration=24).

A device which receives the beacon signal may be configured to synchronize various operations according to the beacon frame (e.g., timing information such as a reference time, start time, end time, time unit and/or clock frequency). For instance, the device may be configured to set a wireless communication schedule for the device according to the beacon frame. The device may be configured to perform wireless communications between other devices in the environment according to the wireless communication schedule. For example, the beacon frame may be configured to set a time or time interval in which a device is to perform wireless communications (e.g., to perform ranging and/or to communicate data). The device may be configured to receive the beacon frame and synchronize operations of the device according to the beacon frame (e.g., to perform ranging and/or communicate data at the set time/time interval).

According to the implementations and embodiments described herein, the systems and methods of the present disclosure may provide for or otherwise incorporate data into ranging protocols, ranging rounds and/or ranging packets exchanged between devices 302, 304 in an environment 300. Similarly, the systems and methods described herein may secure the data using LDPC encoders/decoders, thereby increasing the reliability and sensitivity of the data packets exchanged between the devices 302, 304. Furthermore, the systems and methods described herein may provide a customizable/adaptable configuration of data blocks which are used for transferring, transmitting, receiving, or otherwise exchanging data between the devices 302, 304.

Figure 23A:
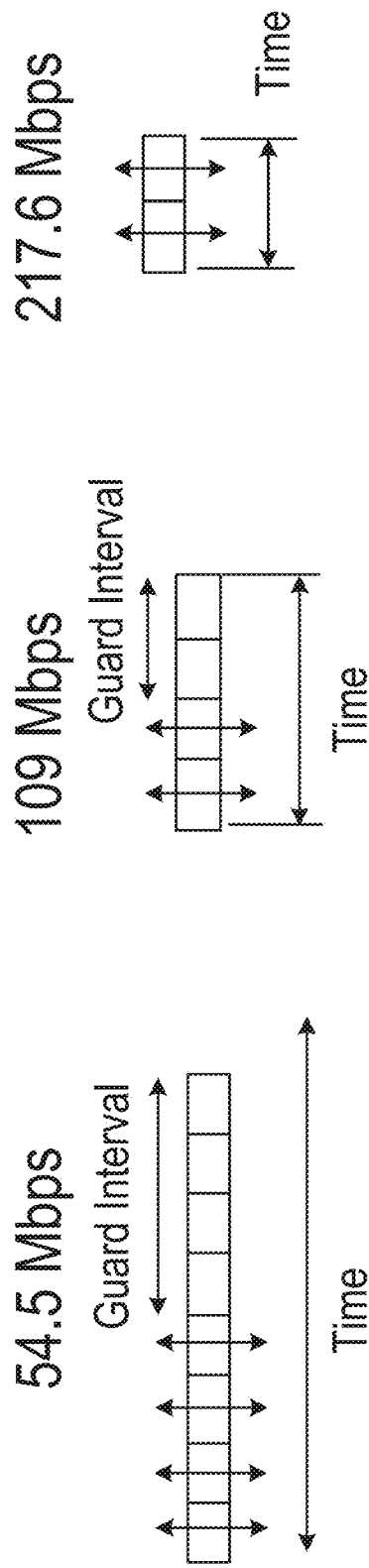
FIG. 23A-FIG. 23C a diagram of various forms/versions of data frames for modulating to different data (or bit transfer) (PHY) rates, according to example implementations of the present disclosure.
Figure 23B:
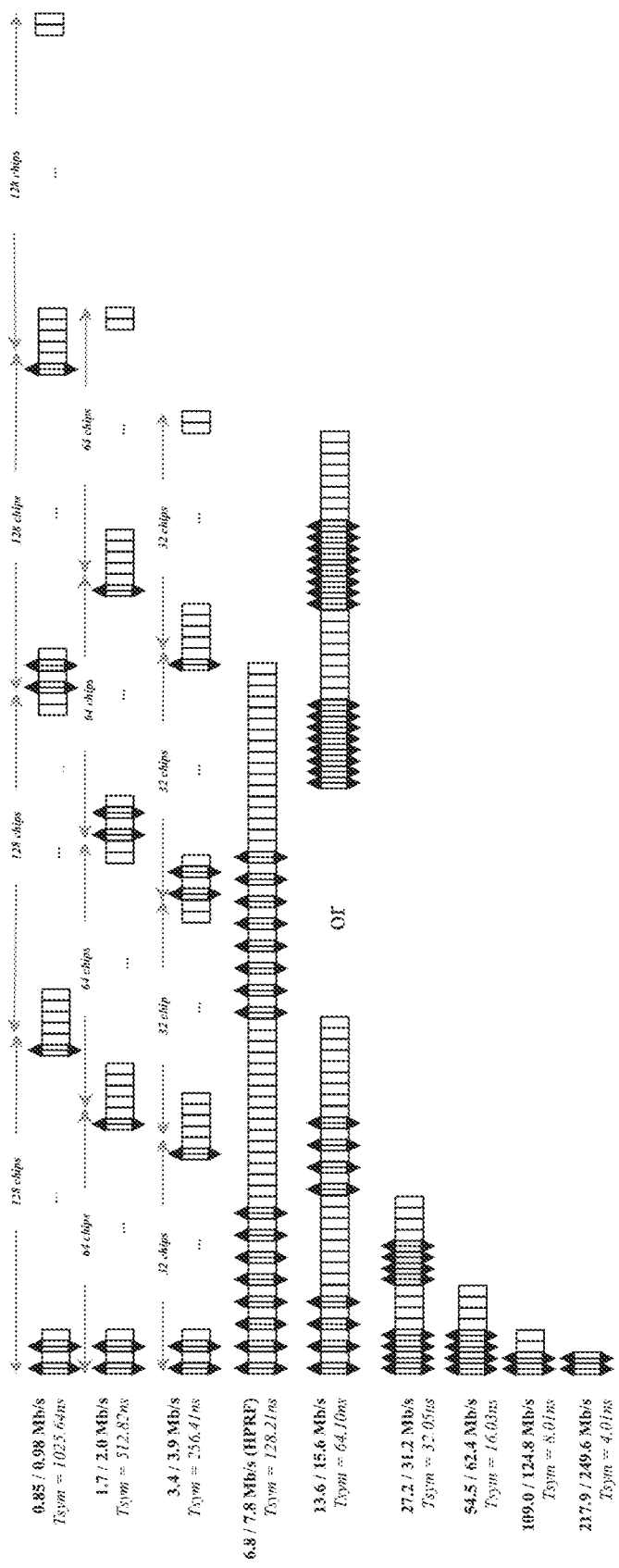
Figure 23C:
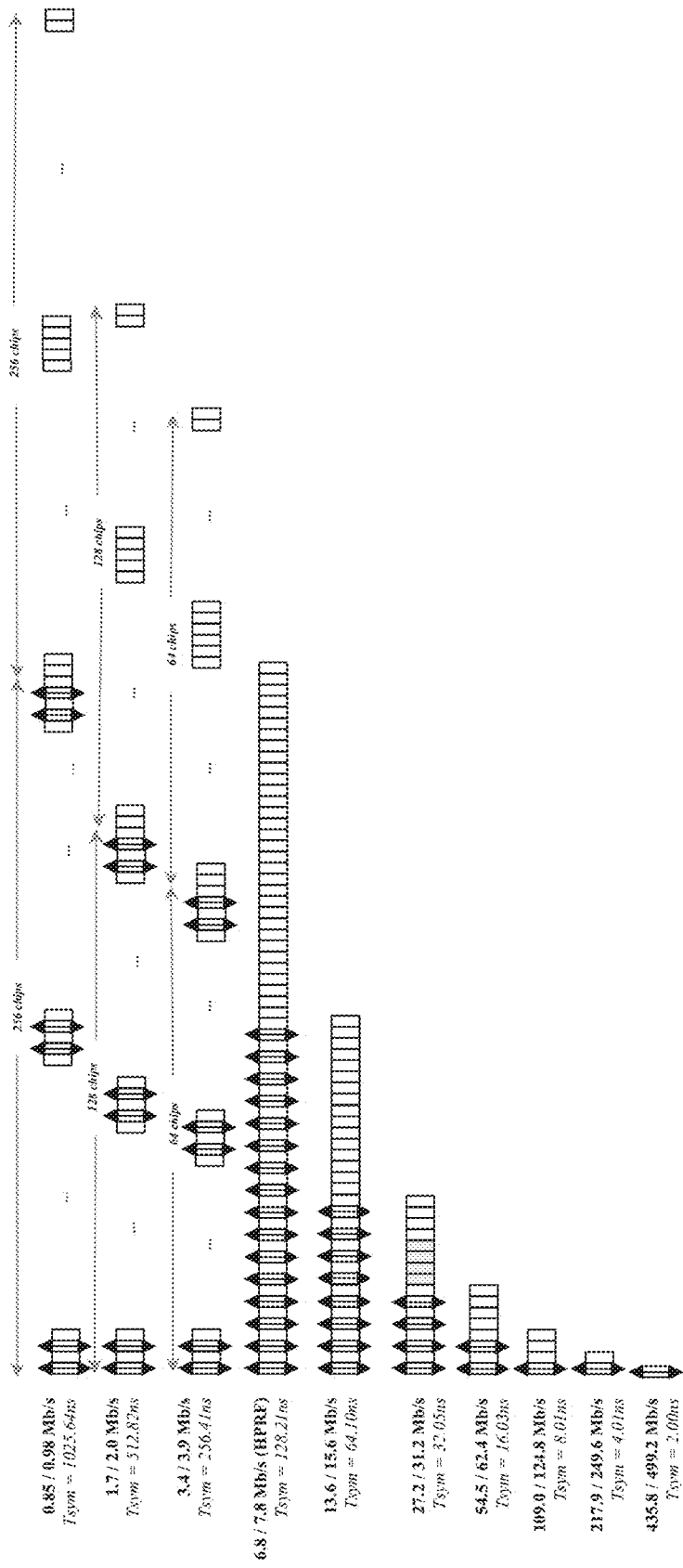

Referring now to FIG. 23A-FIG. 23C, depicted are diagrams of various data or communication frames for modulating to different data (or bit transfer) (PHY) rates. In some implementations, a data frame may include a number of signal pulses and a number of guard intervals. The signal pulses may be repeat transmissions, which provide a redundancy in the data communication or transmission. For instance, for each data transmission, the number of signal pulses may represent a number of repeat transmissions. As such, as the number of signal pulses increase, the overall data transmission rate may decrease (since the overall number of repeat transmissions increase, resulting in less overall data throughput). For example, a data frame may include eight signal pulses and eight guard intervals, which would result in a data transmission rate of 27.25 Mbps.

In some embodiments, and referring specifically to FIG. 23A, by providing fewer signal pulses and guard intervals, the systems and methods described herein may provide an (transmission) energy/power boost to the signal pulses. For example, since power measurements are done over a 1 ms time window in both FCC and ETSI, the systems and methods described herein may increase a power of the signal pulses, thereby increasing the signal-to-noise ratio (SNR). For example, when 1500 bytes of data are used using 27 Mbps, the overall transmission time may be approximately 500 us (including preamble of 52.5 us). Accordingly, the systems and methods described herein may increase the energy of packets by 3 dB to increase the SNR. In such instances, the sensitivity of 27 Mbps may be the same as that of 6.8 Mbps. The systems and methods described herein may increase power (also referred to herein as an energy boost) of transmissions over 100 microseconds such that a signal transmitted over 100 microseconds results in the same amount of power as a signal over a one millisecond continuous transmission.

Continuing the example described above with reference to FIG. 23A, by modulating data frames for providing different data rates, the systems and methods described herein may increase the power on a per-packet basis (e.g., such that the per-packet power or energy increases as the packet size decreases).

Table below expands on this for the case of 4095 bytes and shows that the higher PHY rates may be obtained at similar sensitivities (within 3.2 dB) as that of 6.8 Mbps, for example. For example, by providing an energy boost, the 218 Mbps rate may provide an optimized range along with a reduction in power consumption, at the expense of possibly higher complexity at the receiver. An increase in net throughput may be achieved by hopping across multiple channels. In that case, the net throughput would be multiplied by the number of hops achieved in a 1 ms time period.

TABLE 1

Packet (PHY) Rates using an Energy Boost

| PHY rate | Physical Layer Protocol Data Unit (PPDU) duration for 4095 bytes (assuming suboptimal 52.5 us preamble) | Net Throughput (Mbps) for this example of 4095 bytes in 1 ms duration [no frequency hopping] | Energy boost (dB) | SNR delta over 6.8 Mbps (without/with energy boost) |
|---|---|---|---|---|
| 54.5 | 654 | 32.76 | 1.8 | 5/3.2 |
| 109 | 353 | 32.76 | 4.5 | 7.2/2.7 |
| 218 | 203 | 32.76 | 6.9 | 7.5/0.6 |
| 249.6 | 184 | 32.76 | 7.3 | 9.4/2.1 |

In some embodiments, and with reference to Table 2 below, the systems and methods described herein may apply different coding schemes to provide different data rates. Specifically, a device may be configured to selectively apply different encoders having respective constrained lengths (CLs) and/or selectively apply Reed Solomon (RS) encoding to provide or yield different data rates. Specifically, in FIG. 23B and FIG. 23C, the data rates shown indicate different data rates depending on whether RS encoding is enabled (e.g., A/B where A is with RS encoding enabled, and B is with RS encoding disabled). In some implementations, standards (such as 802.14.4) for RS encoding may define blocks of k=330 input (or information) bits with an error correcting capability of t=24 bits. The systems and methods described herein may provide additional correction bits (e.g., 48 correction bits, or 2×t) to yield an overall codeword length in bits (e.g., input/information bits+correction bits) of 378 total bits. Accordingly, the code rate (e.g., of input bits to total bits) may be 55/63 (e.g., 330/378), or RS (55,63). The standards may further specify or define RS encoding using the Galois field (e.g., $GF(2^6)$, with the following generator polynomial shown in the following equation:

$$g(x) = \prod_{k=1}^{8}(x + \alpha^k) = x^8 + 55x^7 + 61x^5 + 37x^5 + 48x^4 + 47x^3 + 20x^2 + 6x^1 + 22$$

As such, a device may be configured to selectively apply RS encoding to data (e.g., input bits), particularly where BCC with CL3 is used to encode the input bits, which is to be transferred or otherwise communicated between devices within an environment via the UWB devices 308.

Furthermore, and in some embodiments, a device may be configured to apply different encoders (such as BCC with CL3 CL7, LDPC described above, polar code, or some other encoder) to yield different data rates. For example, the encoders may include convolutional encoders, which may be applied both physical layer (PHY) and service data unit (PSDU) fields. Constrained length is often referred to the "memory" of the encoder which is used for encoding data. Constrained length can be computed as K+1, where K is the order of the generation polynomial of shift registers. Some standards, such as 802.15.4, may define a CL of 3 for base pulse repetition frequency (BPRF) mode. Similarly, some standards, such as 802.15.4z, may define a CL of 7 for high pulse repetition frequency mode (HPRF) mode (such as for use by HRP-ERDEV devices). Additionally, since the encoders typically generate two coded bits for every bit (e.g., both in BPRF and HPRF), the code rate may be a constant 0.5.

TABLE 2

Data Rates using Reed-Solomon Channel Coding

| Applicability | Data Rate (Mbps) | Reed-Solomon Encoding Enabled? | Code Rate |
|---|---|---|---|
| Proposed Low Data Rates for 802.15.4ab | 0.85 | On | 0.5 |
| | 0.98 | Off | 0.5 |
| | 1.7 | On | 0.5 |
| | 2.0 | Off | 0.5 |
| | 3.4 | On | 0.5 |
| | 3.9 | Off | 0.5 |
| Legacy 802.15.4 | 6.8 (BPRF) | On | 0.5 |
| Legacy 802.15.4z | 6.8 (HPRF) | On | 0.5 |
| | 7.8 | Off | 0.5 |
| Proposed Mid Data Rates for 802.15.4ab | 13.6 | On | 0.5 |
| | 15.6 | Off | 0.5 |
| Legacy 802.15.4z | 27.2 | On | 0.5 |
| | 31.2 | Off | 0.5 |
| Proposed High Data Rates for 802.15.4ab | 54.5 | On | 0.5 |
| | 62.4 | Off | 0.5 |
| | 109.0 | On | 0.5 |
| | 124.8 | Off | 0.5 |
| | 217.9 | On | 0.5 |
| | 249.6 | Off | 0.5 |

In some embodiments, and with reference to FIG. 23B and Table 3 below, the systems and methods described herein may apply binary phase-shift keying (BPSK) modulation to data (e.g., input data) to provide different data rates. Specifically, a device may be configured to selectively apply BPSK modulation by modifying a number of chips contained within a symbol (Ncps), number of chips contained in a burst (Ncpb), number of bursts that contain pulses in a symbol (dataNPulseBurst) and/or number of pulses containing data pulses in a burst (dataNPulseperBurst). The Ncps may provide a different length of the PSDU field (e.g., K×Ncps, where K=the number of symbols). The Ncpb can either contain data through the BPSK and repetition encoding, or be empty (e.g., chip guard intervals). As shown in Table 3 below, to provide lower data rates, the PSDU field may have higher repetition and guard intervals or bands (e.g., by having higher Ncps and lower Ncpb), which may provide a protection against disperse and noisy channels. On the other hand, to provide higher data rates, the PSDU field may have lower repetitions per burst, reduced inter-chip guard intervals, and/or reduced inter-burst guard intervals. In some embodiments, and as shown in FIG. 23C, a device may be configured to provide different data rates through quadrature phase shift keying (QPSK) modulation. The device may provide or perform QPSK modulation in a manner similar to performing BPSK modulation. In this example, one bit of information (e.g., input data) may be included in each Tsym. By performing QPSK modulation, the device may achieve higher data rates than BPSK, up to 500 Mbps (e.g., 499.2 Mbps), by mapping two bits from the encoder to the real and imaginary component of the constellation point.

modulation, according to example implementations of the present disclosure. Each of the diagrams shown in FIG. 31A-FIG. 32J may correspond to a respective data rate shown in FIG. 23B-FIG. 23C. The data frame may be changed, modified, or otherwise modulated to result in higher data transmission rates. For example, and as shown in FIG. 31C and FIG. 32D, a device may encode data using BPSK modulation, QPSK modulation, or some other modulation/encoding (including using LDBC, CL3, CL7, etc.) scheme to provide data transmission rates of 54.5 of 62.4 Mbps, depending on whether or not Reed-Solomon encoding is enabled (e.g., 54.4 Mbps with Reed-Solomon encoding enabled and 62.4 Mbps with Reed-Solomon encoding disabled). The data frame may include four signal pulses (or chips) and four guard intervals (or chips), resulting in a total Tsym of 8 chips (or 16.03 ns) and a data transmission rate of 54.5, or 62.4 Mbps, depending on whether or not Reed-Solomon code is enabled. Additionally, the input bits may be mapped to different bursts and represented within the signal as the pulses shown in FIG. 31C and FIG. 32D. Similarly, and as shown in FIG. 31B and FIG. 32C a device may encode data using BPSK modulation, QPSK modulation, or some other modulation/encoding scheme to provide data transmission rates of 109.0 or 124.8 Mbps. For example, the data frame may include two signal pulses and two guard intervals, resulting in a data transmission rate of 109, or 124.8 Mbps, depending on whether Reed-Solomon code is

TABLE 3

Data Rates using Binary Phase-Shift Keying Modulation

| Applicability | Data Rate (Mbps) | Ncps | Ncpb | dataNPulseBurst | dataNPulsePerBurst |
|---|---|---|---|---|---|
| Proposed Low | 0.85 | 512 | 128 | 2 | 64 |
| Data Rates for | 0.98 | 512 | 128 | 2 | 64 |
| 802.15.4ab | 1.7 | 256 | 64 | 2 | 32 |
|  | 2.0 | 256 | 64 | 2 | 32 |
|  | 3.4 | 128 | 32 | 2 | 16 |
|  | 3.9 | 128 | 32 | 2 | 16 |
| Legacy 802.15.4 | 6.8 (BPRF) | 64 | 8 | 1 | 8 |
| Legacy | 6.8 (HPRF) | 64 | 16 | 2 | 8 |
| 802.15.4z | 7.8 | 64 | 16 | 2 | 8 |
| Proposed Mid | 13.6 | 32 | 8 | 2 | 4 |
| Data Rates for | 15.6 | 32 | 8 | 2 | 4 |
| 802.15.4ab |  |  |  |  |  |
| Legacy | 27.2 | 16 | 4 | 2 | 4 |
| 802.15.4z | 31.2 | 16 | 4 | 2 | 4 |
| Proposed High | 54.5 | 8 | 2 | 2 | 2 |
| Data Rates for | 62.4 | 8 | 2 | 2 | 2 |
| 802.15.4ab | 109.0 | 4 | 1 | 2 | 1 |
|  | 124.8 | 4 | 1 | 2 | 1 |
|  | 217.9 | 2 | 1 | 2 | 1 |
|  | 249.6 | 2 | 1 | 2 | 1 |

In various embodiments of the systems and methods described herein, a device may be configured to transmit wireless communications for communicating data at different data rates based on whether or not guard intervals are incorporated into the wireless communication and depending on the particular encoding/modulation scheme provided by the device on the input data. For instance, a device may transmit wireless communications at a first data rate (such as approximately 109 Mbps) when incorporating a guard interval, or transmit wireless communications at a second data rate (such as approximately 217.6 Mbps) by omitting the guard intervals. As such, the systems and methods described herein may generally be configured to communicate data at data rates ranging between 100 Mbps and 250 Mbps.

Figure 31A:
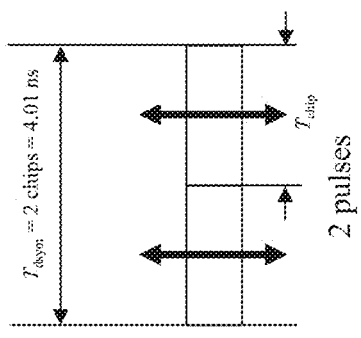
FIG. 31A-FIG. 31G are diagrams showing various data rates using BPSK modulation, according to an example implementation of the present disclosure.
Figure 31B:
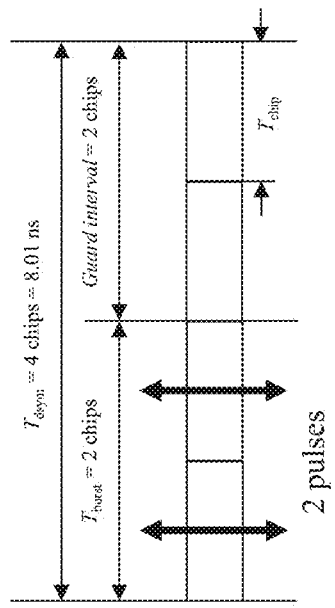
Figure 31C:
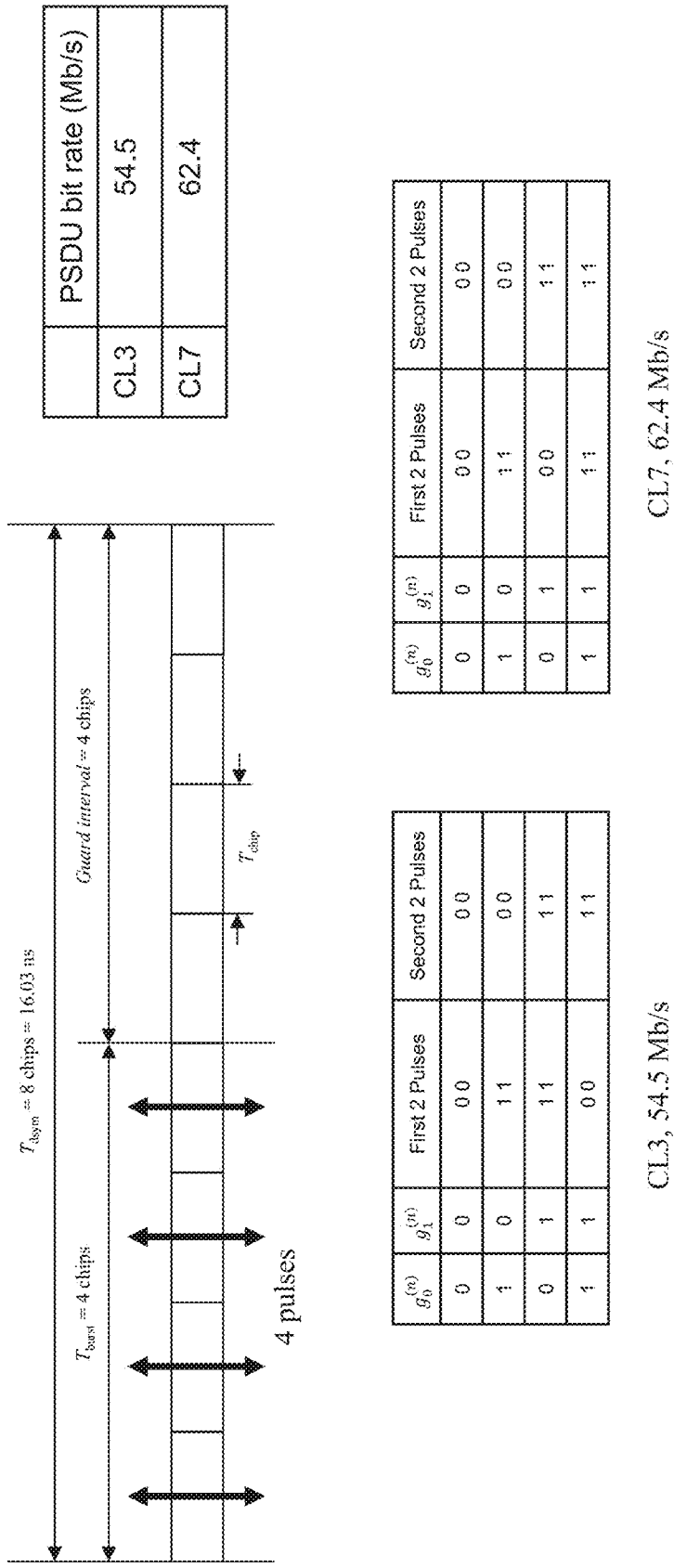
Figure 31D:
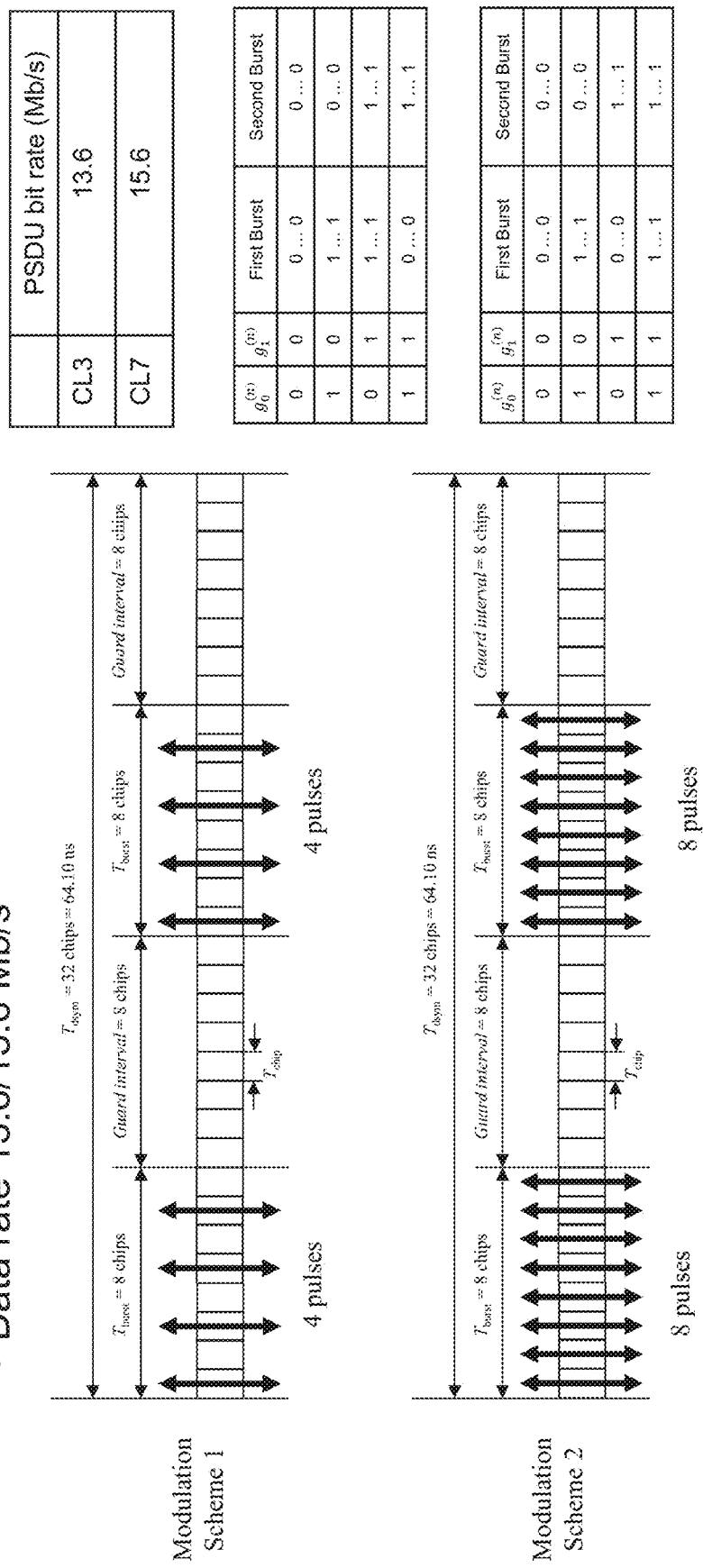
Figure 31E:
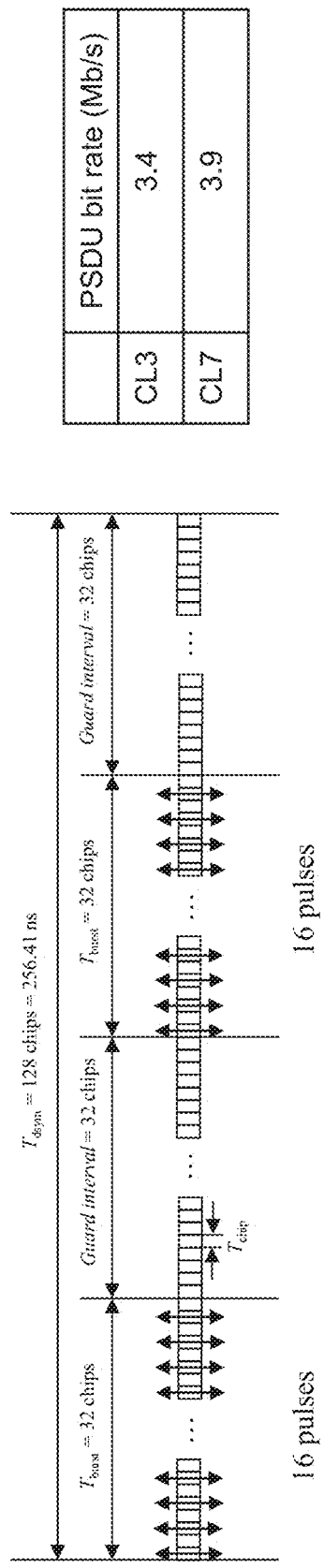
Figure 31F:
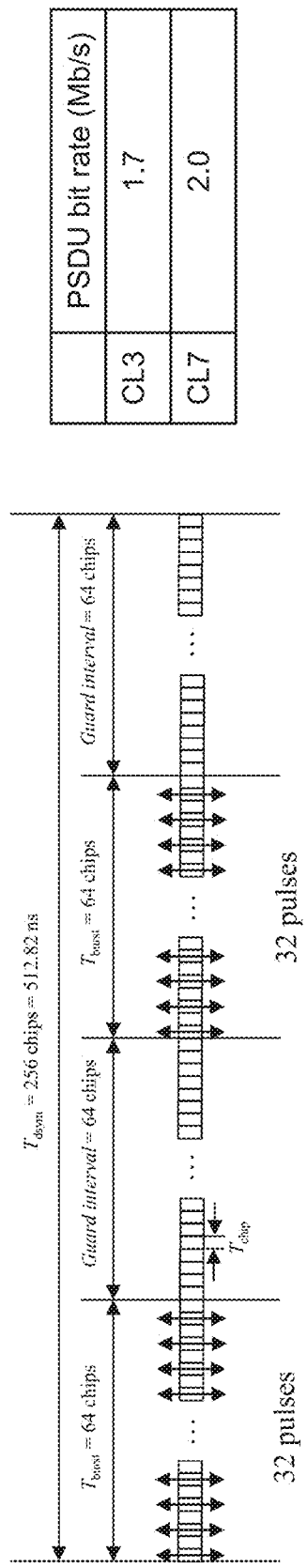
Figure 31G:
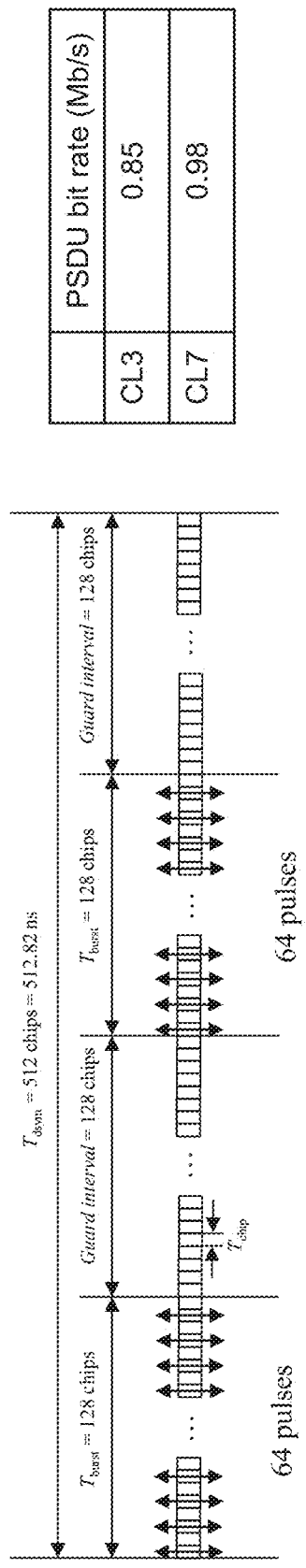
Figure 32A:
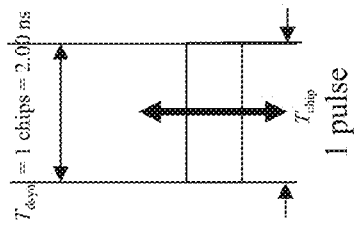
FIG. 32A-FIG. 32J are diagrams showing various data rates using QPSK modulation, according to an example implementation of the present disclosure.
Figure 32B:
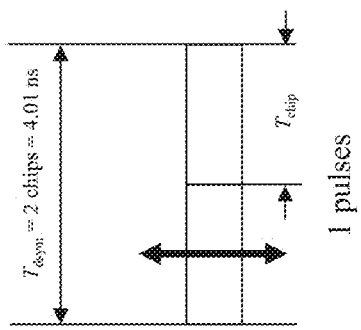
Figure 32C:
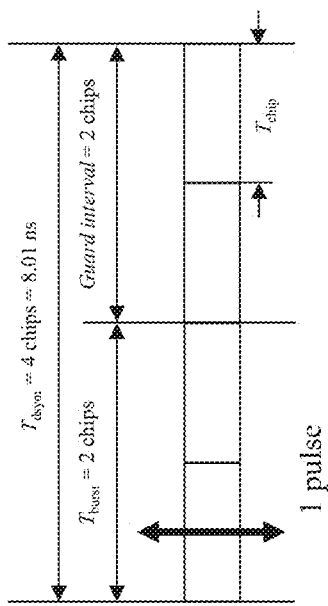
Figure 32D:
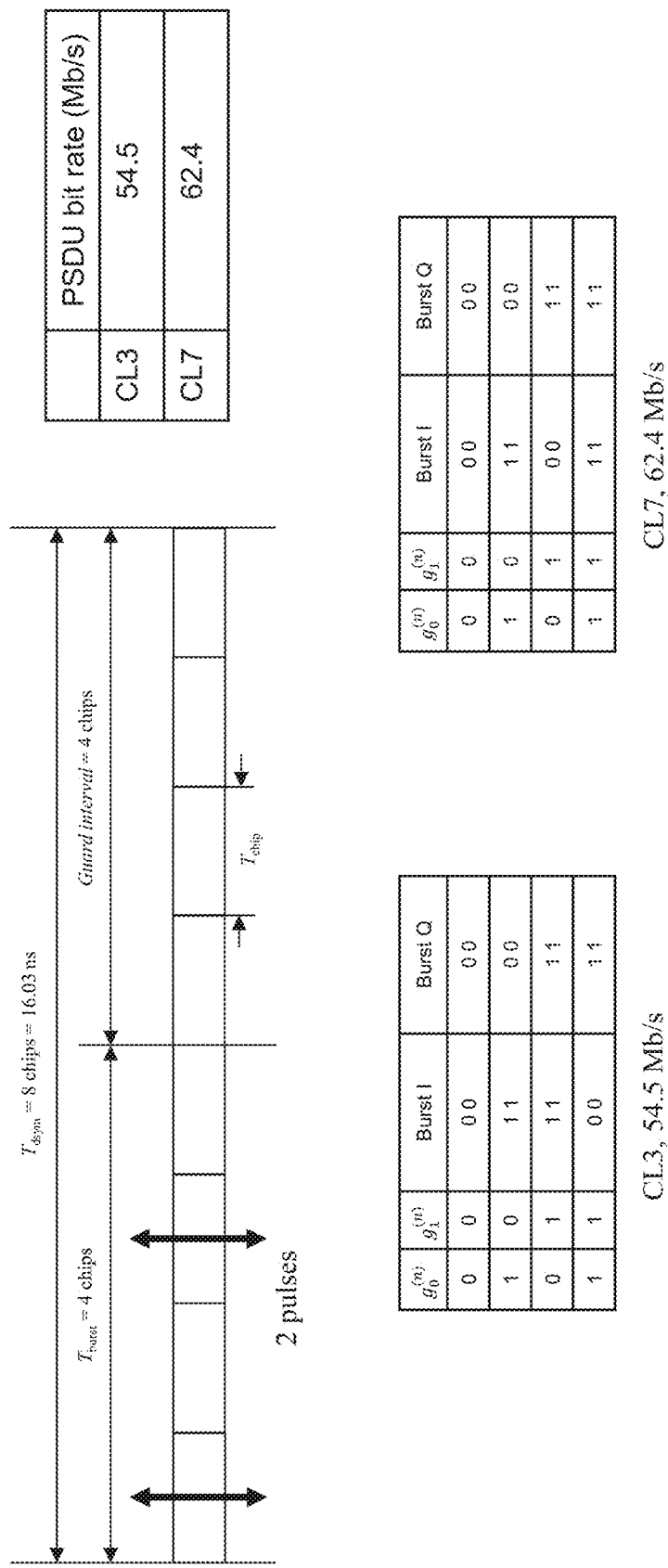
Figure 32E:
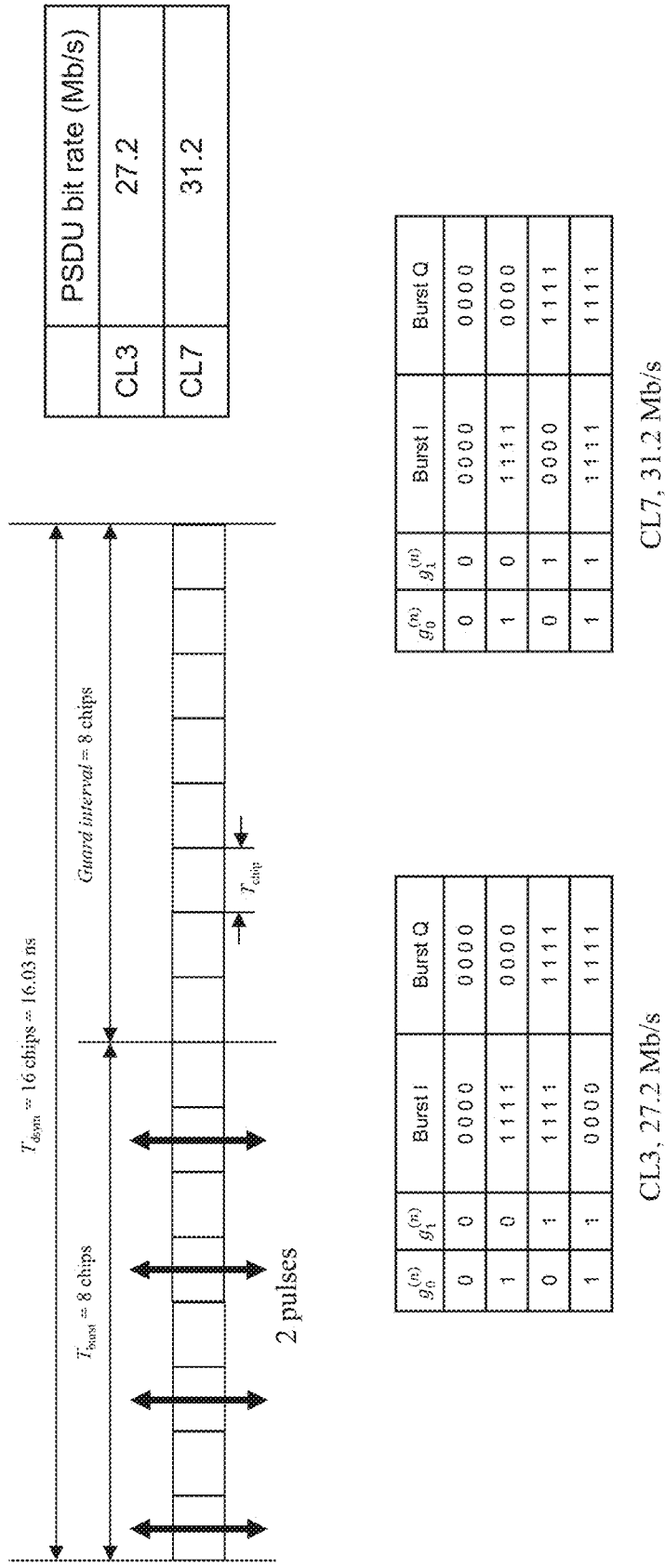
Figure 32F:
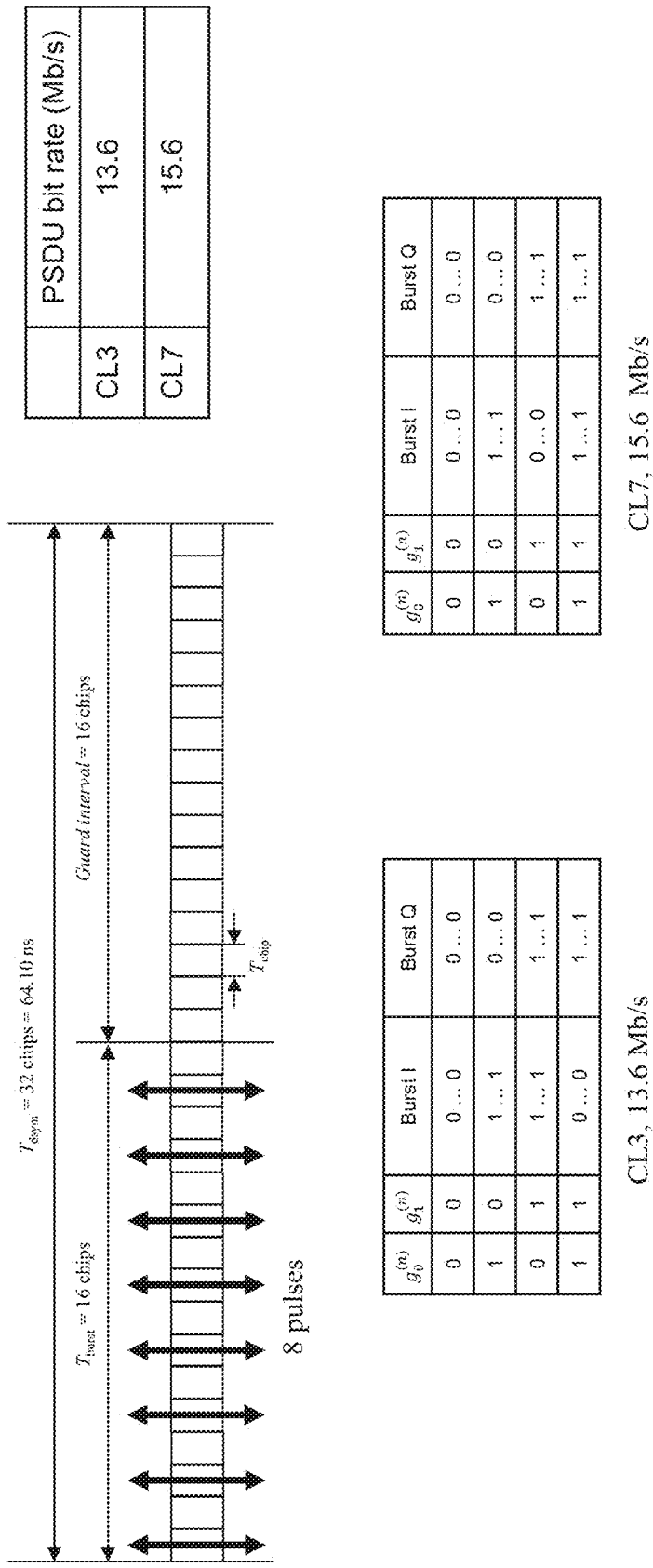
Figure 32G:
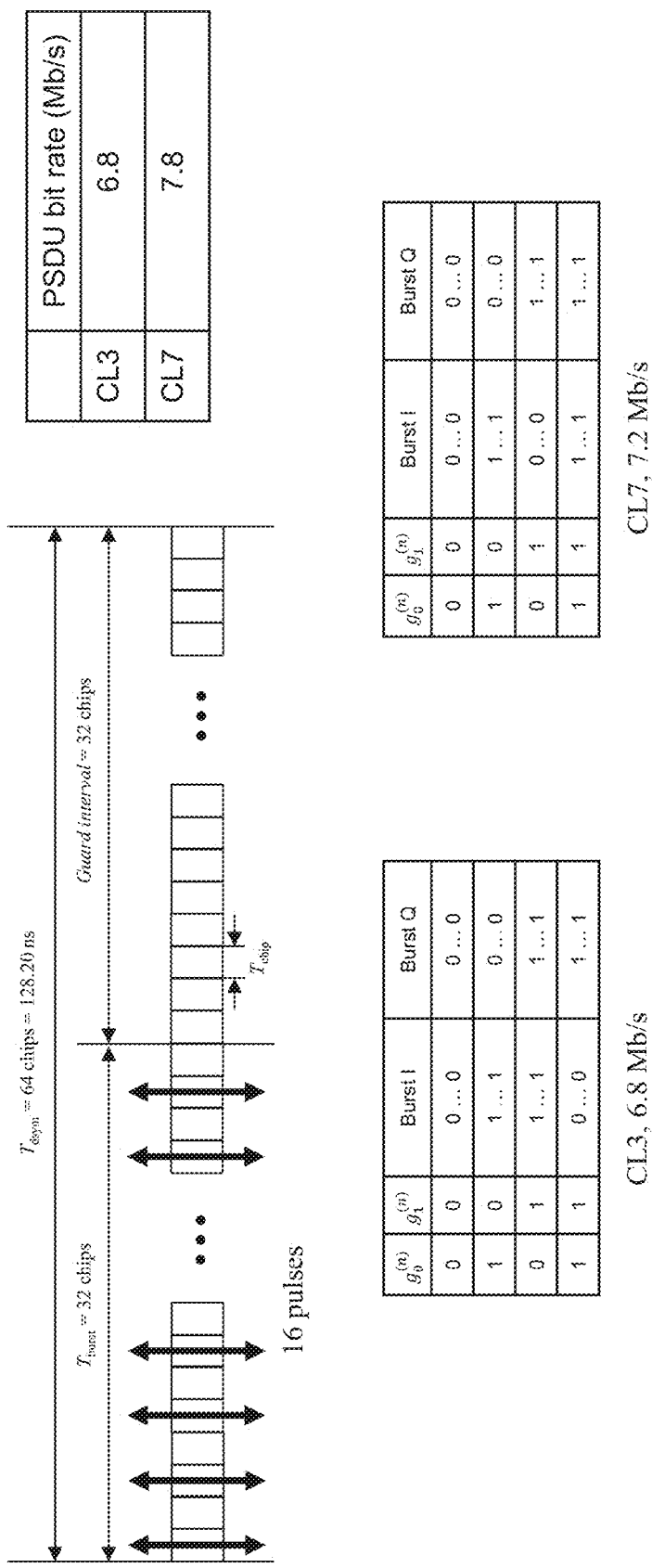
Figure 32H:
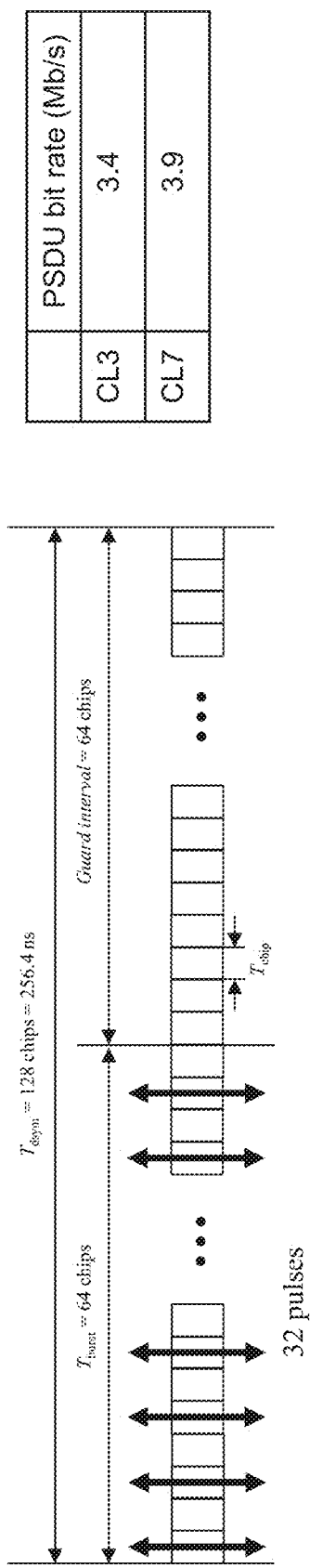
Figure 32I:
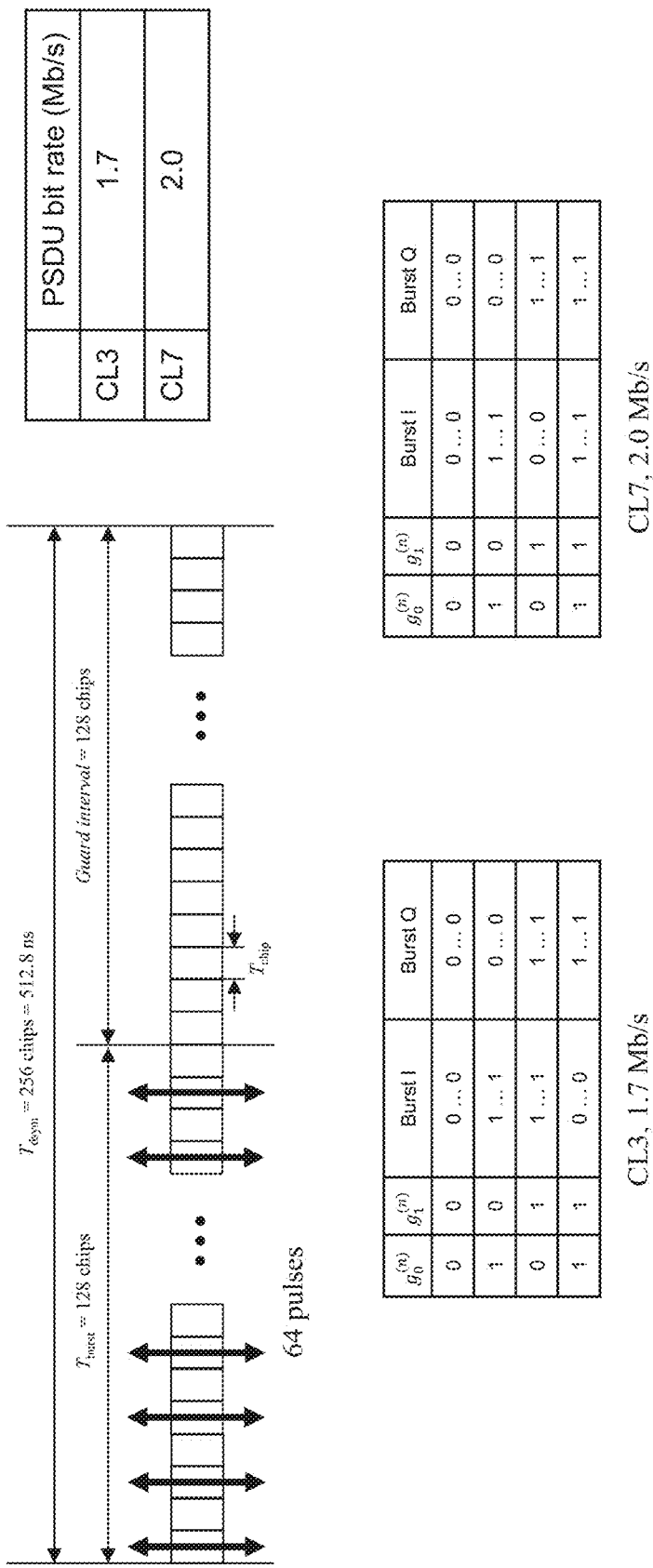
Figure 32J:
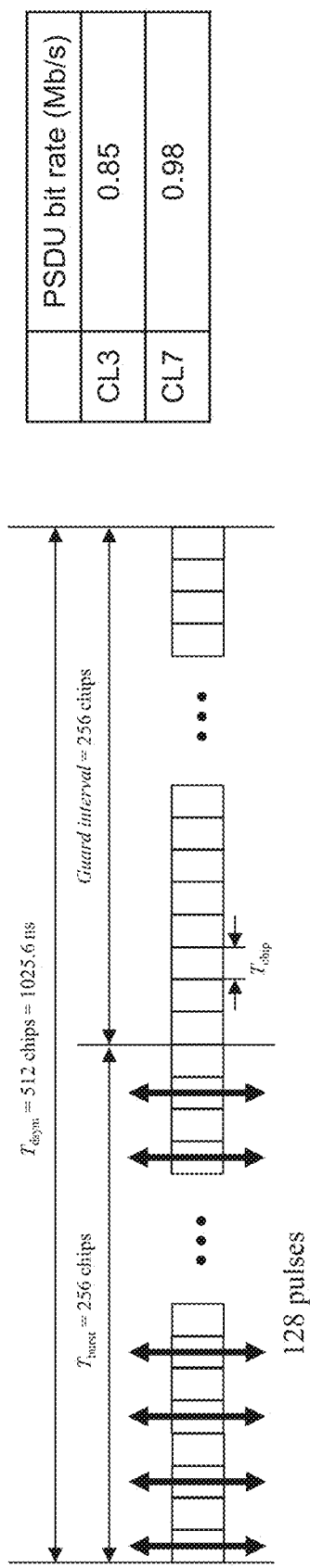

Referring now to FIG. 31A-FIG. 32J, depicted are diagrams showing various data rates using BPSK or QPSK enabled or not. As yet another example, and as shown in FIG. 31A and FIG. 32B, a device may encode data using BPSK modulation, QPSK modulation, or some other modulation/encoding scheme to provide data transmission rates of 217.9 or 249.6 Mbps. In this example, the data frame may include two signal pulses with no guard intervals, resulting in a data transmission rate of 217.9, or 249.6 Mbps. Referring specifically to FIG. 32A, a device may encode data using QPSK modulation to provide data transmission rates of 435.8 Mbps or 499.2 Mbps by generating a data frame which includes one pulse and no guard interval. While these examples are provided, it is noted that other data rates (such as those shown in FIG. 31A-FIG. 32J) may be achieved by modifying the number of signal pulses and guard intervals.

Figure 24:
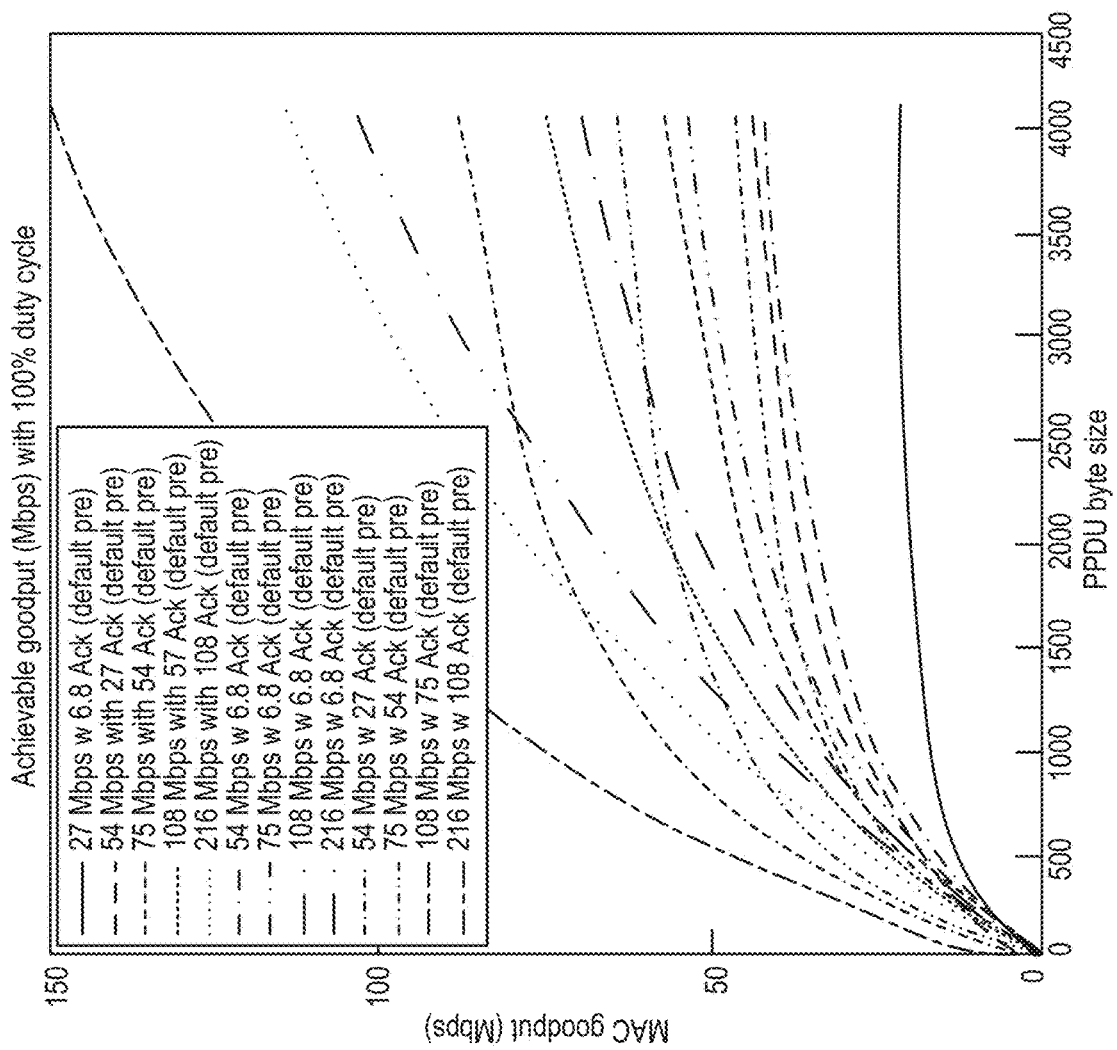
FIG. 24 is a diagram showing a data goodput, according to an example implementation of the present disclosure.

Referring now to FIG. 24, depicted is a diagram showing a data goodput. Goodput, as described herein, refers to a number of useful information bits (e.g., bits other than protocol overhead bits or retransmitted bits/packets) delivered per unit of time. As shown in FIG. 24, the data goodput may change based on an acknowledgement (ACK). In some implementations, an ACK may be an acknowledgement of data which is received correctly. The ACK may be sent at a very low rate to ensure robustness of the ACK. However, due to the weight that 6.8 megabits per second is constructed, an ACK may be sent over 200-300 microseconds, simply to send one bit of information. According to the implementations and embodiments described herein, assuming a system is operating on 260 Mbps, the systems and methods described herein may use a 108 megabits per second transmission for the ACK. Accordingly, by using a higher data rate for an ACK, the systems and methods described herein may provide for an overall higher goodput in comparison to other data rates for ACKs. For example, assuming a packet is sent at a high rate (e.g., 260 Mbps), and an ACK is sent at a lower data rate, the overall goodput may be lower, because the amount of time for the data to be sent and acknowledged takes a longer duration. However, where a packet is sent at the higher rate and the ACK is sent at a higher data rate, the overall goodput may be higher because the amount of time for the data to be sent and acknowledged takes a shorter duration (since ACK occurs faster overall at the higher data rate).

Figure 25:
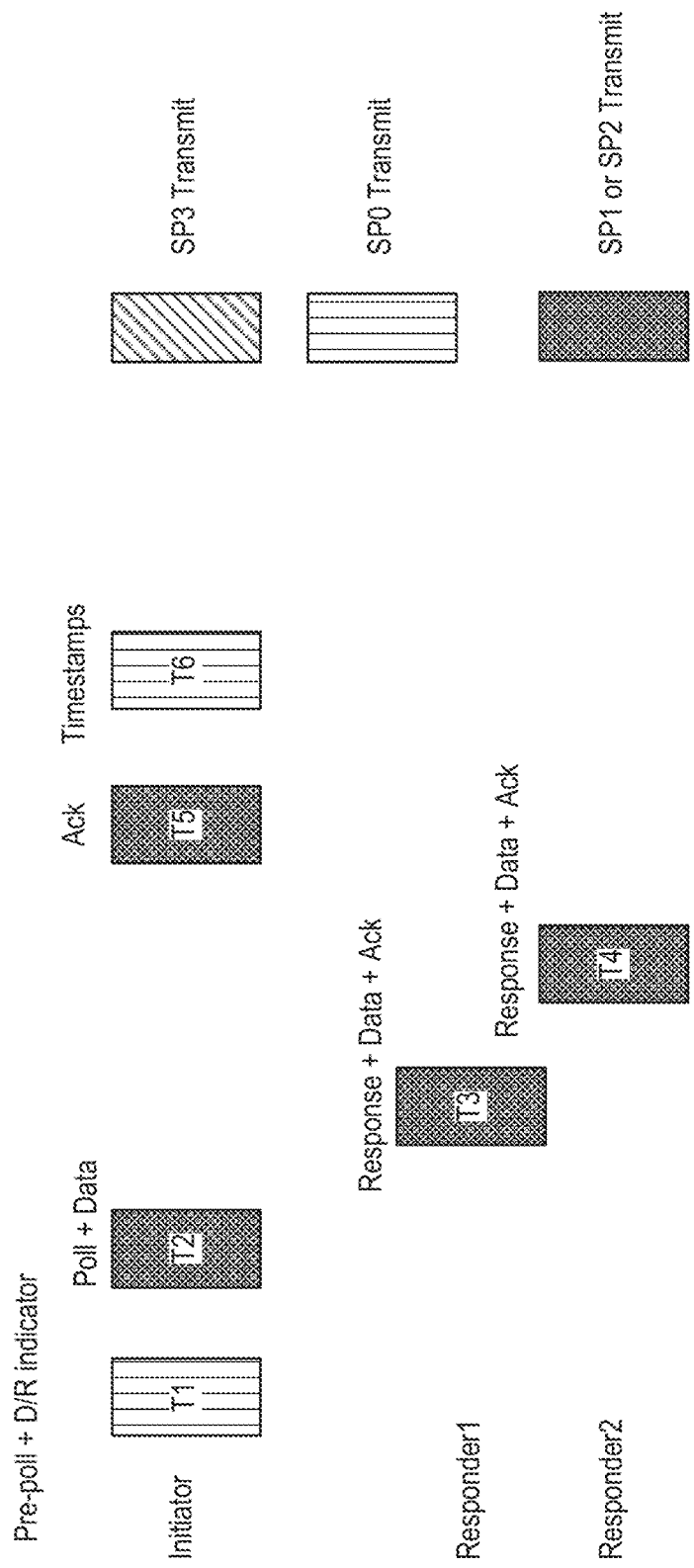
FIG. 25 is a diagram showing incorporation of data and acknowledgements into frames sent between an initiator and responder(s), according to an example implementation of the present disclosure.

Referring now to FIG. 25 in conjunction with FIG. 15, in some embodiments, the systems and methods described herein may incorporate data and acknowledgements into frames sent between the initiator and responder. For example, following the pre-poll at T1, the initiator may send a poll including data at T2. The first responder may respond with a response to the poll along with data from the first responder and acknowledgement of the T2 data (e.g., at T3). Similarly, the second responder may respond with a response to the poll along with data from the second responder and acknowledgement of the T2 data (e.g., at T4). The initiator may transmit an ACK to the first and second responders at T5, followed with timestamps at T6. Such implementations and embodiments can provide for data transmission within frames sent between the initiator and responder(s). The systems and methods described herein may incorporate data into the polls/responses by changing the packets from SP0/SP3 packets to either SP1 or SP2 transmit packets, which allow for data to be incorporated therein.

Figure 26:
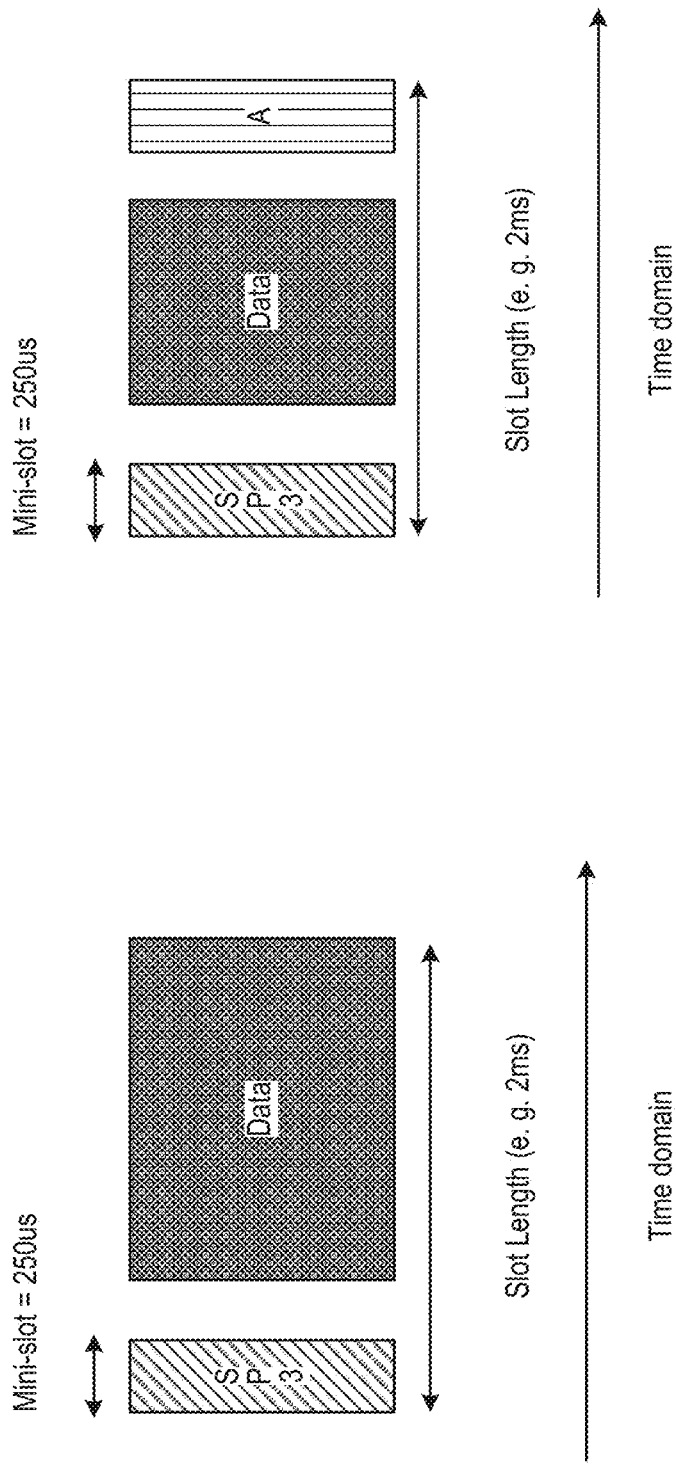
FIG. 26 is a diagram in which the initiator may provide for delayed acknowledgements of data from a responder, according to an example implementation of the present disclosure.
Figure 27:
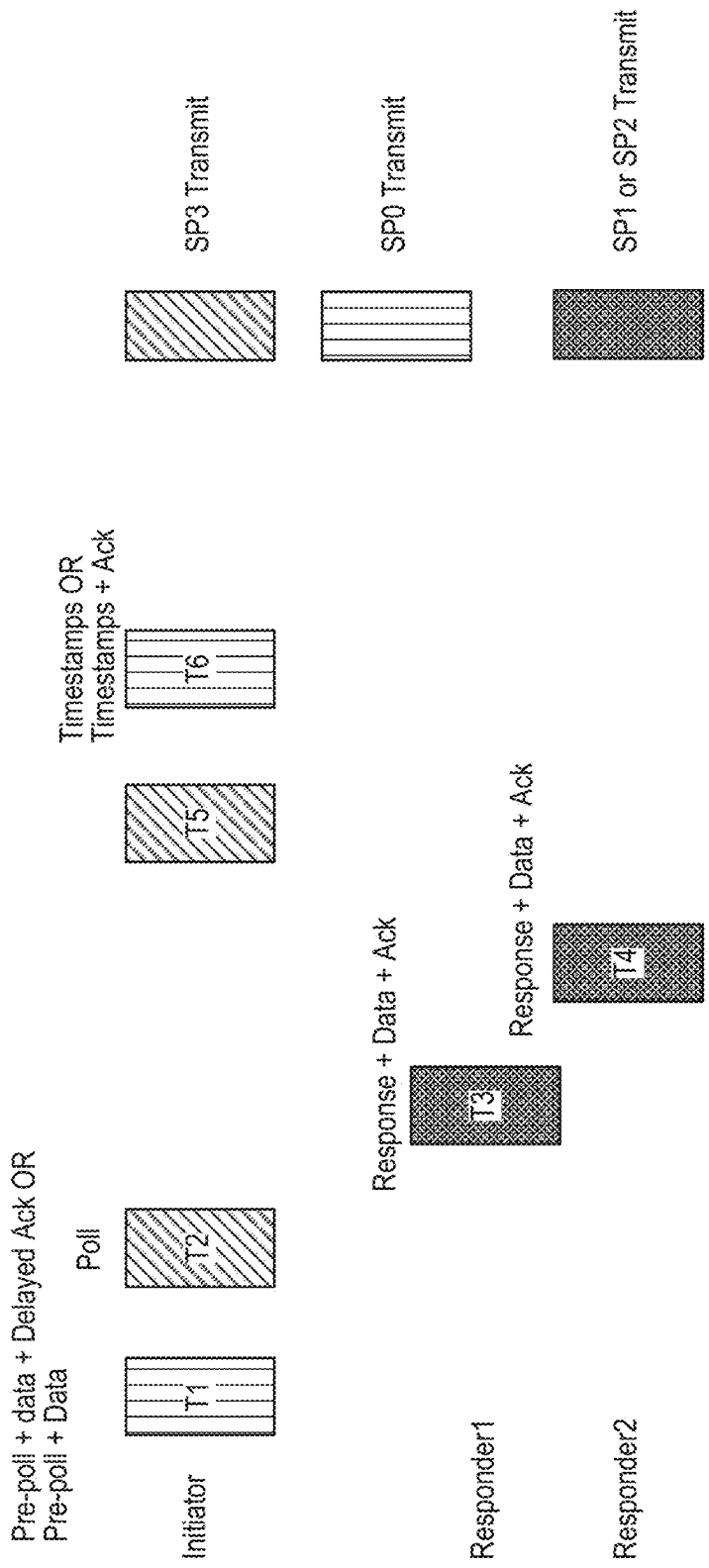
FIG. 27 is a diagram showing a slot in which data and acknowledgements may be transmitted within the slot, according to an example implementation of the present disclosure.
Figure 28:
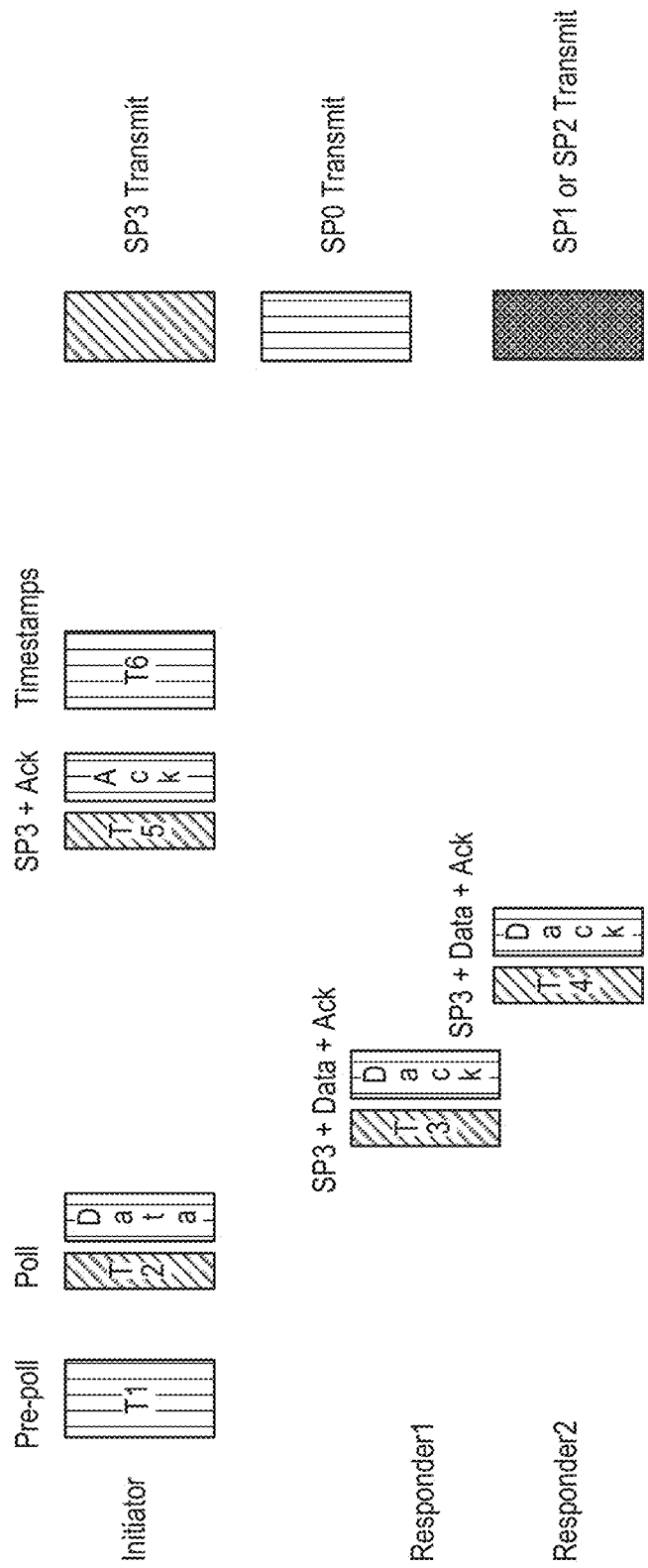
FIG. 28 is a diagram in which initiators and responders may include data packets within slots, according to an example implementation of the present disclosure.

Referring now to FIG. 26 through FIG. 28, the systems and methods described herein may be configured to perform wireless transmissions to communicate data in slots within rounds. Specifically, as described above with reference to FIG. 6, FIG. 7, and FIG. 13, each of the rounds of the transmission block may include a plurality of slots in which wireless transmissions or wireless communications are performed (e.g., to perform ranging or ranging operations and/or to communicate data as described herein). In some embodiments, the systems and methods described herein may be configured to perform ranging and communicate data within the same slot or in different slots. For instance, a device may be configured to perform ranging within a first slot and to communicate data in a second slot. As another example, a device may be configured to perform ranging and communicate data within the same slot.

Referring to FIG. 26, depicted is a diagram in which the initiator may provide for delayed ACKs (acknowledgements) of data from a responder. As shown in FIG. 26, the initiator may provide for an ACK at T1 (referred to as a delayed ACK). The delayed ACK may be an acknowledgement of a data from a previous range between the initiator and responder. In this example, the initiator may incorporate both a delayed ACK and data within the T1 frame, which is sent to the first and second responder. The first and second responders may respond as described above. Also in this example, the initiator may transmit another ACK (e.g., of the data sent by the responders at T3 and T4) at T6 with the timestamps.

Referring to FIG. 27, depicted is a diagram showing a slot in which data and acknowledgements may be transmitted within the slot. For example, a first slot may include an SP3 frame accompanied with data. The first slot may be sent by the initiator (described above with reference to FIG. 25). A second slot may also include an SP3 frame, data, and an acknowledgement to the first slot. The second slot may be sent by one of the responders (e.g., described above with reference to FIG. 25). Such implementations and embodiments can provide for shared data between the initiator and responders within slots of frames sent between the devices.

Referring specifically to FIG. 28, depicted is a diagram in which the initiators and responders may include data packets within slots. For example, the systems and methods described herein may incorporate the slots shown in FIG. 27 into the frames shown in FIG. 25-26. In this example, in a slot in which the initiator sends the poll at T2, the slot may include the poll and data. The responders may send a response at T3 and T4, which is accompanied with a "dack" or data and an acknowledgement of the data sent at T2. Rather than incorporating the data into a single frame, the systems and methods described herein may generate additional frames which include the data and acknowledgements, and the response. Additionally, the initiator may be configured to send a group acknowledgement to each of the responders, where one bit may be allocated to each responder for instance. Such implementations and embodiments may provide data flow sent between imitators and responders without affecting any original ranging flows between devices.

Referring generally to FIG. 26 and FIG. 28, in each slot, a respective device may be configured to perform a plurality of wireless communications. As such, each slot may include a plurality of sub-slots (also referred to herein as "mini-slot" or "mini-slots"). For instance, as shown in FIG. 26, a particular slot may include a plurality of sub-slots. Where the slot has a slot length of, for instance, 2 ms, the slot may be divided into 8 sub-slots (e.g., of 250 us each). However, a slot may be divided into any number of sub-slots. In some embodiments, the beacon frame may define one or more slots or one or more sub-slots in which a device is to perform wireless communications. For example, the beacon frame may define first sub-slots of a slot to perform wireless communications for performing ranging, and second sub-slots of the same slot to perform wireless communications for communicating data. The device may be configured to perform ranging within the first sub-slots and communicate data within the second sub-slots. As another example, and in some embodiments, devices within the environment may negotiate the slots and sub-slots, or even rounds of a transmission block, in which the devices are to perform wireless communications. The devices may negotiate the rounds, slots, and/or sub-slots in which specific devices are to perform wireless communications as part of pairing or handshake negotiation.

Figure 29:
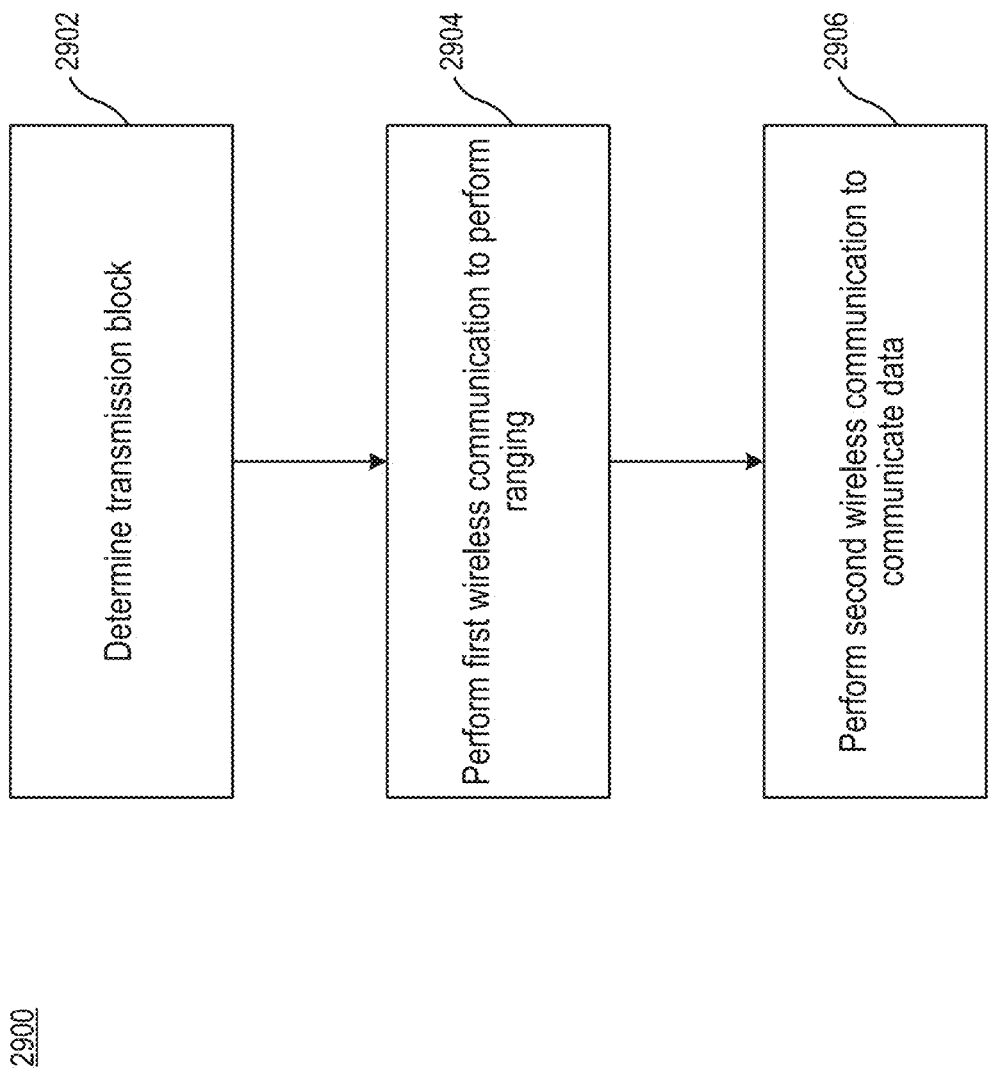
FIG. 29 is a flowchart showing a method of performing ranging and communicating data between two or more UWB devices, according to an example implementation of the present disclosure.

Referring now to FIG. 29, depicted is a flowchart showing a method 2900 of performing ranging and communicating data between two or more UWB devices, according to an illustrative embodiment. The method 2900 may be performed by the devices described above with respect to FIG. 1-FIG. 28. For example, the method 2900 may be performed by one or more of the UWB devices or antennas 308 described above with reference to FIG. 3. As another example, the method 2900 may be performed by one or more of the devices 302, 304 described above with reference to FIG. 3. As such, the UWB device described herein may include a UWB antenna and accompanying components (such as processing components), and/or a device which includes one or more UWB antenna. As a brief overview, at step 2902, a UWB device may determine a transmission block. At step 2904, the UWB device may perform a first wireless communication to perform ranging. At step 2906, the UWB device may perform a second wireless communication to communicate data.

At step 2902, a UWB device may determine a transmission block. In some embodiments, the UWB device may be a first UWB device. The UWB device may determine a transmission block comprising a plurality of rounds each representing a period of time. The transmission block may be similar to the transmission block described above with reference to FIG. 6 and/or FIG. 17. In some embodiments, the UWB device may for example determine the transmission block responsive to negotiation with another UWB device within the environment. The UWB devices may negotiate as part of handshaking, establishing a connection or channel, and so forth. The UWB devices may establish the transmission block for each device to communicate within the environment. In some embodiments, the UWB device may receive a beacon, or a beacon frame/signal which includes the beacon. The beacon frame may include (or alternatively be) a configuration (or a configuration message), which is broadcast, unicast or transmitted to at least one UWB devices. The UWB device may receive the frame using a protocol other than a UWB protocol. For example, the UWB device may receive the frame using a WiFi protocol, a Bluetooth protocol, an NFC protocol, or some other protocol which is different from the UWB protocol. In some embodiments, the UWB device may receive the frame outside of the UWB spectrum (e.g., on a frequency or channel which is outside of the UWB spectrum). In some embodiments, the UWB device may receive the frame on a frequency or channel which overlaps or at least partially overlaps the UWB spectrum. In some embodiments, the UWB device may receive the frame using the UWB protocol. As such, the UWB device may receive the frame either using the UWB protocol or using a different protocol. The UWB device may parse, inspect, or otherwise analyze the frame to identify one or more settings or configurations for the transmission block. The UWB device may be configured to synchronize operations of the UWB device according to the beacon.

In some embodiments, the transmission block may include or be configured with a plurality of rounds. For instance, the transmission block may be similar to the transmission block described above with reference to FIG. 6 and/or FIG. 17. Each round of the transmission block may include a plurality of slots. The plurality of slots may be or include equally-defined durations of a respective round of the transmission block. For instance, where a round is 8 ms, the round may include four slots, each of which is 2 ms. The slots may be similar in some aspects to the slots shown in FIG. 7, FIG. 13-FIG. 15, and FIG. 25-FIG. 26 and described above. Additionally, and in some embodiments, each slot may include a plurality of mini-slots or sub-slots. Similar to the relationship between a round and a plurality of slots, the mini-slots or sub-slots may be or include equally-defined durations of a respective slots. The transmission block may be configured or negotiated to provide for each of the devices in the environment to perform scheduled wireless communications within a respective round, slot, and/or mini-slot. For example, each of the devices which receive the transmission block may synchronize operations to perform wireless communications and other operations according to the transmission block.

At step 2904, the UWB device may perform a first wireless communication to perform ranging. In some embodiments, the UWB device may perform a first wireless communication to perform ranging between the UWB device and a second UWB device within a first round of the plurality of rounds of the transmission block. The UWB device may perform the first wireless communication responsive to determining that the UWB device is scheduled to perform the first wireless communication. The UWB device may determine that the UWB device is scheduled to perform the first wireless communication based on the transmission block. As described above, the UWB device may be scheduled to perform wireless communications at predetermined or negotiated intervals according to the transmission block. The UWB device may determine (e.g., using various clock signals or other signals of the UWB device) that the UWB device is scheduled to perform the first wireless communication. The UWB device may perform the first wireless communication to perform ranging between the UWB device and the second UWB device. The UWB device may perform ranging between the UWB device and the second UWB device as described above with reference to FIG. 1-FIG. 3 for example.

At step 2906, the UWB device may perform a second wireless communication to communicate data. The UWB device may perform the second wireless communication to communicate data (e.g., transmit and/or receive data) between the UWB device and the second UWB device (e.g., in which the device performed ranging at step 2604). In some embodiments, the UWB device may perform the second wireless communication to communicate data within the first round (e.g., within the same round as the UWB device performed the first wireless communication). For example, the UWB device may be configured to perform the first wireless communication to perform ranging in a one slot (or one sub-slot) of the first round (e.g., at step 2604) and perform the second wireless communication to convey/communicate data in another slot (or another sub-slot) of the first round. In some embodiments, the UWB device may perform one or more ranging operations within a first slot (e.g., a ranging slot), and one or more wireless communications to communicate data within a second slot (e.g., the data slot). By performing the first wireless communication and the second wireless communication within the same round, the UWB device may be inactive (e.g., enter sleep/low-power mode) in rounds outside of the round in which the first and second wireless communication was performed. Such implementations and embodiments may reduce power consumption (e.g., save or conserve power) for the UWB device. The UWB device may be configured to perform the second wireless communication responsive to determining that the UWB device is scheduled to perform the second wireless communication (similar to the UWB device determining that the UWB device is scheduled to perform the first wireless communication). The UWB device may be configured to perform the second wireless communication to communicate data between the UWB device and the second UWB device. The UWB device may perform the second wireless communication within the UWB spectrum. The UWB device may perform the second wireless communication according to the UWB protocol.

In some embodiments, the UWB device may perform the second wireless communication to communicate data within a second round (e.g., different from the round in which the UWB device performed the first wireless communication for ranging). In some embodiments, the UWB device may perform wireless communications for communicating data within dedicated 'data communication' rounds, and perform wireless communications for performing ranging within dedicated ranging rounds. In some embodiments, the UWB device may perform multiple ranging operations within the first round (e.g., the ranging round), and multiple wireless communications to communicate data within the second round (e.g., the data round).

In some embodiments, the UWB device may perform a plurality of operations to perform ranging and perform a plurality of operations to communicate data. In some embodiments, the UWB device may perform each of the plurality of operations within a single round (e.g., within respective slots of a round). In some embodiments, the UWB device may perform a plurality of operations to perform ranging within a first round (e.g., a ranging round) and a plurality of operations to communicate data in a second round (e.g., a data round). The UWB device may perform the operations according to the transmission block (and its rounds, slots and/or sub-slots) determined/defined at step 2902. In some embodiments, the UWB device may perform the operations within respective slots of the respective rounds. For instance, the UWB device may perform a plurality of ranging operations (e.g., wireless communications to perform ranging) within one slot (or more than one slot) and perform a plurality of data communication operations (e.g., wireless communications to communicate data) within another slot (or more than one slot) which is separate from the slot(s) in which the UWB device performs ranging operations. As yet another example, the UWB device may perform a plurality of ranging operations across a plurality of sub-slots of a slot (e.g., one ranging operation in one sub-slot and another ranging operation in another sub-slot. Similarly, the UWB device may perform a plurality of data communications across a plurality of sub-slots of a slot (e.g., one data communication operation in one sub-slot and another data communication operation in another sub-slot).

In some embodiments, when the UWB device performs the second wireless communication (e.g., at step 2906), the UWB device may perform the second wireless communication at a data rate within a range of 100 Mbps to 250 Mbps. For example, the UWB device may perform the second wireless communication at a data rate by decreasing a number of guard intervals and/or decreasing a number of repeat transmissions as described above with reference to FIG. 23A-FIG. 23C. In some embodiments, the UWB device may perform the second wireless communication to communicate data at a data rate of 109 Mbps with a guard interval. In some embodiments, the UWB device may perform the second wireless communication to communicate data at a data rate of 217.6 Mbps without a guard interval.

Figure 30:
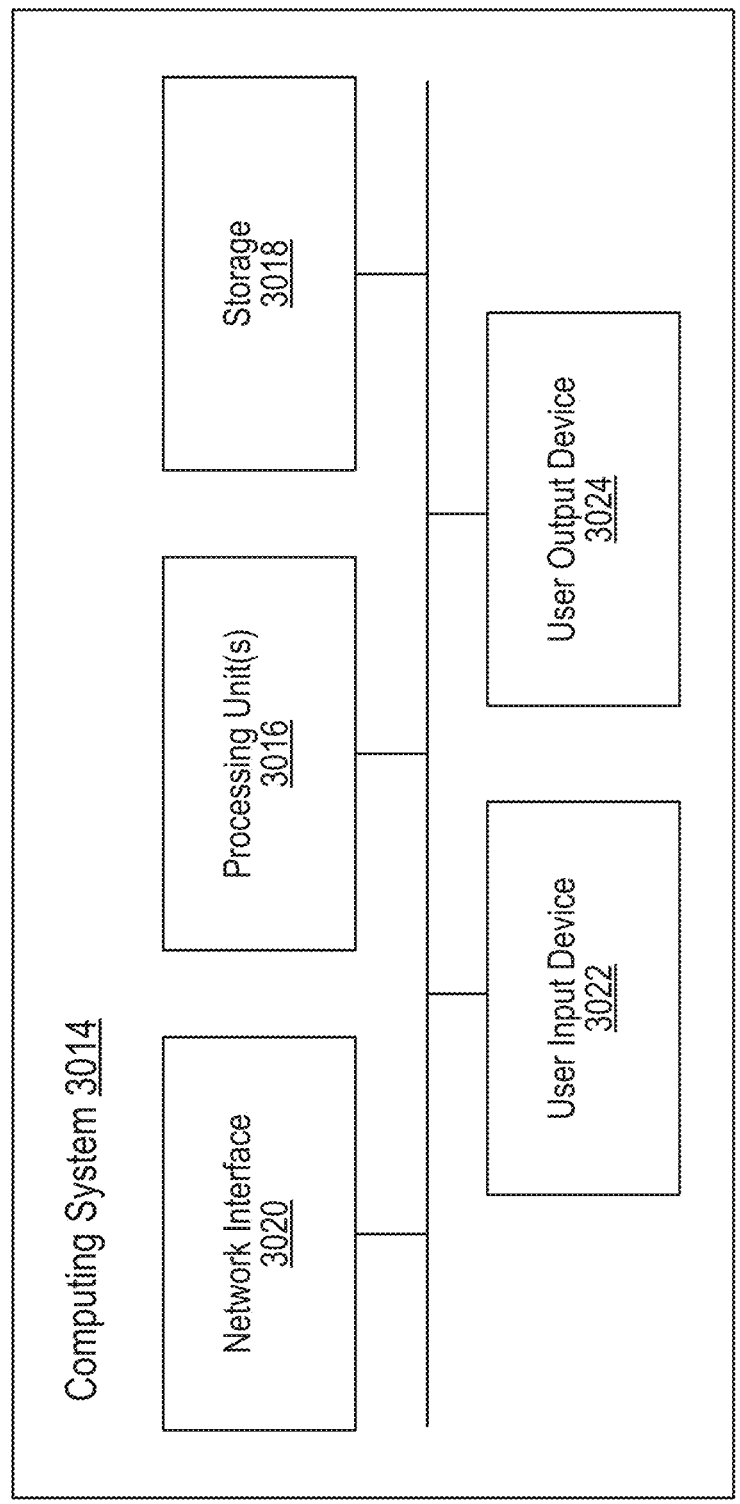
FIG. 30 is a block diagram of a representative computing system, according to an example implementation of the present disclosure.

Various operations described herein can be implemented on computer systems. Referring back to FIG. 30, depicted is a block diagram of a representative computing system 3014 usable to implement the present disclosure. In some embodiments, the computing device 110, the HWD 150, devices 302, 304, or each of the components of FIG. 1-5 are implemented by or may otherwise include one or more components of the computing system 3014. Computing system 3014 can be implemented, for example, as a consumer device such as a smartphone, other mobile phone, tablet computer, wearable computing device (e.g., smart watch, eyeglasses, head wearable display), desktop computer, laptop computer, or implemented with distributed computing devices. The computing system 3014 can be implemented to provide VR, AR, MR experience. In some embodiments, the computing system 3014 can include conventional computer components such as processors 3016, storage device 3018, network interface 3020, user input device 3022, and user output device 3024.

Network interface 3020 can provide a connection to a wide area network (e.g., the Internet) to which WAN interface of a remote server system is also connected. Network interface 3020 can include a wired interface (e.g., Ethernet) and/or a wireless interface implementing various RF data communication standards such as Wi-Fi, Bluetooth, UWB, or cellular data network standards (e.g., 3G, 4G, 5G, 60 GHz, LTE, etc.).

User input device 3022 can include any device (or devices) via which a user can provide signals to computing system 3014; computing system 3014 can interpret the signals as indicative of particular user requests or information. User input device 3022 can include any or all of a keyboard, touch pad, touch screen, mouse or other pointing device, scroll wheel, click wheel, dial, button, switch, keypad, microphone, sensors (e.g., a motion sensor, an eye tracking sensor, etc.), and so on.

User output device 3024 can include any device via which computing system 3014 can provide information to a user. For example, user output device 3024 can include a display to display images generated by or delivered to computing system 3014. The display can incorporate various image generation technologies, e.g., a liquid crystal display (LCD), light-emitting diode (LED) including organic light-emitting diodes (OLED), projection system, cathode ray tube (CRT), or the like, together with supporting electronics (e.g., digital-to-analog or analog-to-digital converters, signal processors, or the like). A device such as a touchscreen that function as both input and output device can be used. Output devices 3024 can be provided in addition to or instead of a display. Examples include indicator lights, speakers, tactile "display" devices, printers, and so on.

Some implementations include electronic components, such as microprocessors, storage and memory that store computer program instructions in a computer readable storage medium (e.g., non-transitory computer readable medium). Many of the features described in this specification can be implemented as processes that are specified as a set of program instructions encoded on a computer readable storage medium. When these program instructions are executed by one or more processors, they cause the processors to perform various operation indicated in the program instructions. Examples of program instructions or computer code include machine code, such as is produced by a compiler, and files including higher-level code that are executed by a computer, an electronic component, or a microprocessor using an interpreter. Through suitable programming, processor 3016 can provide various functionality for computing system 3014, including any of the functionality described herein as being performed by a server or client, or other functionality associated with message management services.

It will be appreciated that computing system 3014 is illustrative and that variations and modifications are possible. Computer systems used in connection with the present disclosure can have other capabilities not specifically described here. Further, while computing system 3014 is described with reference to particular blocks, it is to be understood that these blocks are defined for convenience of description and are not intended to imply a particular physical arrangement of component parts. For instance, different blocks can be located in the same facility, in the same server rack, or on the same motherboard. Further, the blocks need not correspond to physically distinct components. Blocks can be configured to perform various operations, e.g., by programming a processor or providing appropriate control circuitry, and various blocks might or might not be reconfigurable depending on how the initial configuration is obtained. Implementations of the present disclosure can be realized in a variety of apparatus including electronic devices implemented using any combination of circuitry and software.

Figure 33:
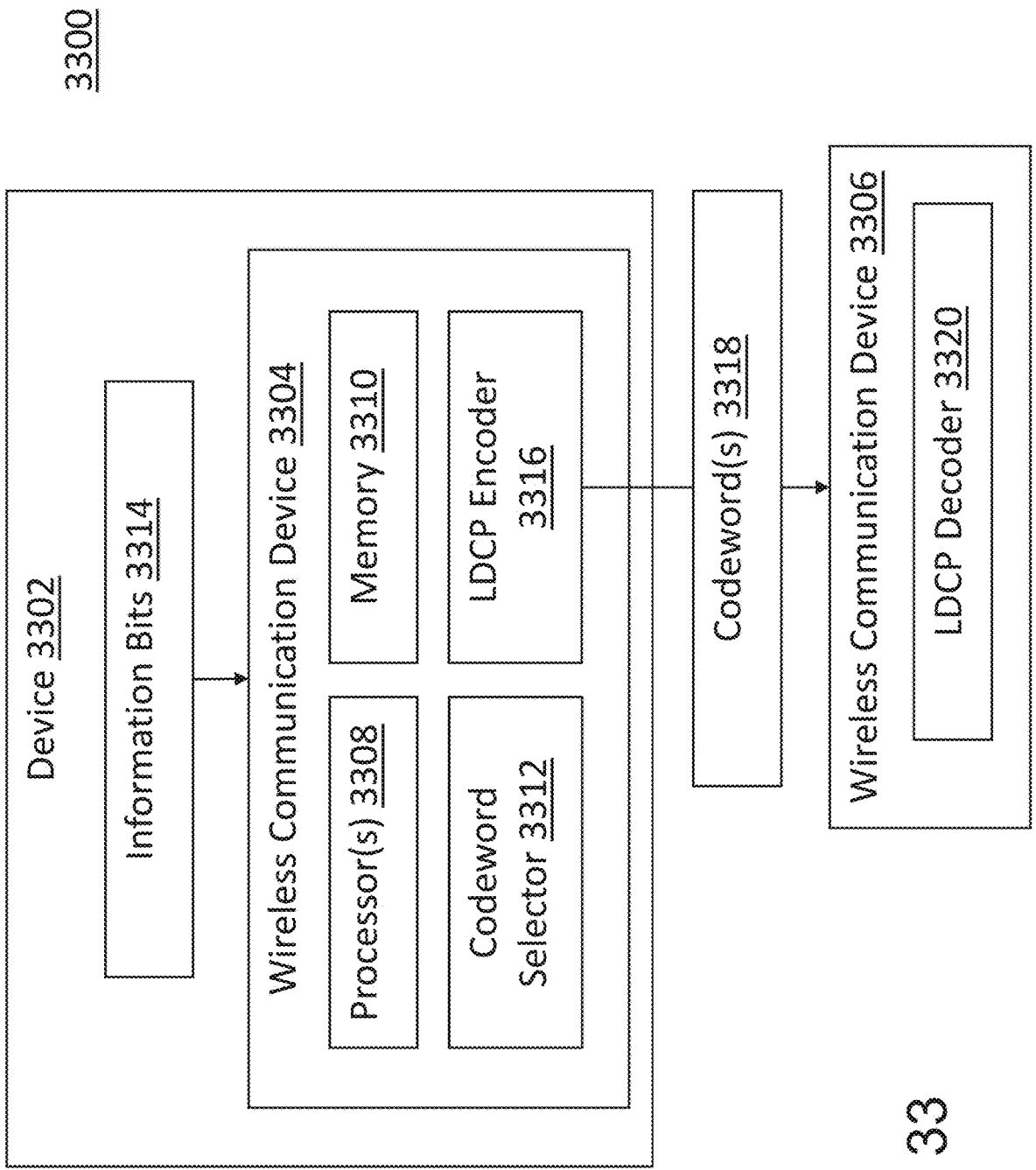
FIG. 33 is a block diagram of a system for low-density parity-check coding, according to an example implementation of the present disclosure.

Referring now to FIG. 33, depicted is a block diagram of a system 3300 for low-density parity-check coding, according to an example implementation of the present disclosure. The system 3300 may include various devices, components, or elements described above with reference to FIG. 1-FIG. 32J. The system 3300 may include a first device 3302 including a wireless communication device 3304. The wireless communication device 3304 may be in communication with a second wireless communication device 3306 (e.g., of a second device). The wireless communication devices 3304, 3306 may be similar in some aspects to the wireless interfaces 115, 165 described above with reference to FIG. 1, the communication device 306 described above with reference to FIG. 3, and/or network interface 3020 described above with reference to FIG. 30. The wireless communication device 3304 may include one or more processors 3308 and memory 3310. The processor(s) 3308 may be similar to the processor(s) 118, 170 described above with reference to FIG. 1 and FIG. 2, and/or the processing unit(s) 3016 described above with reference to FIG. 30. The memory 3310 may be similar to storage 3018 described above with reference to FIG. 30.

As shown in FIG. 33, the device 3302 may include the wireless communication device 3304. In some embodiments, the wireless communication device 3304 may be a transceiver of the device 3302. The device 3302 may be or include any device, such as a computer (e.g., personal computer or laptop), a smartphone, a head-wearable display, or any other device which is configured to generate data for transmission. The wireless communication device 3304 may be configured to encode and transmit the data to another device (such as another device including the second wireless communication device 3306). Similarly, and in various embodiments, the wireless communication device 3304 may be configured to receive data (e.g., codewords 3318) from another wireless communication device (such as the second wireless communication device 3306). The wireless communication device 3304 may be configured to provide the data from the other wireless communication device to the device 3302 for use thereby (e.g., for use by various applications/resources/etc. of the device 3302).

The wireless communication device 3304 may include a codeword selector 3312. The codeword selector 3312 may be or include any device, component, element, or hardware designed or configured to identify, determine, or otherwise select one or more codeword lengths to use for encoding information bits for transmission to an endpoint (such as the wireless communication device 3306). As described in greater detail below, the codeword selector 3312 may be configured to select one or more codeword lengths based on or according to a payload size of a plurality of information bits 3314. The information bits 3314 may be included in a payload of a data packet generated by the device 3302 (e.g., at an application layer of the device 3302 by a program, application, resource, etc.) for transmission to another device (e.g., via the wireless communication device 3304). The wireless communication device 3304 may include a low-density parity-check (LDPC) encoder 3316. The LDPC encoder 3316 may be or include any device, component, element, or hardware designed or configured to encode information bits into one or more codewords 3318 (e.g., LDPC codewords) for decoding by an LDPC decoder 3320 (e.g., of another device, such as the wireless communication device 3306). The LDPC encoder 3316 may be configured to generate codewords 3318 according to the codeword length selected by the codeword selector 3312, as described in greater detail below. The wireless communication device 3304 may be configured to transmit, via one or more transceivers, the codeword(s) 3318 to the wireless communication device 3306. While shown as an LDPC encoder 3316 on one wireless communication device 3304 and an LDCP decoder 3320 on another wireless communication device 3306, it is noted that the wireless communication devices 3304, 3306 may each include respective LDPC encoders and decoders 3316, 3320.

The codeword selector 3312 may be configured to identify, assess, detect, or otherwise determine a number of information bits 3314. In some embodiments, the codeword selector 3312 may be configured to receive a data packet in a queue for transmission to the wireless communication device 3306. For example, as part of executing an application/resource/program/other executable, the device 3302 may generate various data packets for transmission to an endpoint (e.g., the wireless communication device 3306). The device 3302 may send, pass, or otherwise provide the data packets in a queue for transmission to the endpoint. The codeword selector 3312 may be configured to receive or retrieve the data packets from the queue for encoding (e.g., via the LDPC encoder 3316) prior to transmission to the endpoint. The codeword selector 3312 may be configured to determine a count of the number of information bits 3314 included in the payload. While described as the payload of a data packet, it is noted that the information bits 3314 may be included in any other form/format of data units for transmission to an endpoint. The information bits 3312 may be binary bits that carry or otherwise define the data/message which is to be transmitted to the endpoint. The information bits 3312 may represent content or payload which is to be encoded, transmitted, and ultimately decoded (e.g., by the LDCP decoder 3320) to recover the original content/payload.

The codeword selector 3312 may be configured to identify, determine, choose, pick, or otherwise select a codeword length according to the count of the information bits 3314. In some embodiments, the codeword selector 3312 may be configured to select the codeword length by applying the count to one or more thresholds. The codeword selector 3312 may be configured to select the codeword length by applying the count to one or more of the thresholds shown in Table 4 below (with the count shown in bytes, or the count divided by 8).

TABLE 4

Thresholds for Selecting Codeword Lengths

| Information Bits Count (Bytes) | Codeword Length (Bits) |
| --- | --- |
| Count ≤20 Bytes | 648 |
| 20 Bytes < Count ≤ 31 Bytes | 1296 |
| Count >31 Bytes | 1944 |

As shown in Table 4 above, the codeword selector 3312 may be configured to apply the count of the number of information bits 3314 to the thresholds, to select a codeword length. Where the count is less than (or equal to) 20 bytes (or 160 bits), the codeword selector 3312 may be configured to select a codeword length of 648 bits. Where the count is between 20 bytes and 31 bytes (or 248 bits) (including a count of 31 bytes), the codeword selector 3312 may be configured to select a codeword length of 1296 bits. Where the count is greater than 31 bytes, the codeword selector 3312 may be configured to select a codeword length of 1944 bits.

It is noted that these thresholds and codeword lengths are examples of thresholds and codeword lengths. In various embodiments, other thresholds may be used by the codeword selector 3312 for selecting the same (or different) codeword lengths. It is further noted that, while the thresholds are shown as being inclusive (e.g., greater than or equal to), in various embodiments, the thresholds may modified in various ways. For example, the threshold for a codeword length of 648 bits may be less than (but not equal to) 20 bytes, the threshold for a codeword length of 1944 bits may be greater than or equal to 31 bytes, and the thresholds for a codeword length of 1296 bits may be between (and including) 20 bytes up to (but not including) 31 bytes. Various other examples, permutations, and/or combinations of the thresholds may be applied by the codeword selector 3312 for selecting any codeword length.

The codeword selector 3312 may be configured to select or determine a number of parity bits to include in the codeword 3318. The codeword selector 3312 may be configured to determine the number of parity bits based on or according to the count of the information bits. In some embodiments, the codeword selector 3312 may be configured to determine the number of parity bits based on the codeword length and the count of information bits. For instance, the codeword selector 3312 may be configured to determine the number of parity bits as being equal to one half of the codeword length. The codeword 3318 may have a coding rate equal to the count of information bits divided by a sum of the count and the number of parity bits (or half of the codeword length). For example, assuming the count of information bits is 324 bits (thereby resulting in a selected codeword length of 1944 bites), the coding rate may be equal to 324 divided by (324+1944/2 [or 972]), or ¼ coding rate. By providing a coding rate which is less than ½ coding rate (e.g., a one-to-one ratio of parity bits to information bits), the codeword 3318 may be stronger than codewords generated with a ½ coding rate.

Referring now to FIG. 33 together with FIG. 34-35, in some embodiments, the codeword selector 3312 may be configured to select or determine to generate multiple codewords based on or according to the count of information bits. Specifically, FIG. 34 and FIG. 35 show example allocations of information bits to codewords 3318, according to example implementations of the present disclosure. In some embodiments, the codeword selector 3312 may be configured to determine to generate J codewords (where J is the number of codewords) as a function of the count of information bits 3314. The codeword selector 3312 may be configured to determine to generate multiple codewords responsive to the count of the number of information bits exceeding ½ of the 1944 codeword length (e.g., responsive to the count being greater than 972 information bits). The codeword selector 3312 may be configured to compute, identify, select, or otherwise determine the number of codewords J as a function of the count and ½ of the codeword length selected for the number of information bits. For example, the codeword selector 3312 may be configured to determine the number of codewords J to satisfy Equation 1 below:

$$J\left(\frac{N}{2}\right) \geq K; \text{ or } J = \text{ceil}\left(\frac{2K}{N}\right) \qquad \text{Eq. 1}$$

where K is the count of information bits, N is the codeword length, and J is the number of codewords. The codeword selector 3312 may be configured to apply Equation 1 to any codeword length N (e.g., codeword lengths in Table 4 above), to determine a number of codewords to generate.

In some embodiments, the codeword selector 3312 may be configured to determine to generate multiple codewords J (e.g., with smaller codeword length N). For instance, where the codeword selector 3312 determines to generate multiple codewords, the codeword selector 3312 may be configured to determine to generate a greater number of codewords having a smaller codeword length N, rather than fewer codewords having a greater codeword length N. For example, where the number of information bits K is greater than 1944, the codeword selector 3312 may be configured to determine to generate four codewords having a codeword length of 1296, as opposed to three codewords having a codeword length of 1944. While this example is described, it is noted that additional examples/permutations of generating more codewords could be used for various numbers of information bits. Similar to the thresholds described above, the codeword selector 3312 may be configured to access or otherwise use various rules for determining a number of codewords to generate based on or according to the count of information bits.

In some embodiments, the codeword selector 3312 may be configured to apply the count of information bits 3314 to one or more additional thresholds, to determine whether to generate multiple codewords. For example, the codeword selector 3312 may maintain or access a table (similar to the tables shown in FIG. 34 and FIG. 35) for determining a number of codewords to generate for a given count of information bits 3314. The codeword selector 3312 may be configured to perform a look-up using the number of information bits 3314 in the table (e.g., in the first column), to determine the number of codewords 3318 to generate for the number of information bits 3314 (e.g., in the second column).

In some embodiments, the codeword selector 3312 may be configured to allocate, assign, or otherwise set portions of information bits to encode in a given codeword. For example, where each of the information bits 3314 are to be encoded by a single codeword, the codeword selector 3312 may be configured to allocate each of the information bits 3314 to be encoded by the same codeword. Where the information bits 3314 are to be encoded by multiple codewords, the codeword selector 3312 may be configured to allocate respective portions of the information bits 3314 to corresponding codewords. In some embodiments, the codeword selector 3312 may be configured to split, separate, division, or otherwise divide the information bits 3314 into substantially equal portions. For example, where the number of information bits 3314 (K) is divisible by the number of codewords (J) (e.g., $$\frac{K}{J}$$

is a whole number), the codeword selector 3312 may be configured to divide the information bits 3312 into J equal portions. Where the number of information bits 3314 (K) is not divisible by the number of codewords (J) (e.g., $$\frac{K}{J}$$

is not a whole number, or a remainder bit or bits exist) the codeword selector 3312 may be configured to divide the information bits into J substantially equal portions, where a greater number of information bits are distributed to one or more portions than other portions. As such, following the apportioning of the information bits into J substantially equal portions, one or more portions of information bits may have a greater number of bits (e.g., by one) than other portions. The codeword selector 3312 may be configured to allocate the information bits according to one of the tables illustrated in FIG. 34 or FIG. 35. For example, the codeword selector 3312 may be configured to provide or distribute a greater number of information bits across later codeword(s) starting from the last codeword (e.g., as shown in FIG. 34). As another example, the codeword selector 3312 may be configured to provide or distribute a greater number of information bits across initial codeword(s) starting from the first codeword (e.g., as shown in FIG. 35).

The codeword selector 3312 may be configured to provide the portions of bits along with the number of codewords and their respective lengths (e.g., codeword configuration information) to the LDPC encoder 3316. The LDPC encoder 3316 may be configured to generate, create, produce, or otherwise provide one or more codewords 3318 according to the codeword configuration information and portions of the bits. The LDPC encoder 3316 may be configured to encode each respective portion of information bits 3314 into a corresponding codeword 3318. As such, the information bits 3314 may be encoded (e.g., in portions) and thus represented by one or more codewords 3318. The LDPC encoder 3316 may be configured to generate the codewords 3318 by appending a number of parity bits to the portion of information bits 3314 which are assigned (e.g., by the codeword selector 3312) to the codeword 3318. The LDPC encoder 3316 may be configured to encode the information bits 3314 by appending a number of parity bits to the information bits. The number of parity bits may be equal to one half of the codeword length (e.g., 972 parity bits for codewords 3318 having a codeword length of 1944, 648 parity bits for codewords 3318 having a codeword length of 1296, and 324 parity bits for codewords 3318 having a codeword length of 648). In this regard, the number of parity bits appended to the information bits of a given codeword 3318 may be fixed across codewords 3318 generated by the LDPC encoder 3316.

In some embodiments, the LDPC encoder 3316 and/or wireless communication device 3304 may be configured to generate a control frame for signaling to the wireless communication device 3306 the codeword configuration information and/or number of information bits. The control frame may indicate, for example, that LDPC is enabled, a number of codewords, a number of parity bits, a number of information bits, etc. The LDPC encoder 3316 and/or wireless communication device 3304 may be configured to transmit the control frame with the codeword(s) 3318 to the wireless communication device 3306. The LDPC decoder 3320 of the wireless communication device 3306 may be configured to receive the codeword(s) generated by the LDPC encoder 3316. The LDPC decoder 3320 may be configured to decipher, extract, or otherwise decode the codewords 3318, to identify, extract, reconstruct, or otherwise derive the information bits 3314 encoded therein.

Figure 36:
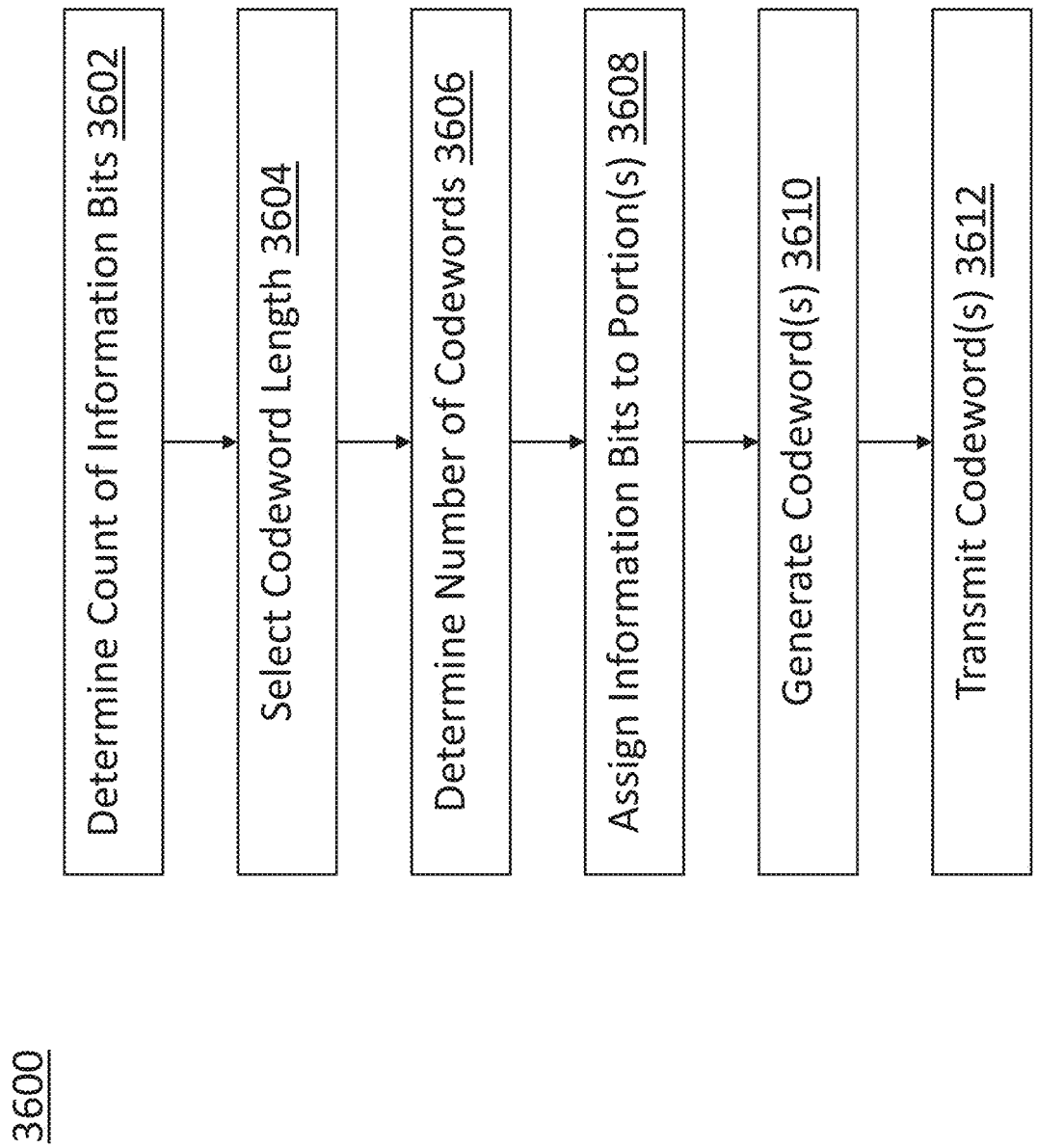
FIG. 36 is a flowchart showing an example method of low-density parity-check coding, according to an example implementation of the present disclosure.

Referring now to FIG. 36, depicted is a flowchart showing an example method 3600 of low-density parity-check (LDPC) coding, according to an example implementation of the present disclosure. The method 3600 may be performed by the devices, components, or elements described above with reference to FIG. 33-35, such as the wireless communication device 3304 (e.g., the codeword selector 3312 and LDPC encoder 3316 of the wireless communication device 3304). As a brief overview, at step 3602, a wireless communication device determines a count of a plurality of information bits. At step 3604, the wireless communication device selects a codeword length. At step 3606, the wireless communication device determines a number of codewords to generate. At step 3608, the wireless communication device assigns the information bits to one or more portions. At step 3610, the wireless communication device generates one or more codewords. At step 3612, the wireless communication device transmits the codeword(s) to another wireless communication device.

At step 3602, a wireless communication device determines a count of a plurality of information bits. In some embodiments, the wireless communication device may determine a count of a plurality of information bits of a data packet (or other data unit) for transmission to another wireless communication device. The wireless communication device may receive the information bits (e.g., the data packet including the information bits) from a queue of a device corresponding to the wireless communication device. The wireless communication device may determine the count of information bits prior to encoding or processing of the information bits (e.g., for transmission).

At step 3604, the wireless communication device selects a codeword length. In some embodiments, the wireless communication device may select the codeword length according to the count (e.g., determined at step 3602). In some embodiments, the wireless communication device may select the codeword length by applying the count to one or more thresholds (and/or ranges). For instance, the wireless communication device may select a first codeword length based on the count satisfying a first threshold (or range, for instance), select a second codeword length based on the count satisfying a second threshold, select a third codeword length based on the count satisfying a first threshold, and so forth. The thresholds and codeword lengths may be or include those provided above in Table 4. For example, the wireless communication device may select a first codeword length (e.g., 648 bits) responsive to the count satisfying a first threshold (e.g., less than, or less than or equal to 160 bits [or 20 bytes]), select a second codeword length (e.g., 1296 bits) responsive to the count satisfying a second threshold (e.g., less than, or less than or equal to 248 bits [or 31 bytes] and greater than, or greater than or equal to 160 bits [or 20 bytes]), and select a third codeword length (e.g., 1944 bits) responsive to the count satisfying a third threshold (e.g., greater than, or greater than or equal to 248 bits [or 31 bytes]). Each of these example codeword lengths and thresholds can be modified, adapted, or otherwise changed according to various example implementations of the present disclosure.

At step 3606, the wireless communication device determines a number of codewords to generate. In some embodiments, the wireless communication device may determine the number of codewords according to the count (e.g., determined at step 3602). In some embodiments, the wireless communication device may determine the number of codewords based on a comparison of the count to half of the codeword length (e.g., determined at step 3604). For example, where the count is less than (or less than or equal to) half the codeword length, the wireless communication device may determine to generate one codeword (e.g., a single codeword). Where the count is greater than (or greater than or equal to) half the codeword length, the wireless communication device may determine to generate multiple codewords (e.g., a plurality of codewords). In some embodiments, the wireless communication device may determine a number of codewords to generate as a function of the count. The wireless communication device may determine the number of codewords to generate based on or according to Equation 1 described above.

In some embodiments, steps 3604 and 3606 may be performed together. For instance, where the wireless communication device determines to generate multiple codewords, the wireless communication device may select a codeword length based on or according to the determination to generate multiple codewords. For example, where the wireless communication device determines to generate multiple codewords responsive to the count being greater than a certain value, the wireless communication device may select a smaller codeword length (e.g., to increase the number of codewords generated) rather than selecting a larger codeword length (e.g., to decrease the number of codewords generated). In this regard, the wireless communication device may determine to generate multiple codewords having a shorter length (e.g., with a greater coding rate), rather than a smaller number of codewords having a greater length (e.g., with a reduced coding rate).

At step 3608, the wireless communication device assigns the information bits to one or more portions. In some embodiments, the wireless communication device may assign the plurality of information bits to substantially equal portions across the number of codewords. For instance, where the wireless communication device determines to generate J number of codewords, the wireless communication device may separate or otherwise assign the K information bits into J substantially equal portions. For example, assuming the wireless communication device determines to generate two codewords for 974 information bits, the wireless communication device may assign the 974 information bits to two equal portions (e.g., one portion including 487 information bits and another portion including 487 information bits). Where the number of information bits is not divisible by the number of codewords (e.g., such that remainder bits are present), the wireless communication device may assign the information bits to substantially equal portions (e.g., increase a number of bits in ending codewords as shown in FIG. 34 and/or increase a number of bits in initial codewords as shown in FIG. 35).

At step 3610, the wireless communication device generates one or more codewords. In some embodiments, a low-density parity-check (LDPC) encoder may generate one or more codewords for the plurality of information bits. The codeword(s) may have the codeword length selected at step 3604. In some embodiments, the wireless communication device may generate codewords for each of the portion(s) of information bits determined at step 3608. In this regard, the wireless communication device may generate a first codeword having one portion of the information bits, another codeword having another portion of the information bits, and so forth, until the wireless communication device has generate codewords which encode each of the plurality of information bits. The codewords may encode substantially equal portions of the information bits. As described above and shown in FIG. 34 and FIG. 35, in some embodiments, some of the codewords may encode a (slightly) greater number of information bits than other codewords (e.g., in instances where the number of information bits is not divisible by the number of codewords).

At step 3612, the wireless communication device transmits the codeword(s) to another wireless communication device. In some embodiments, the wireless communication device may communicate, send, transmit, or otherwise provide the codeword(s) generated at step 3610 to another wireless communication device, for decoding by an LDPC decoder of the other wireless communication device. Where the wireless communication device generates a single codeword, the wireless communication device may transmit the single codeword to the other wireless communication device. Where the wireless communication device generates multiple (or a plurality of) codewords, the wireless communication device may transmit each of the codewords to the wireless communication device. The wireless communication device may transmit the codewords serially (e.g., beginning from the first codeword in series to the N-th codeword). The other wireless communication device may receive the codeword(s), and decipher, extract, or otherwise decode the codewords (e.g., via the LDPC decoder) to obtain, determine, or otherwise derive the information bits encoded therein. Where the wireless communication device transmits multiple codewords, the LDPC decoder may combine, collate, assemble, or otherwise stitch together the portions of information bits to generate the entirety of the plurality of information bits.

Having now described some illustrative implementations, it is apparent that the foregoing is illustrative and not limiting, having been presented by way of example. In particular, although many of the examples presented herein involve specific combinations of method acts or system elements, those acts and those elements can be combined in other ways to accomplish the same objectives. Acts, elements and features discussed in connection with one implementation are not intended to be excluded from a similar role in other implementations or implementations.

The hardware and data processing components used to implement the various processes, operations, illustrative logics, logical blocks, modules and circuits described in connection with the embodiments disclosed herein may be implemented or performed with a general purpose single- or multi-chip processor, a digital signal processor (DSP), an application specific integrated circuit (ASIC), a field programmable gate array (FPGA), or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some embodiments, particular processes and methods may be performed by circuitry that is specific to a given function. The memory (e.g., memory, memory unit, storage device, etc.) may include one or more devices (e.g., RAM, ROM, Flash memory, hard disk storage, etc.) for storing data and/or computer code for completing or facilitating the various processes, layers and modules described in the present disclosure. The memory may be or include volatile memory or non-volatile memory, and may include database components, object code components, script components, or any other type of information structure for supporting the various activities and information structures described in the present disclosure. According to an exemplary embodiment, the memory is communicably connected to the processor via a processing circuit and includes computer code for executing (e.g., by the processing circuit and/or the processor) the one or more processes described herein.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

Any references to implementations or elements or acts of the systems and methods herein referred to in the singular can also embrace implementations including a plurality of these elements, and any references in plural to any implementation or element or act herein can also embrace implementations including only a single element. References in the singular or plural form are not intended to limit the presently disclosed systems or methods, their components, acts, or elements to single or plural configurations. References to any act or element being based on any information, act or element can include implementations where the act or element is based at least in part on any information, act, or element.

Any implementation disclosed herein can be combined with any other implementation or embodiment, and references to "an implementation," "some implementations," "one implementation" or the like are not necessarily mutually exclusive and are intended to indicate that a particular feature, structure, or characteristic described in connection with the implementation can be included in at least one implementation or embodiment. Such terms as used herein are not necessarily all referring to the same implementation. Any implementation can be combined with any other implementation, inclusively or exclusively, in any manner consistent with the aspects and implementations disclosed herein.

Where technical features in the drawings, detailed description or any claim are followed by reference signs, the reference signs have been included to increase the intelligibility of the drawings, detailed description, and claims. Accordingly, neither the reference signs nor their absence have any limiting effect on the scope of any claim elements.

Systems and methods described herein may be embodied in other specific forms without departing from the characteristics thereof. References to "approximately," "about" "substantially" or other terms of degree include variations of +/−10% from the given measurement, unit, or range unless explicitly indicated otherwise. Coupled elements can be electrically, mechanically, or physically coupled with one another directly or with intervening elements. Scope of the systems and methods described herein is thus indicated by the appended claims, rather than the foregoing description, and changes that come within the meaning and range of equivalency of the claims are embraced therein.

The term "coupled" and variations thereof includes the joining of two members directly or indirectly to one another. Such joining may be stationary (e.g., permanent or fixed) or moveable (e.g., removable or releasable). Such joining may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

References to "or" can be construed as inclusive so that any terms described using "or" can indicate any of a single, more than one, and all of the described terms. A reference to "at least one of 'A' and 'B'" can include only 'A', only 'B', as well as both 'A' and 'B'. Such references used in conjunction with "comprising" or other open terminology can include additional items.

Modifications of described elements and acts such as variations in sizes, dimensions, structures, shapes and proportions of the various elements, values of parameters, mounting arrangements, use of materials, colors, orientations can occur without materially departing from the teachings and advantages of the subject matter disclosed herein. For example, elements shown as integrally formed can be constructed of multiple parts or elements, the position of elements can be reversed or otherwise varied, and the nature or number of discrete elements or positions can be altered or varied. Other substitutions, modifications, changes and omissions can also be made in the design, operating conditions and arrangement of the disclosed elements and operations without departing from the scope of the present disclosure.

References herein to the positions of elements (e.g., "top," "bottom," "above," "below") are merely used to describe the orientation of various elements in the FIGURES. The orientation of various elements may differ according to other exemplary embodiments, and that such variations are intended to be encompassed by the present disclosure.

What is claimed is:

1. A method, comprising:
    determining, by a wireless communication device, a count of a plurality of information bits;
    selecting, by the wireless communication device, a codeword length according to the count;
    selecting, by the wireless communication device, a number of codewords as a function of the count;
    assigning, by the wireless communication device, portions of the plurality of information bits to each codeword of the number of codewords, the portions having a substantially equal number of information bits;
    generating, by a low-density parity-check (LDPC) encoder of the wireless communication device, each codeword using the assigned portions of the plurality of information bits, the codewords having the codeword length; and
    transmitting, by the wireless communication device, the codewords to an LDPC decoder of another wireless communication device.

2. The method of claim 1, wherein selecting the codeword length comprises:
    selecting, by the wireless communication device, a first codeword length responsive to the count being less than a first threshold;
    selecting, by the wireless communication device, a second codeword length responsive to the count being greater than a second threshold; or
    selecting, by the wireless communication device, a third codeword length responsive to the count being between the first threshold and the second threshold.

3. The method of claim 2, wherein the first codeword length is 648 bits, the second codeword length is 1944 bits, and the third codeword length is 1296 bits.

4. The method of claim 3, wherein the first threshold is 21 bytes, and the second threshold is 44 bytes.

5. The method of claim 1, wherein generating each codeword comprises:
    generating, by the LDPC encoder, a first codeword having a first portion of the plurality of information bits; and
    generating, by the LDPC encoder, a second codeword having a second portion of the plurality of information bits.

6. The method of claim 1, further comprising setting, for the codeword, a number of parity bits according to the codeword length.

7. A wireless communication device, comprising:
    one or more processors configured to:
        determine a count of a plurality of information bits;
        select a codeword length according to the count;
        select a number of codewords as a function of the count;
        assign portions of the plurality of information bits to each codeword of the number of codewords, the portions having a substantially equal number of information bits;
        generate, by a low-density parity-check (LDPC) encoder of the wireless communication device, each codeword using the assigned portions of the plurality of information bits, the codeword having the codeword length; and
        transmit the codeword to an LDPC decoder of another wireless communication device.

8. The wireless communication device of claim 7, wherein the one or more processors are configured to:
    select a first codeword length responsive to the count being less than a first threshold;
    select a second codeword length responsive to the count being greater than a second threshold; or
    select a third codeword length responsive to the count being between the first threshold and the second threshold.

9. The wireless communication device of claim 8, wherein the first codeword length is 648 bits, the second codeword length is 1944 bits, and the third codeword length is 1296 bits.

10. The wireless communication device of claim 9, wherein the first threshold is 21 bytes, and the second threshold is 44 bytes.

11. The wireless communication device of claim 7, wherein to generate each codeword, the one or more processors are configured to:
    generate, by the LDPC encoder, a first codeword having a first portion of the plurality of information bits; and
    generate, by the LDPC encoder, a second codeword having a second portion of the plurality of information bits.

12. The wireless communication device of claim 7, wherein the one or more processors are configured to set, for the codeword, a number of parity bits according to the codeword length.

13. A non-transitory computer readable medium storing instructions that, when executed by one or more processors, cause the one or more processors to:
    determine a count of a plurality of information bits;
    select a codeword length according to the count;
    select a number of codewords as a function of the count;
    assign portions of the plurality of information bits to each codeword of the number of codewords, the portions having a substantially equal number of information bits;
    generate, by a low-density parity-check (LDPC) encoder of the wireless communication device, each codeword using the assigned portions of the plurality of information bits, the codeword having the codeword length; and
    transmit the codeword to an LDPC decoder of another wireless communication device.

14. The non-transitory computer readable medium of claim 13, wherein the instructions further cause one or more processors are configured to:
    select a first codeword length responsive to the count being less than a first threshold;

select a second codeword length responsive to the count being greater than a second threshold; or select a third codeword length responsive to the count being between the first threshold and the second threshold.

15. The non-transitory computer readable medium of claim 14, wherein the first codeword length is 648 bits, the second codeword length is 1944 bits, and the third codeword length is 1296 bits.

16. The non-transitory computer readable medium of claim 15, wherein the first threshold is 21 bytes, and the second threshold is 44 bytes.

17. The non-transitory computer readable medium of claim 13, wherein the instructions further cause one or more processors are configured to:

generate, by the LDPC encoder, a first codeword having a first portion of the plurality of information bits; and generate, by the LDPC encoder, a second codeword having a second portion of the plurality of information bits.

18. The non-transitory computer readable medium of claim 13, wherein the instructions further cause one or more processors are configured to set, for the codeword, a number of parity bits according to the codeword length.

* * * * *